US007022459B2

(12) United States Patent
Kodama

(10) Patent No.: US 7,022,459 B2

(45) Date of Patent: Apr. 4, 2006

(54) PHOTOSENSITIVE COMPOSITION

(75) Inventor: Kunihiko Kodama, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 40 days.

(21) Appl. No.: 10/798,360

(22) Filed: Mar. 12, 2004

(65) Prior Publication Data

US 2004/0185373 A1 Sep. 23, 2004

(30) Foreign Application Priority Data

Mar. 14, 2003 (JP) ......................... P. 2003-070105

(51) Int. Cl.
*G03F 7/004* (2006.01)

(52) U.S. Cl. .................... 430/270.1; 430/326; 430/921

(58) Field of Classification Search ............. 430/270.1, 430/907, 921
See application file for complete search history.

(56) References Cited

U.S. PATENT DOCUMENTS

| | | | | |
|---|---|---|---|---|
| 6,383,713 | B1 * | 5/2002 | Uetani et al. | 430/270.1 |
| 2004/0224255 | A1 * | 11/2004 | Kanagasabapathy et al. | 430/270.1 |

FOREIGN PATENT DOCUMENTS

| | | | |
|---|---|---|---|
| EP | 0942329 | A1 * | 9/1999 |
| EP | 1113334 | A1 | 12/2000 |
| JP | 10-73919 | A | 3/1998 |
| JP | 10-133371 | A | 5/1998 |
| JP | 2000-292917 | A | 10/2000 |
| JP | 2001-187780 | A | 7/2001 |
| JP | 2001-294570 | A | 10/2001 |
| JP | 3281612 | B2 | 2/2002 |
| JP | 2002-116546 | A | 4/2002 |

OTHER PUBLICATIONS

Website www.uop.edu, summary of p. 12 of Hurlburt, R. 1994, Brooks/Cole, CA, description of rounding.*

* cited by examiner

*Primary Examiner*—Rosemary Ashton
(74) *Attorney, Agent, or Firm*—Sughrue Mion, PLLC

(57) ABSTRACT

A photosensitive composition comprising a compound that generates an acid upon irradiation of an actinic ray or radiation (Component A), a resin that is decomposed by the action of an acid to increase solubility in an alkali developing solution (Component B), a performance adjusting agent (Component C) and a solvent (Component D), wherein a, b, c and d, which represents contents of Component A, Component B, Component C and Component D in terms of part by weight respectively, satisfy formulae (1) and (2) shown below, provided that c may be 0

$$(a+b+c)/(a+b+c+d)=0.03 \text{ to } 0.10 \quad (1)$$

$$[(\text{Number of aromatic ring included in molecule of Component } A+1)\times a]/(a+b+c)=0.05 \text{ to } 0.80. \quad (2)$$

14 Claims, No Drawings

PHOTOSENSITIVE COMPOSITION

FIELD OF THE INVENTION

The present invention relates to a photosensitive composition for use in the production process of semiconductor devices, for example, IC, in the production of circuit substrates for liquid crystals or thermal heads, or in other photofabrication processes.

BACKGROUND OF THE INVENTION

A chemical amplification resist composition containing an acid generator that generates an acid upon irradiation of an actinic ray is known as a pattern formation material in which solubility in a developing solution is differentiated between the exposed area irradiated with of an actinic ray or heat and the unexposed area to form a pattern on a substrate.

Compositions containing a mixed acid generator composed of an oxoalkylsulfonium salt and a triarylsulfonium salt or a diphenyliodinium salt are described in Patent Document 1 (JP-A-2002-116546) (the term "JP-A" as used herein means an "unexamined published Japanese patent application"). Sulfonium salts having an oxoalkyl group are described in Patent Document 2 (JP-A-2001-187780) and Patent Document 3 (European Patent 1,113,334A). Sulfonium salts having a 2-oxocyclicalkyl group are described in Patent Document 4 (JP-A-10-133371) and Patent Document 5 (JP-A-10-73919).

Resist compositions containing a phenacylsulfonium salt having a cyclic structure are described in Patent Document 6 (JP-A-2001-294570). Resist compositions containing a mixture of an arylsulfonium salt and a phenacylsulfonium salt are described in Patent Document 7 (JP-A-2000-292917).

Chemical amplification resists containing as an acid generator, an onium salt having halogen atoms in both of a cation and an anion are described in Patent Document 8 (Japanese Patent No. 3,281,612).

Resins having an acid-decomposable group, which are used in photoresists for far ultraviolet ray, ordinarily have also an aliphatic cyclic hydrocarbon group in their molecules. The techniques described above are still insufficient in many respects and various improvements have been desired.

For instance, it has been found that in the case of using a wafer having a large diameter, fluctuation of temperature in the wafer at baking after exposure (PEB) by a hot plate or the like affects a pattern formed. Thus, it has been desired to improve such PEB dependency as well as to obtain good profile.

Patent Document 1: JP-A-2002-116546
Patent Document 2: JP-A-2001-187780
Patent Document 3: European Patent 1,113,334A
Patent Document 4: JP-A-10-133371
Patent Document 5: JP-A-10-73919
Patent Document 6: JP-A-2001-294570
Patent Document 7: JP-A-2000-292917
Patent Document 8: Japanese Patent No. 3,281,612

SUMMARY OF THE INVENTION

Therefore, an object of the invention is to provide a photosensitive composition that provides good profile and has small dependency on post-exposure baking (PEB).

Other objects of the invention will become apparent from the following description.

The object of the invention can be achieved by the compositions described below.

(1) A photosensitive composition comprising a compound that generates an acid upon irradiation of an actinic ray or radiation (Component A), a resin that is decomposed by the action of an acid to increase solubility in an alkali developing solution (Component B), a performance adjusting agent (Component C) and a solvent (Component D), wherein a, b, c and d, which represents contents of Component A, Component B, Component C and Component D in terms of part by weight respectively, satisfy formulae (1) and (2) shown below, provided that c may be 0.

$$(a+b+c)/(a+b+c+d)=0.03 \text{ to } 0.10 \quad (1)$$

$$[(\text{Number of aromatic ring included in molecule of Component } A+1)\times a]/(a+b+c)=0.05 \text{ to } 0.80 \quad (2)$$

(2) A photosensitive composition comprising a compound that generates an acid upon irradiation of an actinic ray or radiation (Component A), a resin that is decomposed by the action of an acid to increase solubility in an alkali developing solution (Component B), a performance adjusting agent (Component C) and a solvent (Component D), wherein a, b, c and d, which represents contents of Component A, Component B, Component C and Component D in terms of part by weight respectively, satisfy formulae (1) and (3) shown below, provided that c may be 0.

$$(a+b+c)/(a+b+c+d)=0.03 \text{ to } 0.10 \quad (1)$$

$$a/(a+b+c)=0.03 \text{ to } 0.20 \quad (3)$$

(3) A photosensitive composition comprising a compound that generates an acid upon irradiation of an actinic ray or radiation (Component A), a resin that is decomposed by the action of an acid to increase solubility in an alkali developing solution (Component B), a performance adjusting agent (Component C) and a solvent (Component D), wherein a, b, c and d, which represents contents of Component A, Component B, Component C and Component D in terms of part by weight respectively, satisfy formulae (1), (2) and (3) shown below, provided that c may be 0.

$$(a+b+c)/(a+b+c+d)=0.03 \text{ to } 0.10 \quad (1)$$

$$[(\text{Number of aromatic ring included in molecule of Component } A+1)\times a]/(a+b+c)=0.05 \text{ to } 0.80 \quad (2)$$

$$a/(a+b+c)=0.03 \text{ to } 0.20 \quad (3)$$

The invention further includes the following preferred embodiments:

(4) The photosensitive composition as described in any one of items (1) to (3) above, wherein Component B is a resin containing a monocyclic or polycyclic alicyclic hydrocarbon group.

(5) The photosensitive composition as described in any one of items (1) to (4) above, wherein Component B is a resin containing a lactone group.

(6) The photosensitive composition as described in any one of items (1) to (5) above, wherein Component B is a resin containing an adamantane structure having one or two hydroxy groups.

(7) The photosensitive composition as described in any one of items (1) to (3) above, wherein Component B is a resin containing a fluorine atom.

(8) The photosensitive composition as described in any one of items (1) to (3) above, wherein Component B is a resin containing a phenolic hydroxy group.

(9) The photosensitive composition as described in any one of items (1) to (5) above, wherein Component B is a resin containing a silicon atom.

(10) The photosensitive composition as described in any one of items (1) to (9) above, wherein Component C is a basic compound.

(11) The photosensitive composition as described in any one of items (1) to (10) above, wherein Component A is a sulfonium salt.

(12) The photosensitive composition as described in any one of items (1) to (11) above, wherein Component D is a solvent having an ester group.

(13) The photosensitive composition as described in any one of items (1) to (11) above, wherein Component D is a solvent having a hydroxy group and/or a carbonyl group.

(14) The photosensitive composition as described in any one of items (1) to (11) above, wherein Component D is a mixture of a solvent having an ester group and a solvent having a hydroxy group and/or a carbonyl group.

DETAILED DESCRIPTION OF THE INVENTION

[1] In the photosensitive composition of the invention, the relation between the content of the compound that generates an acid upon irradiation of an actinic ray or radiation (Component A): a parts by weight, the content of the resin that is decomposed by the action of an acid to increase solubility in an alkali developing solution (Component B): b parts by weight, the content of the performance adjusting agent (Component C): c parts by weight, and the content of the solvent (Component D): d parts by weight, satisfies formula (1) described below and at least any one of formulae (2) and (3).

$$(a+b+c)/(a+b+c+d)=0.03 \text{ to } 0.10 \quad (1)$$

$$[(\text{Number of aromatic ring included in molecule of Component } A+1)\times a]/(a+b+c)=0.05 \text{ to } 0.80 \quad (2)$$

$$a/(a+b+c)=0.03 \text{ to } 0.20 \quad (3)$$

In the above formulae, c may be 0. That is to say, the photosensitive composition of the invention may not contain the performance adjusting agent (Component C).

According to the invention, it has been found that the photosensitive composition, which satisfies the above-described formulae, can diminish the: PEB dependency, in addition to providing the excellent profile.

With respect to formula (1), the lower limit of the range is preferably 0.04, more preferably 0.05, and still more preferably 0.06.

The upper limit of the range of formula (1) is preferably 0.09, more preferably 0.08, and still more preferably 0.07.

The range of formula (1) is preferably from 0.04 to 0.09, more preferably from 0.05 to 0.08, and still more preferably from 0.05 to 0.07.

With respect to the number of aromatic ring included in molecule of Component A in formula (2), in case of a polycyclic ring in which a double bond is conjugated, the number of aromatic ring is 1. Specifically, the number of aromatic ring of a naphthalene ring is 1.

The number of aromatic ring is counted per molecule. For example, in case of an ionic compound comprising a cation and an anion, the number of aromatic ring is a total number of the aromatic rings included in the cation and anion.

When two or more of Components A are present, the value is the sum total of values obtained by calculation according to formula (2) regarding each of Components A.

With respect to formula (2), the lower limit of the range is preferably 0.07, more preferably 0.10, and still more preferably 0.15.

The upper limit of the range of formula (2) is preferably 0.60, more preferably 0.40, and still more preferably 0.30.

The range of formula (2) is preferably from 0.07 to 0.60, more preferably from 0.10 to 0.40, and still more preferably from 0.15 to 0.30.

With respect to formula (3), the lower limit of the range is preferably 0.04, more preferably 0.05, and still more preferably 0.06.

The upper limit of the range of formula (3) is preferably 0.15, more preferably 0.13, and still more preferably 0.12.

The range of formula (3) is preferably from 0.05 to 0.15, more preferably from 0.06 to 0.13, and still more preferably from 0.07 to 0.12.

In case of using the photosensitive composition of the invention, a thickness of film obtained by coating the photosensitive composition on a substrate and drying is preferably from 50 to 300 nm, more preferably from 80 to 250 nm, still more preferably from 100 to 220 nm, and most preferably from 140 to 200 nm.

A drying temperature at the coating and drying is preferably from 90 to 150° C., and more preferably from 100 to 130° C.

In a case wherein the amounts of respective components constituting the photosensitive composition satisfy the relationships described above, the photosensitive composition exhibits sufficiently favorable performances even in a range of thin film thickness.

Now, each of the components of the photosensitive composition will be described in detail below.

[2] Compound that is decomposed upon irradiation of an actinic ray or radiation to generate an acid (Component A)

The compound (photo-acid generator) that is decomposed upon irradiation of an actinic ray or radiation to generate an acid for use in the invention can be appropriately selected from photoinitiators for photo-cation polymerization, photoinitiators for photo-radical polymerization, photo-achromatizing agents for dyes, photo-discoloring agents, known compounds, which generate an acid upon irradiation of an actinic ray or radiation conventionally used in a microresist or the like, for example, a far ultraviolet ray having preferably not longer than 250 nm and more preferably not longer than 200 nm, specifically, a KrF excimer laser beam, an ArF excimer laser beam, an $F_2$ excimer laser beam, an X ray, an electron beam or the like, and mixtures of these compounds.

Specifically, diazonium salts, phosphonium salts, sulfonium salts, iodonium salts, imidosulfonates oximesulfonates, diazodisulfones, disulfones and o-nitrobenzylsulfonates are exemplified.

Also, polymers having the groups or compounds capable of generating an acid upon irradiation of an actinic ray or radiation introduced into the main or side chains thereof, for example, compounds described in U.S. Pat. No. 3,849,137, German Patent 3,914,407, JP-A-63-26653, JP-A-55-164824, JP-A-62-69263, JP-A-63-146038, JP-A-63-163452, JP-A-62-153853 and JP-A-63-146029 can be used.

Further, compounds capable of generating an acid upon exposure to light described in U.S. Pat. No. 3,779,778 and European Patent 126,712 can be employed.

As preferred compounds of the compounds that are decomposed upon irradiation of an actinic ray or radiation to generate an acid, compounds represented by formulae (ZI), (ZII) and (ZIII) shown below are exemplified.

ZI

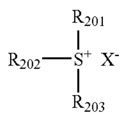

ZII

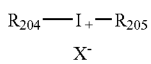

ZIII

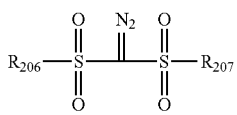

In formula (ZI), $R_{201}$, $R_{202}$ and $R_{203}$ each independently represent an organic group.

$X^-$ represents a non-nucleophilic anion.

The non-nucleophilic anion represented by $X^-$ includes, for example, a sulfonic acid anion, a carboxylic acid anion, a sulfonylimido anion, a bis(alkylsulfonyl)imido anion and a tris(alkylsulfonyl)methyl anion.

The non-nucleophilic anion means an anion having an extremely low ability for causing a nucleophilic reaction and an anion capable of controlling decomposition with the lapse of time by an intramolecular nucleophilic reaction. By means of the non-nucleophilic anion, preservation stability of the photosensitive composition is improved.

Examples of the sulfonic acid anion include an alkylsulfonic acid anion, an arylsulfonic acid anion and camphorsulfonic acid anion.

Examples of the carboxylic acid anion include an alkylcarboxylic acid anion, an arylcarboxylic acid anion and an aralkylcarboxylic acid anion.

The alkyl group in the alkylsulfonic acid anion is preferably an alkyl group having from 1 to 30 carbon atoms, for example, methyl, ethyl, propyl, isopropyl, n-butyl, isobutyl, sec-butyl, pentyl, neopentyl, hexyl, heptyl, octyl, nonyl, decyl, undecyl, dodecyl, tridecyl, tetradecyl, pentadecyl, hexadecyl, heptadecyl, octadecyl, nonadecyl, eicosyl, cyclopropyl, cyclopentyl, cyclohexyl, adamantly, norbornyl or bornyl group.

The aryl group in the arylsulfonic acid anion is preferably an aryl group having from 6 to 14 carbon atoms, for example, phenyl, tolyl or naphthyl group.

The alkyl group and aryl group in the alkylsulfonic acid anion and arylsulfonic acid anion may have a substituent.

Examples of the substituent include a halogen atom, an alkyl group, an alkoxy group and an alkylthio group.

The halogen atom includes, for example, chlorine, bromine, fluorine or iodine atoms.

The alkyl group (preferably an alkyl group having from 1 to 15 carbon atoms) includes, for example, methyl, ethyl, propyl, isopropyl, n-butyl, isobutyl, sec-butyl, pentyl, neopentyl, hexyl, heptyl, octyl, nonyl, decyl, undecyl, dodecyl, tridecyl, tetradecyl, pentadecyl, hexadecyl, heptadecyl, octadecyl, nonadecyl and eicosyl groups.

The alkoxy group (preferably an alkoxy group having from 1 to 5 carbon atoms) includes, for example, methoxy, ethoxy, propoxy and butoxy groups.

The alkylthio group (preferably an alkylthio group having from 1 to 15 carbon atoms) includes, for example, methylthio, ethylthio, propylthio, isopropylthio, n-butylthio, isobutylthio, sec-butylthio, pentylthio, neopentylthio, hexylthio, heptylthio, octylthio, nonylthio, decylthio, undecylthio, dodecylthio, tridecylthio, tetradecylthio, pentadecylthio, hexadecylthio, heptadecylthio, octadecylthio, nonadecylthio and eicosylthio groups.

The alkyl group, alkoxy group and alkylthio group may be further substituted with a halogen atom (preferably a fluorine atom).

The alkyl group in the alkylcarboxylic acid anion is same as that in the alkylsulfonic acid anion.

The aryl group in the arylcarboxylic acid anion is same as that in the arylsulfonic acid anion.

The aralkyl group in the aralkylcarboxylic acid anion is preferably an aralkyl group having from 7 to 12 carbon atoms, for example, benzyl, phenetyl, naphthylmethyl or naththylethyl group.

The alkyl group, aryl group and aralkyl group in the alkylcarboxylic acid anion, arylcarboxylic acid anion and aralkylcarboxylic acid anion may have a substituent. Examples of the substituent include those described for the arylsulfonic acid anion, for example, a halogen atom, an alkyl group, an alkoxy group or an alkylthio group.

Examples of the sulfonylimido anion include saccharin anion.

The alkyl group in the bis(alkylsulfonyl)imido anion or tris(alkylsulfonyl)methyl anion includes straight chain and branched alkyl groups, and preferably an alkyl group having from 1 to 5 carbon atoms, for example, methyl, ethyl, propyl, isopropyl, n-butyl, isobutyl, sec-butyl, pentyl or neopentyl group. The alkyl group may have a substituent and examples of the substituent include a halogen atom, an alkoxy group and an alkylthio group. Of the substituents, a fluorine atom is preferred.

Other examples of the non-nucleophilic anion include phosphorus fluoride, boron fluoride and antimony fluoride.

Of the non-nucleophilic anions for $X^-$, an alkanesulfonic acid anion wherein the $\alpha$-position of the sulfonic acid is substituted with a fluorine atom, an arylsulfonic acid anion substituted with a fluorine atom or a group having a fluorine atom, a bis(alkylsulfonyl)imido anion wherein the alkyl group is substituted with a fluorine atom and a tris(alkylsulfonyl)methyl anion wherein the alkyl group is substituted with a fluorine atom are preferred. As the non-nucleophilic anions for $X^-$, a perfluoroalkanesulfonic anion having from 1 to 8 carbon atoms is particularly preferred and, nonafluorobutanesulfonic acid and perfluorooctanesulfonic acid are most preferred.

A number of carbon atoms included in the organic group represented by each of $R_{201}$, $R_{202}$ and $R_{203}$ is ordinarily from 1 to 30, and preferably from 1 to 20.

Also, two of $R_{201}$, $R_{202}$ and $R_{203}$ may be combined with each other to from a ring structure, and the ring structure may include an oxygen atom, a sulfur atom, an ester bond, an amido bond or a carbonyl group.

A group formed by combining two of $R_{201}$, $R_{202}$ and $R_{203}$ include an alkylene group (for example, a butylene group or a pentylene group).

Specific examples of the organic group represented by each of $R_{201}$, $R_{202}$ and $R_{203}$ include the corresponding groups in Compounds (Z1-1), (Z1-2) and (Z1-3) described below.

Compounds having plural numbers of the structures represented by formula (ZI) may also be used. For example, a compound having a structure in which at least one of $R_{201}$, $R_{202}$ and $R_{203}$ in one compound represented by formula (ZI) is connected with at least one of $R_{201}$, $R_{202}$ and $R_{203}$ in another compound represented by formula (ZI).

As more preferable compounds of the compounds represented by formula (ZI), Compounds (Z1-1), (Z1-2) and (Z1-3) described below are exemplified.

Compound (Z1-1) is an arylsulfonium compound wherein at least one of $R_{201}$, $R_{202}$ and $R_{203}$ in formula (ZI) is an aryl group, that is, a compound including an arylsulfonium as a cation.

In the arylsulfonium compound, all of $R_{201}$, $R_{202}$ and $R_{203}$ may be aryl groups, or a part of $R_{201}$, $R_{202}$ and $R_{203}$ may be an aryl group and the remainder may be an alkyl group.

Examples of the arylsulfonium compound include triarylsulfonium compounds, diarylalkylsulfonium compounds and aryldialkylsulfonium compounds.

As the aryl group in the arylsulfonium compounds, a phenyl group or a naphthyl group is preferable and a phenyl group is more preferable. When the arylsulfonium compounds includes two or more aryl groups, the two or more aryl groups may be the same or different from each other.

The alkyl group, which is included in the arylsulfonium compound if desired, is preferably a straight-chain, branched or cyclic alkyl group having from 1 to 15 carbon atoms and includes a methyl group, an ethyl group, a propyl group, a n-butyl group, a sec-butyl group, a tert-butyl group, a cyclopropyl group, a cyclobutyl group and a cyclohexyl group.

The aryl group or alkyl group represented by each of $R_{201}$, $R_{202}$ and $R_{203}$ may have as a substituent, an alkyl group (for example, an alkyl group having from 1 to 15 carbon atoms), an aryl group (for example, an aryl group having from 6 to 14 carbon atoms), an alkoxy group (for example, an alkoxy group having from 1 to 15 carbon atoms), a halogen atom, a hydroxy group or a phenylthio group. Preferred examples of the substituent include a straight-chain, branched or cyclic alkyl group having from 1 to 12 carbon atoms and a straight-chain, branched or cyclic alkoxy group having from 1 to 12 carbon atoms. An alkyl group having from 1 to 4 carbon atoms and an alkoxy group having from 1 to 4 carbon atoms are most preferred. The substituent may be substituted on any one of $R_{201}$, $R_{202}$ and $R_{203}$ or the substituents may be substituted on all of $R_{201}$, $R_{202}$ and $R_{203}$. When $R_{201}$, $R_{202}$ or $R_{203}$ represents an aryl group, the substituent is preferably substituted on the p-position of the aryl group.

Now, Compound (Z1-2) is described below.

Compound (Z1-2) is a compound wherein $R_{201}$, $R_{202}$ and $R_{203}$ in formula (ZI) each independently represent an organic group including no aromatic ring. The term "aromatic ring" used herein includes an aromatic ring containing a hetero atom.

The organic group including no aromatic ring represented by each of $R_{201}$, $R_{202}$ and $R_{203}$ has ordinarily from 1 to 30 carbon atoms, and preferably from 1 to 20 carbon atoms.

$R_{201}$, $R_{202}$ and $R_{203}$ each preferably represent an alkyl group, a 2-oxoalkyl group, an alkoxycarbonylmethyl group, an allyl group or a vinyl group, more preferably a straight-chain, branched or cyclic 2-oxoalkyl group or an alkoxycarbonylmethyl group, and most preferably a straight-chain or branched 2-oxoalkyl group.

The alkyl group for each of $R_{201}$, $R_{202}$ and $R_{203}$ may be any one of straight-chain, branched and cyclic alkyl groups, and preferably includes a straight-chain or branched alkyl group having from 1 to 10 carbon atoms (for example, a methyl group, an ethyl group, a propyl group, a butyl group or a pentyl group) and a cyclic alkyl group having from 3 to 10 carbon atoms (for example, a cyclopentyl group, a cyclohexyl group or a norbornyl group).

The 2-oxoalkyl group for each of $R_{201}$, $R_{202}$ and $R_{203}$ may be any one of straight-chain, branched and cyclic 2-oxoalkyl groups, and preferably includes a 2-oxoalkyl group in which >C=O is present at the 2-position of each of the above-described alkyl groups.

The alkoxy group of the alkoxycarbonylmethyl group includes preferably an alkoxy group having from 1 to 5 carbon atoms (for example, a methoxy group, an ethoxy group, a propoxy group, a butoxy group or a pentoxy group).

The group represented by each of $R_{201}$, $R_{202}$ and $R_{203}$ may further be substituted with a halogen atom, an alkyl group (for example, an alkyl group having from 1 to 5 carbon atoms), a hydroxy group, a cyano group or a nitro group.

Two of $R_{201}$, $R_{202}$ and $R_{203}$ may be combined with each other to from a ring structure, and the ring structure may include an oxygen atom, a sulfur atom, an ester bond, an amido bond or a carbonyl group.

A group formed by combining two of $R_{201}$, $R_{202}$ and $R_{203}$ include an alkylene group (for example, a butylene group or a pentylene group).

Compound (Z1-3) is a compound represented by formula (Z1-3) shown below, and a compound containing a phenacylsulfonium salt structure.

(Z1–3)

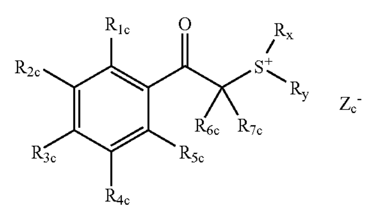

wherein $R_{1c}$ to $R_{5c}$ each independently represent a hydrogen atom, an alkyl group, an alkoxy group or a halogen atom.

$R_{6c}$ to $R_{7c}$ each independently represent a hydrogen atom or an alkyl group.

$R_x$ and $R_y$ each independently represent an alkyl group, a 2-oxoalkyl group, an alkoxycarbonylmethyl group, an allyl group or a vinyl group.

At least any two of $R_{1c}$ to $R_{5c}$, or $R_x$ and $R_y$ may be combined with each other to form a cyclic structure, and the cyclic structure may include an oxygen atom, a sulfur atom, an ester bond or an amido bond.

$Zc^-$ represents a non-nucleophilic anion, and includes the same as the non-nucleophilic anion of $X^-$ in formula (ZI).

The alkyl group for each of $R_{1c}$ to $R_{7c}$ may be any one of a straight-chain, branched or cyclic alkyl group, and includes, for example, an alkyl group having from 1 to 20 carbon atoms. Preferred examples thereof include a straight-chain or branched alkyl group having from 1 to 12 carbon atoms (for example, a methyl group, an ethyl group, a straight-chain or branched propyl group, a straight-chain or branched butyl group or a straight-chain or branched pentyl group) and a cyclic alkyl group having from 3 to 8 carbon atoms (for example, a cyclopentyl group or a cyclohexyl group).

The alkoxy group for each of $R_{1c}$ to $R_{5c}$ may be any one of a straight-chain, branched or cyclic alkoxy group, and includes, for example, an alkoxy group having from 1 to 10 carbon atoms. Preferred examples thereof include a straight-chain or branched alkoxy group having from 1 to 5 carbon atoms (for example, a methoxy group, an ethoxy group, a straight-chain or branched propoxy group, a straight-chain or branched butoxy group or a straight-chain or branched pentoxy group) and a cyclic alkoxy group having from 3 to 8 carbon atoms (for example, a cyclopentyloxy group or a cyclohexyloxy group).

Preferably, any one of $R_{1c}$ to $R_{5c}$ represents a straight-chain, branched or cyclic alkyl group or a straight-chain, branched or cyclic alkoxy group, and more preferably, the total number of carbon atoms included in $R_{1c}$ to $R_{5c}$ is from 2 to 15. This makes it possible to improve solubility in a solvent, whereby the generation of particles during the storage of photosensitive composition are restrained.

The alkyl group for each of $R_x$ and $R_y$ is same as the alkyl group for each of $R_{1c}$ to $R_{5c}$.

Examples of the 2-oxoalkyl group for each $R_x$ and $R_y$ include a 2-oxoalkyl group having >C═O at the 2-position of the alkyl group for each of $R_{1c}$ to $R_{5c}$.

The alkoxy group of the alkoxycarbonylmethyl group is the same as the alkoxy group for each of $R_{1c}$ to $R_{5c}$.

Examples of the group formed by combining $R_x$ and $R_y$ include a butylene group and a pentylene group.

$R_x$ and $R_y$ preferably represent an alkyl group having not less than 4 carbon atoms, more preferably an alkyl group having not less than 6 carbon atoms, and still more preferably an alkyl group having not less than 8 carbon atoms.

In formulae (ZII) or (ZIII), $R_{204}$ or $R_{207}$ each independently represent an aryl group, which may have a substituent, or an alkyl group, which may have a substituent.

The aryl group for each of $R_{204}$ or $R_{207}$ is preferably a phenyl group or a naphthyl group, and more preferably a phenyl group.

The alkyl group for each of $R_{204}$ or $R_{207}$ may be any one of straight-chain, branched and cyclic alkyl groups, and preferably includes a straight-chain or branched alkyl group having from 1 to 10 carbon atoms (for example, a methyl group, an ethyl group, a propyl group, a butyl group or a pentyl group) and a cyclic alkyl group having from 3 to 10 carbon atoms (for example, a cyclopentyl group, a cyclohexyl group or a norbornyl group).

The substituent, which may be present on the group for each of $R_{204}$ or $R_{207}$, includes an alkyl group (for example, an alkyl group having from 1 to 15 carbon atoms), an aryl group (for example, an aryl group having from 6 to 15 carbon atoms), an alkoxy group (for example, an alkoxy group having from 1 to 15 carbon atoms), a halogen atom, a hydroxy group or a phenylthio group.

$X^-$ represents a non-nucleophilic anion, and includes the same as the non-nucleophilic anion of $X^-$ in formula (ZI).

As preferred compounds of the compounds that are decomposed upon irradiation of an actinic ray or radiation to generate an acid, compounds represented by formulae (ZIV), (ZV) and (ZVI) are further exemplified.

ZIV $$Ar_3—SO_2—SO_2—Ar_4$$

ZV

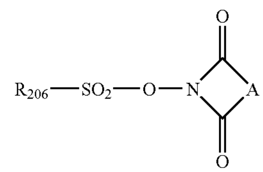

ZVI

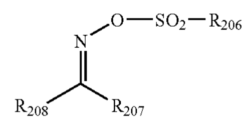

In formulae (ZIV), (ZV) and (ZVI), $Ar_3$ and $Ar_4$ each independently represent a substituted or unsubstituted aryl group.

$R_{206}$, $R_{207}$ and $R_{208}$ each represent a substituted or unsubstituted alkyl group or a substituted or unsubstituted aryl group.

A represents a substituted or unsubstituted alkylene group, a substituted or unsubstituted alkenylene group or a substituted or unsubstituted arylene group.

Of the compounds that are decomposed upon irradiation of an actinic ray or radiation to generate an acid, the compounds represented by formulae (ZI), (ZII) and (ZIII) are more preferred.

Among the compounds that are decomposed upon irradiation of an actinic ray or radiation to generate an acid, specific examples of those particularly preferred are set forth below, but the invention should not be construed as being limited thereto.

(z1)

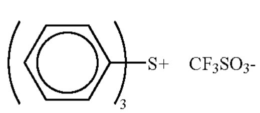

(z2)

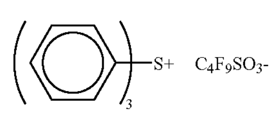

(z3)

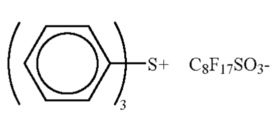

(z4)

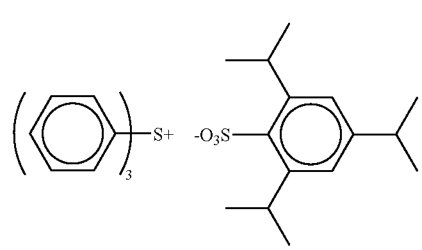

-continued
(z5)
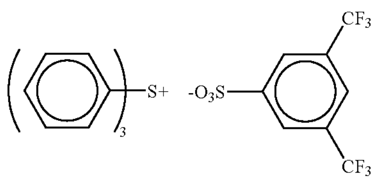
(z6)
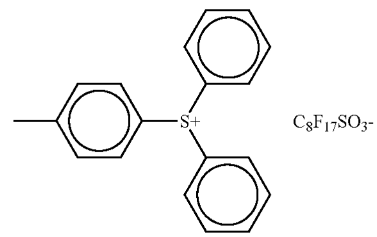
(z7)
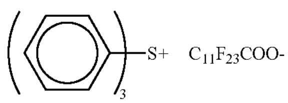
(z8)
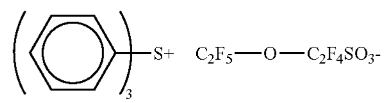
(z9)
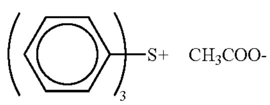
(z10)
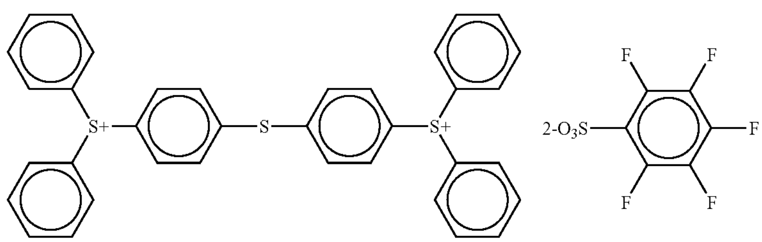
(z11)
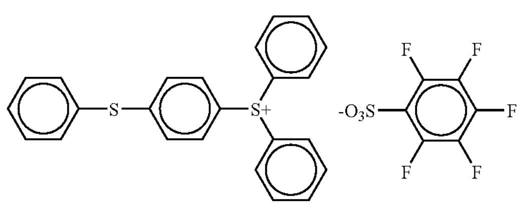
(z12)
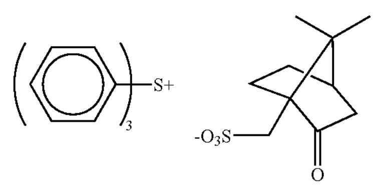
(z13)
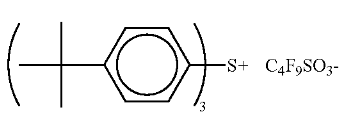
(z14)
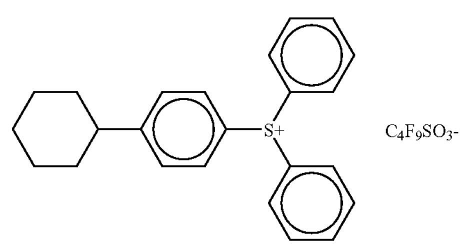
(z15)
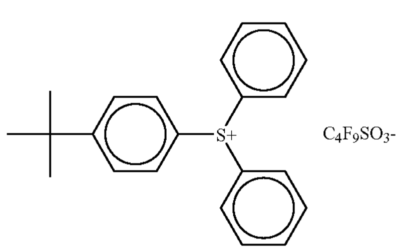
(z16)
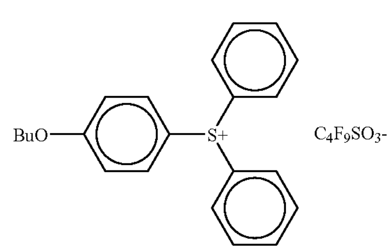

-continued
(z17)
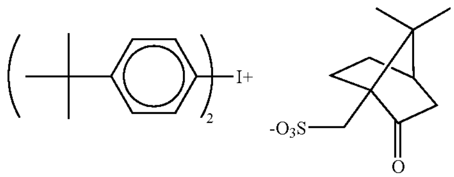
(z18)
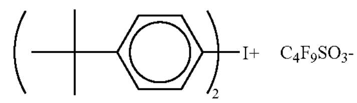
(z19)
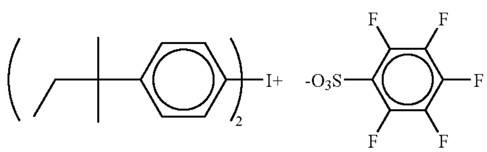
(z20)
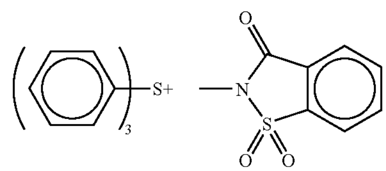
(z21)
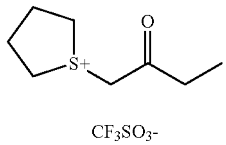
(z22)
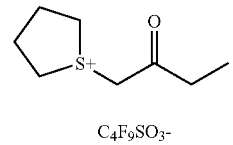
(z23)
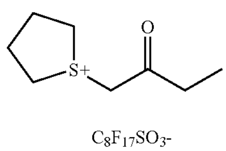
(z24)
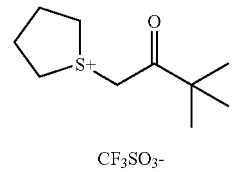
(z25)
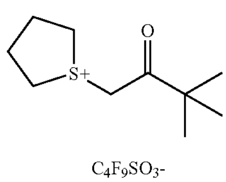
(z26)
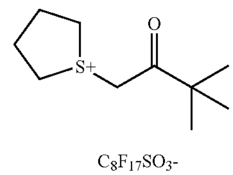
(z27)
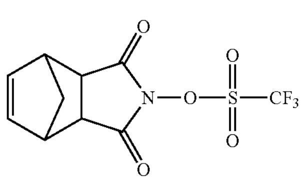
(z28)
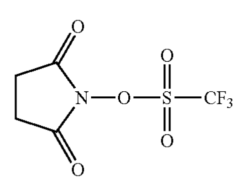
(z29)
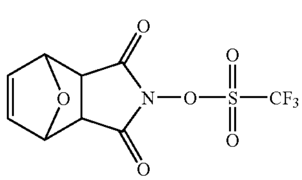
(z30)
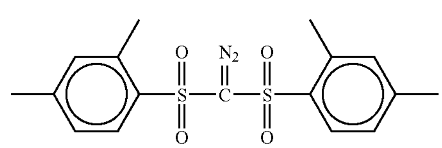
(z31)
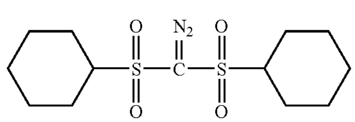
(z32)
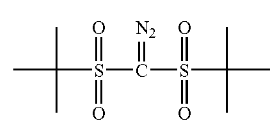

-continued
(z33)
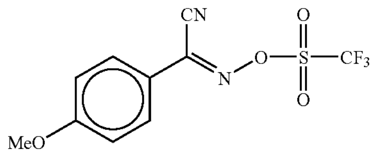
(z34)
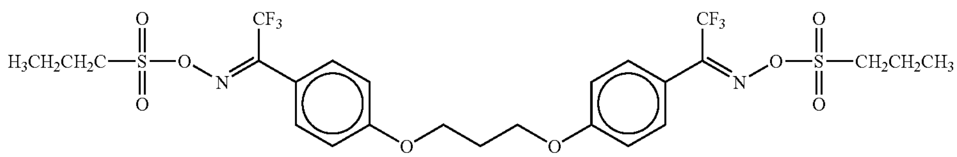
(z35)
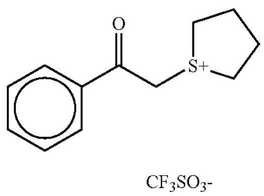
(z36)
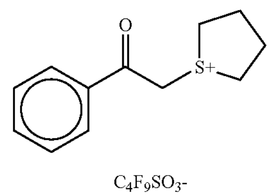
(z37)
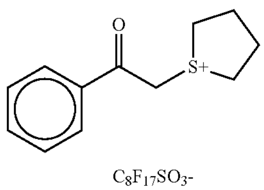
(z38)
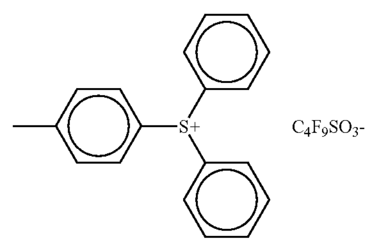
(z39)
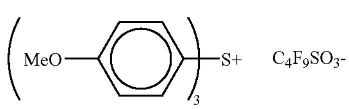
(z40)
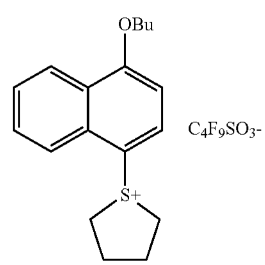
(z41)
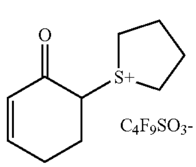
(z42)
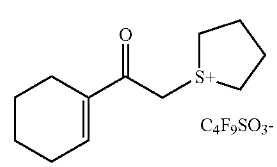
(z43)
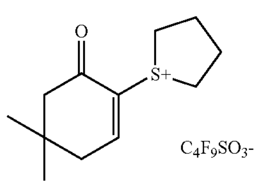
(z44)
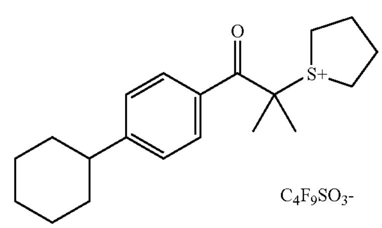

-continued (z45)

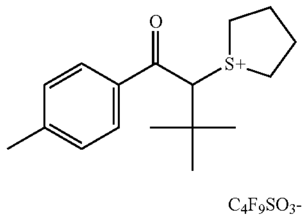

(z46)

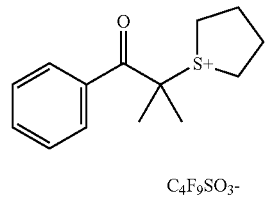

(z47)

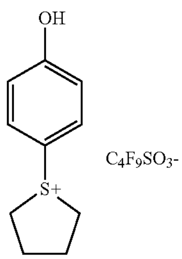

(z48)

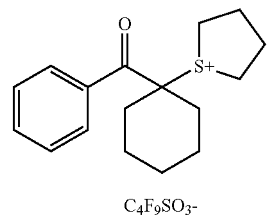

(z49)

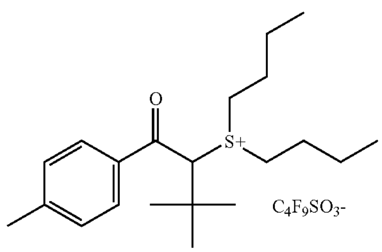

(z50)

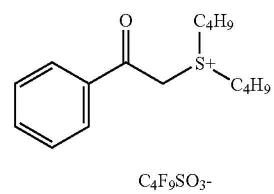

(z51)

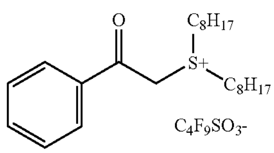

(z52)

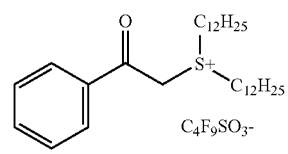

(z53)

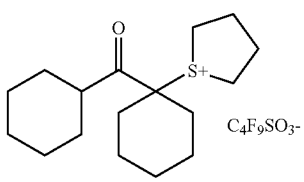

(z54)

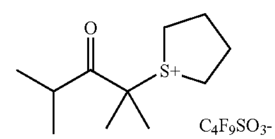

[3] Resin that is decomposed by the action of an acid to increase solubility in an alkali developing solution (Component B)

The resin that is decomposed by the action of an acid to increase solubility in an alkali developing solution is a resin containing a group (hereinafter also referred to as an "acid-decomposable group" sometimes), which is decomposed with an acid to generate an alkali-soluble group, in the main chain or side chain thereof, or both the main chain and side chain thereof. A resin having an acid-decomposable group in the side chain thereof is more preferred. The alkali-soluble group includes, for example, a —COOH group and an —OH group.

Preferred examples of the acid-decomposable group include groups wherein the hydrogen atom of the —COOH group or —OH group is substituted with a group capable of being released with an acid.

Preferred examples of the acid-decomposable group include a silyl ether group, a cumyl ester group, an acetal group, a tetrahydropyranyl ether group, an enol ether group, an enol ester group, a tertiary alkyl ether group, a tertiary alkyl ester group and a tertiary alkylcarbonate group. More preferred examples thereof include a tertiary alkyl ester group, a tertiary alkylcarbonate group, a cumyl ester group, an acetal group and a tetrahydropyranyl ether group.

In the case wherein the photosensitive composition of the invention is used for exposure by a KrF excimer laser beam, the resin of Component (B) is preferably a resin that is decomposed by the action of an acid to increase solubility in an alkali developing solution and has a phenolic hydroxy group.

A parent resin in the case wherein the acid-decomposable group is bonded as a side chain is an alkali-soluble resin having an —OH group or a —COOH group in the side chain. For instance, the alkali-soluble resin described below can be exemplified as such a parent resin.

An alkali-dissolution rate of the alkali-soluble resin is preferably not less than 170 A/sec (wherein A represents angstrom), particularly preferably not less than 330 A/sec, when measured in a 0.261 N tetramethylammonium hydroxide (TMAH) solution at 23° C.

Especially preferred examples of the alkali-soluble resin from such a standpoint include an alkali-soluble resin containing a hydroxystyrene structural unit, for example, poly (o-, m-, or p-hydroxystyrene) or copolymer thereof, hydrogenated poly(hydroxystyrene), halogen- or alkyl-substituted poly(hydroxystyrene), partially O-alkylated or O-acylated poly(hydroxystyrene), styrene/hydroxystyrene copolymer, α-methylstyrene/hydroxystyrene copolymer or hydrogenated novolak resin.

A preferred repeating unit having an acid-decomposable group for use in the invention includes, for example, tert-butoxycarbonyloxystyrene, a 1-alkoxyethoxystyrene and a tertiary alkyl ester of (meth)acrylic acid.

The resin of Component (B) for use in the invention can be obtained by reacting an alkali-soluble resin with a precursor of an acid-decomposable group or by copolymerizing a monomer for forming an alkali-soluble resin, which has an acid-decomposable group, with any of various monomers, as described, for example, in European Patent 254,853, JP-A-2-25850, JP-A-3-223860 and JP-A-4-251259.

Specific examples of the resin of Component (B) for use in the invention are set forth below, but the invention should not be construed as being limited thereto.

p-tert-Butoxystyrene/p-hydroxystyrene copolymer p-(tert-Butoxycarbonyloxy)styrene/p-hydroxystyrene copolymer p-(tert-Butoxycarbonylmethyloxy)styrene/p-hydroxystyrene copolymer 4-(tert-Butoxycarbonylmethyloxy)-3-methylstyrene/4-hydroxy-3-methylstyrene copolymer p-(tert-Butoxycarbonylmethyloxy)styrene/p-hydroxystyrene (10% hydrogenated) copolymer m-(tert-Butoxycarbonylmethyloxy)styrene/m-hydroxystyrene copolymer o-(tert-Butoxycarbonylmethyloxy)styrene/o-hydroxystyrene copolymer p-(Cumyloxycarbonylmethyloxy)styrene/p-hydroxystyrene copolymer Cumyl methacrylate/methyl methacrylate copolymer 4-tert-Butoxycarbonylstyrene/dimethyl maleate copolymer Benzyl methacrylate/tetrahydropyranyl methacrylate copolymer p-(tert-Butoxycarbonylmethyloxy)styrene/p-hydroxystyrene/styrene copolymer p-tert-Butoxystyrene/p-hydroxystyrene/fumaronitrile copolymer p-tert-Butoxystyrene/hydroxyethyl methacrylate copolymer Styrene/N-(4-hydroxyphenyl)maleimide/N-(4-tert-butoxycarbonyloxyphenyl)maleimide copolymer p-Hydroxystyrene/tert-butyl methacrylate copolymer Styrene/p-hydroxystyrene/tert-butyl methacrylate copolymer p-Hydroxystyrene/tert-butyl acrylate copolymer Styrene/p-hydroxystyrene/tert-butyl acrylate copolymer p-(tert-Butoxycarbonylmethyloxy)styrene/p-hydroxystyrene/N-methylmaleimide copolymer tert-Butyl methacrylate/1-adamantylmethyl methacrylate copolymer p-Hydroxystyrene/tert-butyl acrylate/p-acetoxystyrene copolymer p-Hydroxystyrene/tert-butyl acrylate/p-(tert-butoxycarbonyloxy)styrene copolymer p-Hydroxystyrene/tert-butyl acrylate/p-(tert-butoxycarbonylmethyloxy)styrene copolymer (R-1)

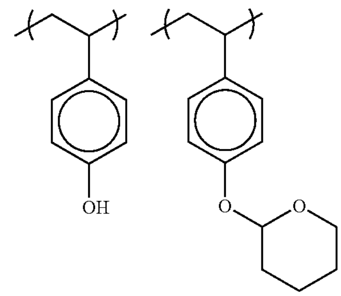

(R-2)

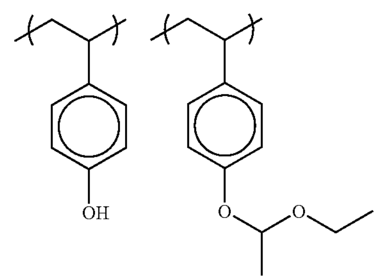

(R-3)

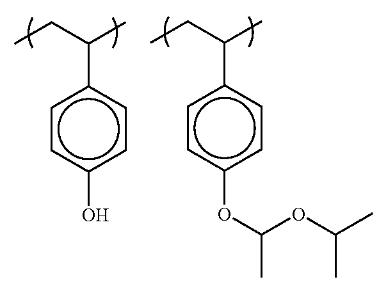

(R-4)

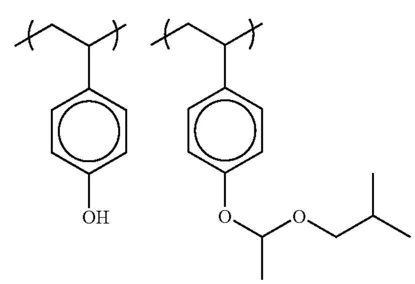

-continued
(R-5)
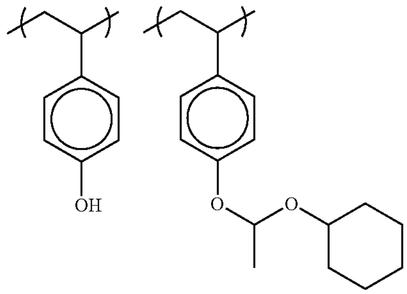
(R-6)
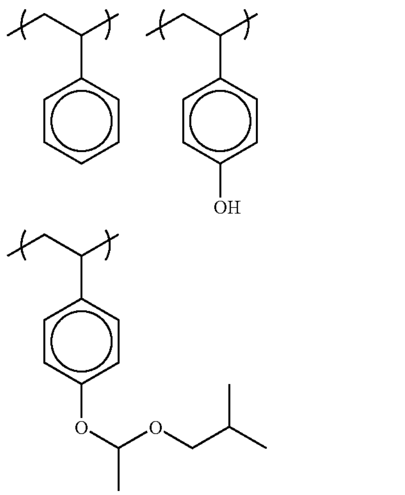
(R-7)
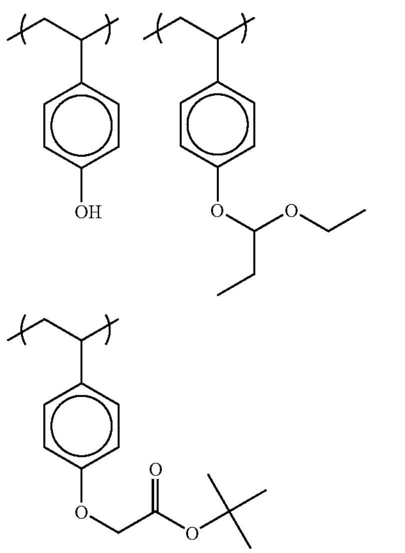
(R-8)
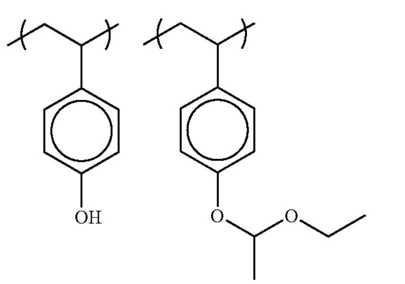
-continued
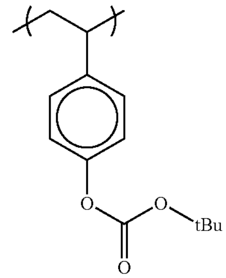
(R-9)
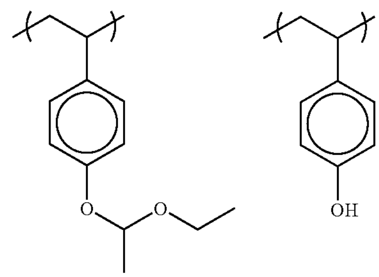
(R-10)
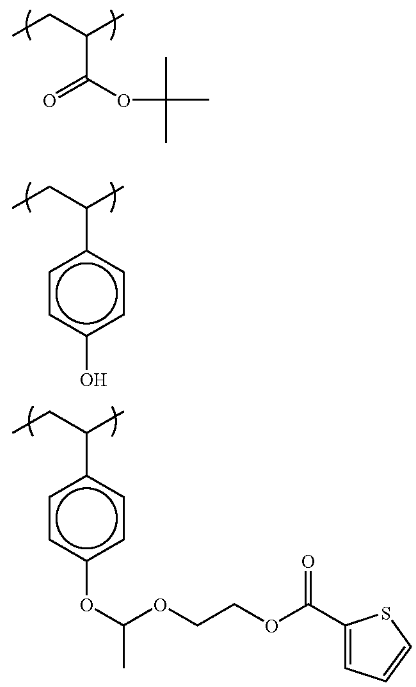
(R-11)
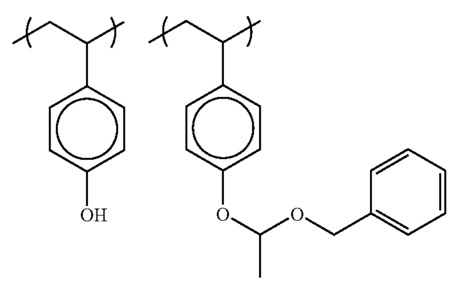

-continued
(R-12)
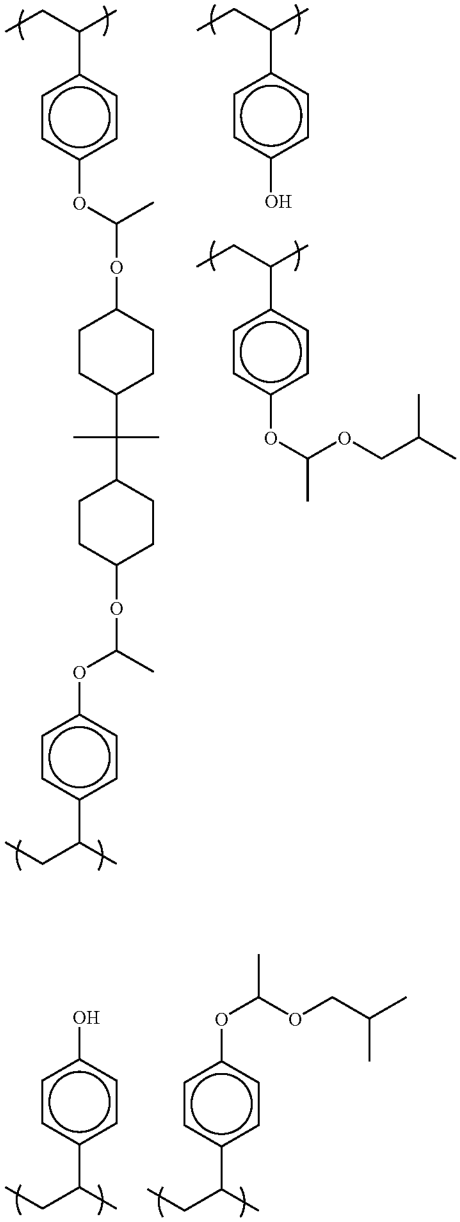
(R-13)
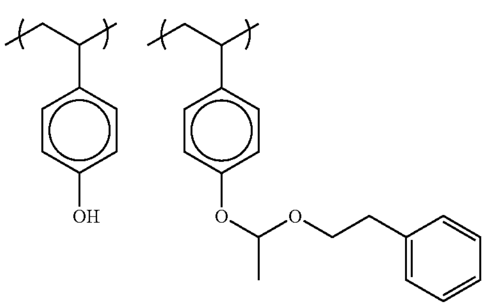
-continued
(R-14)
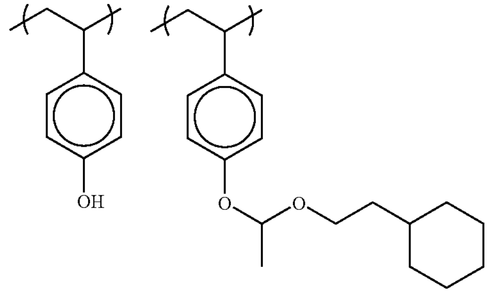
(R-15)
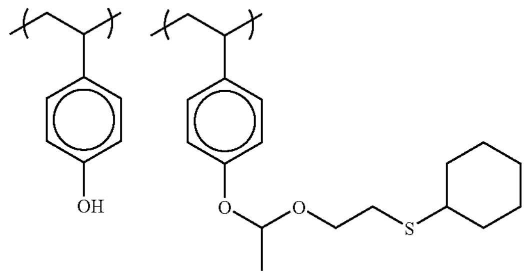
(R-16)
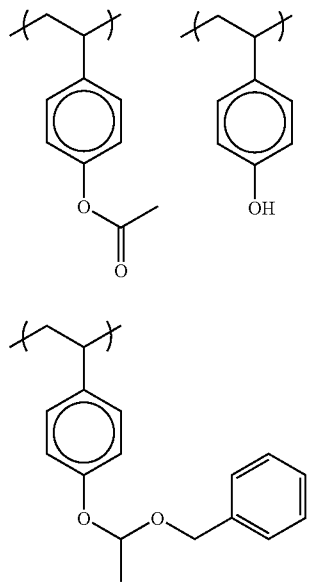
(R-17)
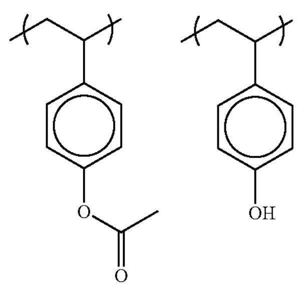

-continued
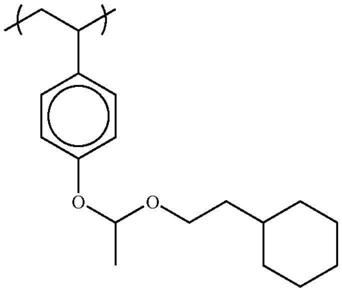
(R-18)
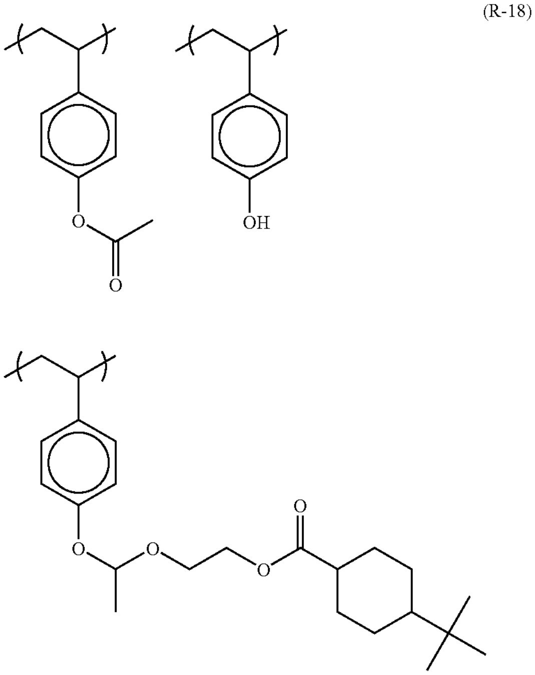
(R-19)
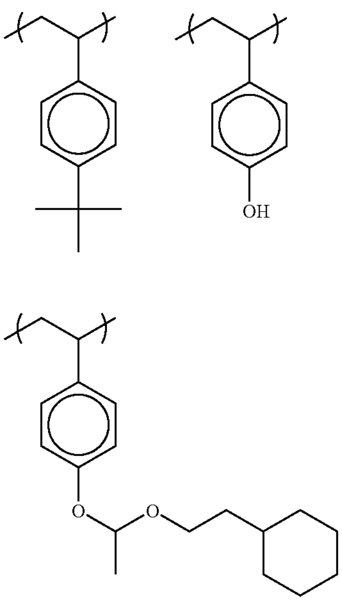
-continued
(R-20)
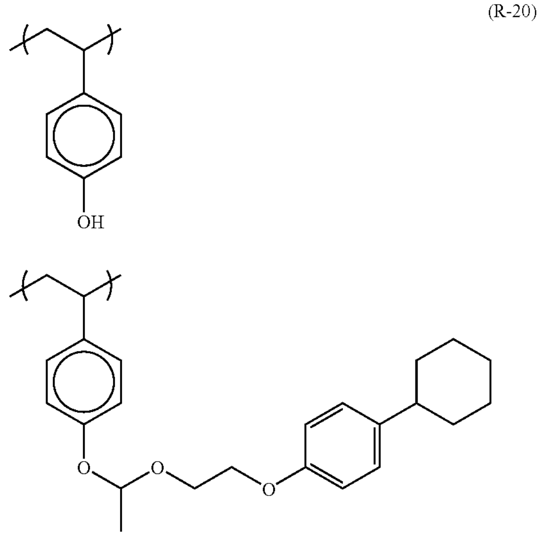
(R-21)
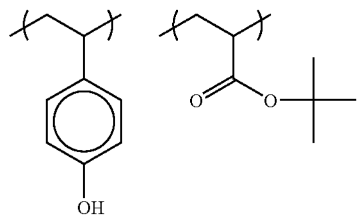
(R-22)
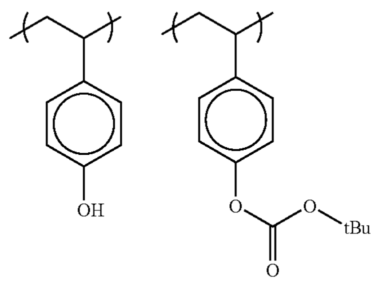
(R-23)
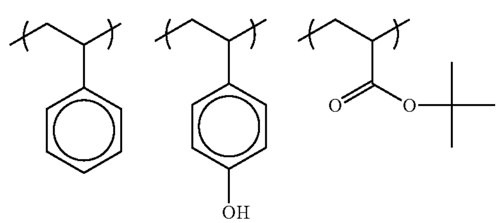
(R-24)
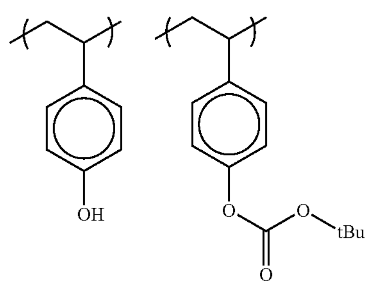

-continued

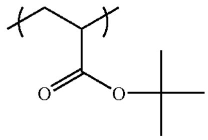

In the specific examples set forth above, "t-Bu" means a tert-butyl group.

A content ratio of the group capable of being decomposed with an acid is expressed by a formula of B/(B+S) wherein B represents a number of the group capable of being decomposed with an acid included in the resin and S represents a number of an alkali-soluble group not protected with a group capable of being released with an acid. The content ratio is preferably from 0.01 to 0.7, more preferably from 0.05 to 0.50, and still more preferably from 0.05 to 0.40.

In the case wherein the photosensitive composition of the invention is used for exposure by an ArF excimer laser beam, the resin of Component (B) is preferably a resin that is decomposed by the action of an acid to increase solubility in an alkali developing solution and has a monocyclic or polycyclic aliphatic hydrocarbon structure.

As the resin (hereinafter, also referred to as an "alicyclic hydrocarbon type acid-decomposable resin") that is decomposed by the action of an acid to increase solubility in an alkali developing solution and has a monocyclic or polycyclic aliphatic hydrocarbon structure, resins containing at least one repeating unit selected from a repeating unit having a partial structure including an alicyclic hydrocarbon represented by formula (pI), (pII), (pIII), (pIV), (pV) or (pVI) described below and a repeating unit represented by formula (II-AB) described below are preferred.

(pI)

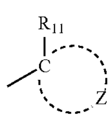

(pII)

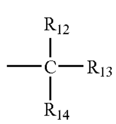

(pIII)

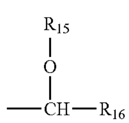

(pIV)

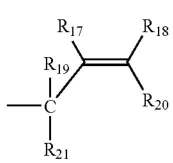

(pV)

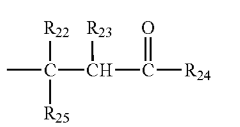

-continued (pVI)

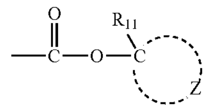

In the above formulae, $R_{11}$ represents a methyl group, an ethyl group, an n-propyl group, an isopropyl group, a n-butyl group, an isobutyl group or a sec-butyl group, and Z represents an atomic group necessary for forming an alicyclic hydrocarbon group together with the carbon atom.

$R_{12}$ to $R_{16}$ each independently represent a straight chain or branched alkyl group having from 1 to 4 carbon atoms or an alicyclic hydrocarbon group, provided that at least one of $R_{12}$ to $R_{14}$, and either $R_{15}$ or $R_{16}$ represents an alicyclic hydrocarbon group.

$R_{17}$ to $R_{21}$ each independently represent a hydrogen atom, a straight chain or branched alkyl group having from 1 to 4 carbon atoms or an alicyclic hydrocarbon group, provided that at least one of $R_{17}$ to $R_{21}$ represents an alicyclic hydrocarbon group, and either $R_{19}$ or $R_{21}$ represents a straight chain or branched alkyl group having from 1 to 4 carbon atoms or an alicyclic hydrocarbon group.

$R_{22}$ to $R_{25}$ each independently represent a straight chain or branched alkyl group having from 1 to 4 carbon atoms or an alicyclic hydrocarbon group, provided that at least one of $R_{22}$ to $R_{25}$ represents an alicyclic hydrocarbon group. Alternatively, $R_{23}$ and $R_{24}$ may be combined with each other to form a ring.

(II-AB)

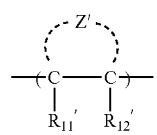

In formula (II-AB), $R_{11}'$ and $R_{12}'$ each independently represent a hydrogen atom, a cyano group, a halogen atom or an alkyl group, which may have a substituent.

Z' represents an atomic group necessary for forming an alicyclic structure, which may have a substituent, together with the connected two carbon atoms (C—C).

Of the repeating units represented by formula (II-AB), those represented by formulae (II-A) and (II-B) described below are more preferred.

(II-A)

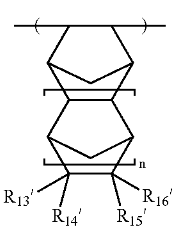

-continued (II-B)

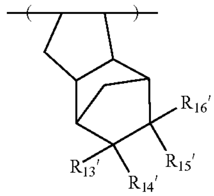

In formulae (II-A) and (II-B), $R_{13}'$ to $R_{16}'$ each independently represent a hydrogen atom, a halogen atom, a cyano group, —COOH, —$COOR_5$, a group capable of being decomposed by the action of an acid, —C(═O)—X-A'-$R_{17}'$, an alkyl group, which may have a substituent, or a cyclic hydrocarbon group, which may have a substituent.

$R_5$ represents an alkyl group, which may have a substituent, a cyclic hydrocarbon group, which may have a substituent or a group represented by Y described below.

X represents an oxygen atom, a sulfur atom, —NH—, —$NHSO_2$— or —$NHSO_2NH$—.

A' represents a single bond or a divalent linkage group.

Alternatively, at least two of $R_{13}'$ to $R_{16}'$ may be combined with each other to form a ring n represents 0 or 1.

$R_{17}'$ represents —COOH, —$COOR_5$, a cyano group, a hydroxy group, an alkoxy group, which may have a substituent, —CO—NH—$R_6$, —CO—NH—$SO_2$—$R_6$ or a group represented by Y described below.

$R_6$ represents an alkyl group, which may have a substituent, or a cyclic hydrocarbon group, which may have a substituent.

The group represented by Y has the following structure:

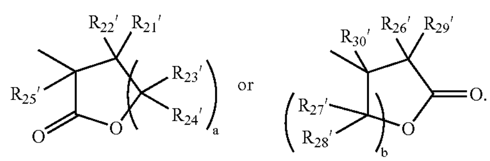

In the above formulae, $R_{21}'$ to $R_{30}'$ each independently represent a hydrogen atom or an alkyl group, which may have a substituent. a and b each represent 1 or 2.

In formulae (pI) to (pVI), the alkyl group for $R_{12}$ to $R_{25}$ includes a straight chain or branched alkyl group having from 1 to 4 carbon atoms, which may be substituted. Examples of the alkyl group include a methyl group, an ethyl group, a n-propyl group, an isopropyl group, a n-butyl group, an isobutyl group, a sec-butyl group and a tert-butyl group.

Examples of the substituent for the alkyl group include an alkoxy group having from 1 to 4 carbon atoms, a halogen atom (e.g., a fluorine atom, a chlorine atom, a bromine atom or an iodine atom), an acyl group, an acyloxy group, a cyano group, a hydroxy group, a carboxy group, an alkoxycarbonyl group and a nitro group.

The alicyclic hydrocarbon group for $R_{11}$ to $R_{25}$ or the alicyclic hydrocarbon group formed by Z and the carbon atoms may be a monocyclic group or a polycyclic group, and includes specifically a group having not less than 5 carbon atoms and including, for example, a monocyclo, bicyclo, tricyclo or tetracyclo structure. The number of carbon atoms included is preferably from 6 to 30, and particularly preferably from 7 to 25. The alicyclic hydrocarbon group may have a substituent.

Preferred examples of the alicyclic hydrocarbon group include an adamantyl group, a noradamantyl group, a decalin residue, a tricyclodecanyl group, a tetracyclododecanyl group, a norbornyl group, a cedrol group, a cyclohexyl group, a cycloheptyl group, a cyclooctyl group, a cyclodecanyl group and a cyclododecanyl group. Of these groups, an adamantyl group, a decalin residue, a norbornyl group, a cedrol group, a cyclohexyl group, a cycloheptyl group, a cyclooctyl group, a cyclodecanyl group and a cyclododecanyl group are more preferred.

Examples of the substituent for the alicyclic hydrocarbon group include an alkyl group, a substituted alkyl group, a halogen atom, a hydroxy group, an alkoxy group, a carboxy group and an alkoxycarbonyl group. The alkyl group is preferably a lower alkyl group, for example, a methyl group, an ethyl group, a propyl group, an isopropyl group or a butyl group, and more preferably a methyl group, an ethyl group, a propyl group or an isopropyl group. Examples of the substituent for the substituted alkyl group include a hydroxy group, a halogen atom and an alkoxy group. The alkoxy group includes an alkoxy group having from 1 to 4 carbon atoms, for example, a methoxy group, an ethoxy group, a propoxy group or a butoxy group.

The structure represented by any one of formulae (pI) to (pVI) in the resin can be used for protecting an alkali-soluble group. The alkali-soluble group includes various groups known in the field of art.

Specific examples of the alkali-soluble group include a carboxylic acid group, a sulfonic acid group, a phenol group and a thiol group, and a carboxylic acid group and a sulfonic acid group are preferably used.

The alkali-soluble group protected by the structure represented by any one of formulae (pI) to (pVI) in the resin preferably includes a structure wherein a hydrogen atom of a carboxy group is substituted with the structure represented by any one of formulae (pI) to (pVI).

As a repeating unit having the alkali-soluble group protected by the structure represented by any one of formulae (pI) to (pVI), a repeating unit represented by formula (pA) described below is preferred.

(pA)

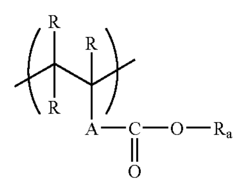

In the above formula, R's, which may be the same or different, each represent a hydrogen atom, a halogen atom or a straight chain or branched alkyl group having from 1 to 4 carbon atoms, which may be substituted.

A represents a single bond, an alkylene group, a substituted alkylene group, an ether group, a thioether group, a carbonyl group, an ester group, an amido group, a sulfonamido group, a urethane group, a urea group or a combination of two or more thereof.

$R_a$ represents any one of the groups represented by formulae (pI) to (pVI).

Of the repeating units represented by formula (pA), repeating units derived from 2-alkyl-2-adamantyl (meth) acrylate and dialkyl(1-adamantyl)methyl (meth)acrylate are most preferred.

Specific examples of the repeating unit represented by formula (pA) are set forth below, but the present invention should not be construed as being limited thereto.

In the formulae below, $R_x$ represents H, $CH_3$ or $CF_3$.

1

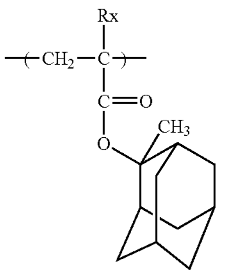

2

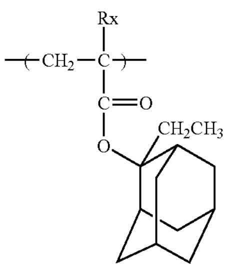

3

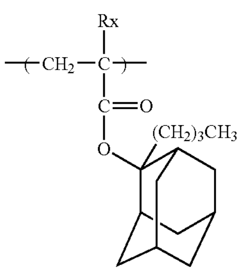

4

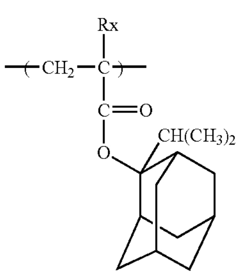

-continued

5

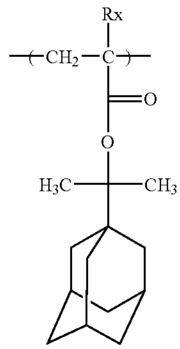

6

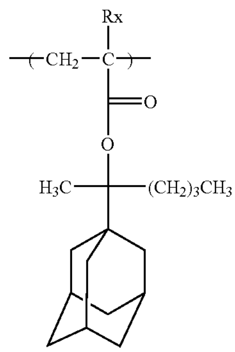

7

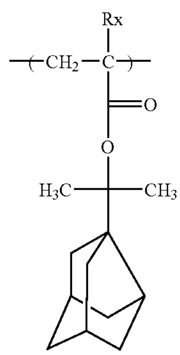

8

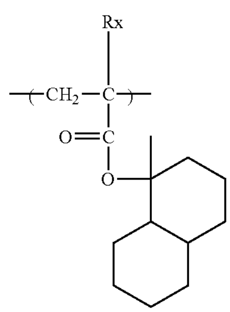

9

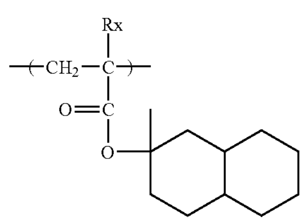

-continued
10
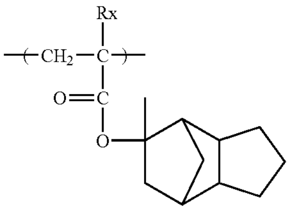
11
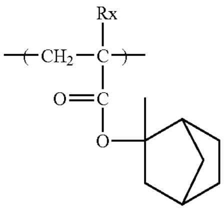
12
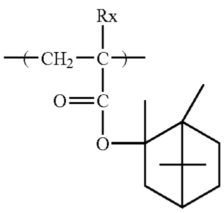
13
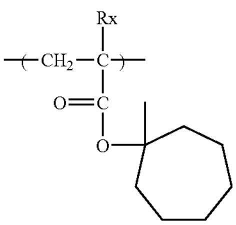
14
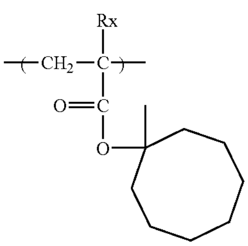
15
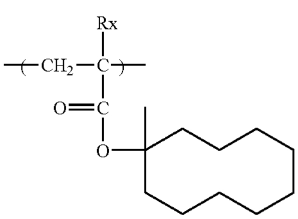
16
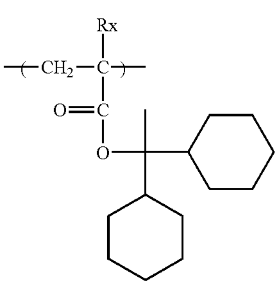
-continued
17
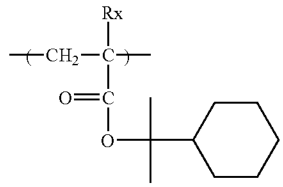
18
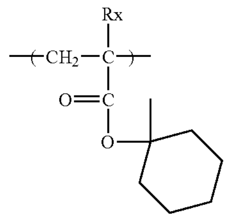
19
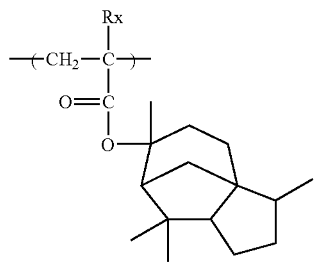
20
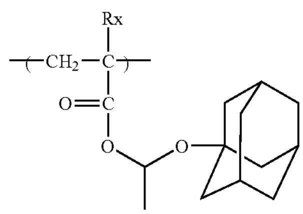
21
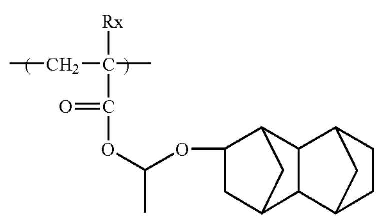
22
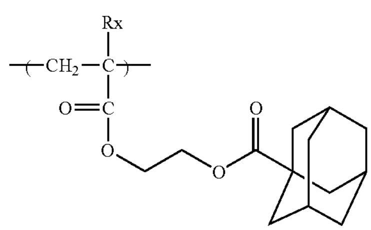
23
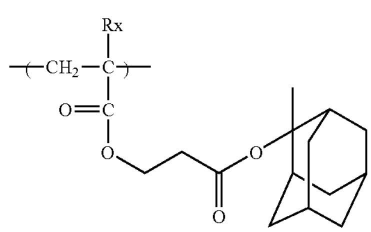

In formula (II-AB), $R_{11}'$ and $R_{12}'$ each independently represent a hydrogen atom, a cyano group, a halogen atom or an alkyl group, which may have a substituent.

Z' represents an atomic group necessary for forming an alicyclic structure, which may have a substituent, together with the connected two carbon atoms (C—C).

The halogen atom for $R_{11}'$ or $R_{12}'$ includes, for example, a chlorine atom, a bromine atom, a fluorine atom and an iodine atom.

The alkyl group for each of $R_{11}'$, $R_{12}'$ and $R_{21}'$ to $R_{30}'$ includes preferably a straight chain or branched alkyl group having from 1 to 10 carbon atoms, more preferably a straight chain or branched alkyl group having from 1 to 6 carbon atoms, and still more preferably a methyl group, an ethyl group, a propyl group, an isopropyl group, a n-butyl group, an isobutyl group, a sec-butyl group and a tert-butyl group.

Examples of the substituent for the alkyl group include a hydroxy group, a halogen atom, a carboxy group, an alkoxy group, an acyl group, a cyano group and an acyloxy group. The halogen atom includes, for example, a chlorine atom, a bromine atom, a fluorine atom and an iodine atom. The alkoxy group includes an alkoxy group having from 1 to 4 carbon atoms, for example, a methoxy group, an ethoxy group, a propoxy group or a butoxy group. The acyl group includes, for example, a formyl group or an acetyl group. The acyloxy group includes, for example, an acetoxy group.

The atomic group necessary for forming an alicyclic structure represented by Z' is an atomic group necessary for forming a repeating unit of alicyclic hydrocarbon moiety, which may have a substituent. In particular, an atomic group necessary for forming a bridged alicyclic structure, by which a repeating unit of the bridged alicyclic hydrocarbon is completed, is preferred.

The skeleton of the alicyclic hydrocarbon formed includes the same as described regarding the alicyclic hydrocarbon group for each of $R_{11}$ to $R_{25}$ in formulae (pI) to (pVI).

The skeleton of the above-described alicyclic hydrocarbon may have a substituent. Examples of the substituent include the atoms and groups represented by $R_{13}'$ to $R_{16}'$ in formula (II-A) or (II-B).

Of the repeating units containing the bridged alicyclic hydrocarbon, those represented by formulae (II-A) and (II-B) described above are more preferred.

In the alicyclic hydrocarbon type acid-decomposable resin according to the invention, an acid-decomposable group may be incorporated into the above described —C(=O)—X-A'-$R_{17}'$ or as a substituent for Z' in formula (II-AB).

The acid-decomposable group includes a group represented by the following formula:

$$—C(=O)—X_1—R_0$$

In the above formula, $R_0$ represents a tertiary alkyl group, for example, a tert-butyl group or a tert-amyl group, an isobornyl group, an 1-alkoxyethyl group, for example, a 1-ethoxyethyl group, a 1-butoxyethyl group, a 1-isobutoxyethyl group or a 1-cyclohexyloxyethyl group, an alkoxymethyl group, for example, a 1-metoxymethyl group or a 1-ethoxymethyl group, a 3-oxoalkyl group, a tetrahydropyranyl group, a tetrahydrofuryl group, a trialkylsilyl ester group, a 3-oxocyclohexyl ester group, a 2-methyl-2-adamantyl group or a mevalonic lactone residue. $X_1$ has the same meaning as X defined above.

The halogen atom for each of $R_{13}'$ or $R_{16}'$ includes, for example, a chlorine atom, a bromine atom, a fluorine atom and an iodine atom.

The alkyl group for each of $R_5$, $R_6$ and $R_{13}'$ to $R_{16}'$ includes preferably a straight chain or branched alkyl group having from 1 to 10 carbon atoms, more preferably a straight chain or branched alkyl group having from 1 to 6 carbon atoms, and still more preferably a methyl group, an ethyl group, a propyl group, an isopropyl group, a n-butyl group, an isobutyl group, a sec-butyl group and a tert-butyl group.

The cyclic hydrocarbon group for each of $R_5$, $R_6$ and $R_{13}'$ to $R_{16}'$ includes a cyclic alkyl group and a bridged hydrocarbon moiety, for example, a cyclopropyl group, a cyclopentyl group, a cyclohexyl group, an adamantyl group, a 2-methyl-2-adamantyl group, a norbornyl group, a bornyl group, an isobornyl group, a tricyclodecanyl group, a dicyclopentenyl group, a norbornaneepoxy group, a menthyl group, an isomenthyl group, a neomenthyl group or a tetracyclododecanyl group.

The ring formed by combining at least two of $R_{13}'$ to $R_{16}'$ includes a ring having from 5 to 12 carbon atoms, for example, cyclopentene, cyclohexene, cycloheptane or cyclooctane ring.

The alkoxy group for $R_{17}'$ includes an alkoxy group having from 1 to 4 carbon atoms, for example, a methoxy group, an ethoxy group, a propoxy group or a butoxy group.

Examples of the substituent for the alkyl group, cyclic hydrocarbon group or alkoxy group described above include a hydroxy group, a halogen atom, a carboxy group, an alkoxy group, an acyl group, a cyano group, an acyloxy group, an alkyl group and a cyclic hydrocarbon group. The halogen atom includes, for example, a chlorine atom, a bromine atom, a fluorine atom and an iodine atom. The alkoxy group includes an alkoxy group having from 1 to 4 carbon atoms, for example, a methoxy group, an ethoxy group, a propoxy group or a butoxy group. The acyl group includes, for example, a formyl group or an acetyl group. The acyloxy group includes, for example, an acetoxy group.

The alkyl group and cyclic hydrocarbon group include those described above.

The divalent linkage group for A' includes an alkylene group, a substituted alkylene group, an ether group, a thioether group, a carbonyl group, an ester group, an amido group, a sulfonamido group, a urethane group, a urea group and a combination of two or more thereof.

In the alicyclic hydrocarbon type acid-decomposable resin according to the invention,- the acid-decomposable group may be incorporated into at least one repeating unit selected from the repeating unit having a partial structure including an alicyclic hydrocarbon represented by formula (pI), (pII), (pIII), (pIV), (pV) or (pVI), the repeating unit represented by formula (II-AB), and a repeating unit of a copolymerization component described hereinafter.

Various atoms and groups represented by $R_{13}'$ to $R_{16}'$ in formula (II-A) or (II-B) may constitute substituents for the atomic group necessary for forming an alicyclic structure or bridged alicyclic structure represented by Z' in formula (II-AB).

Specific examples of the repeating unit represented by formula (II-A) or (II-B) are set forth below, but the invention should not be construed as being limited thereto.

[II-1]

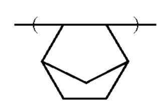

-continued
[II-2]
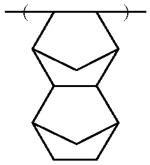
[II-3]
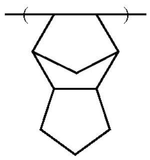
[II-4]
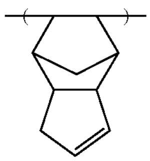
[II-5]
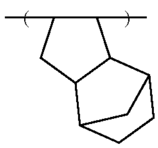
[II-6]
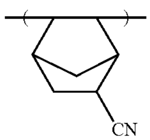
[II-7]
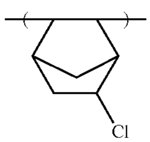
[II-8]
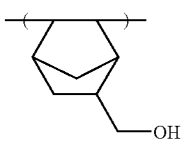
[II-9]
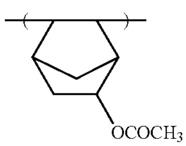
[II-10]
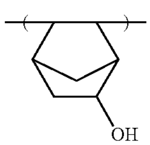
[II-11]
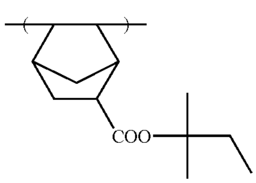
-continued
[II-12]
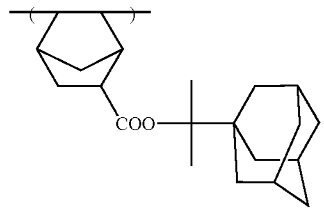
[II-13]
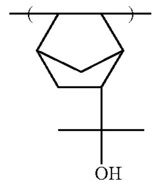
[II-14]
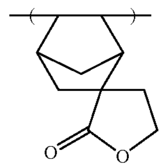
[II-15]
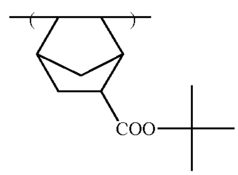
[II-16]
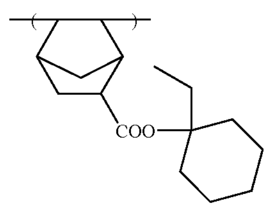
[II-17]
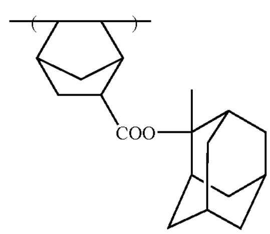
[II-18]
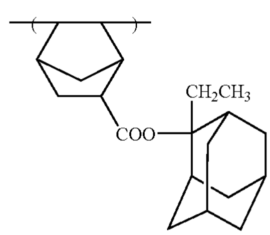
[II-19]
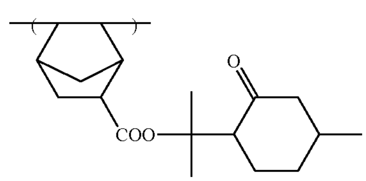

-continued
[II-20]
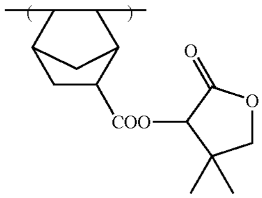
[II-21]
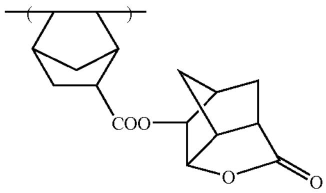
[II-22]
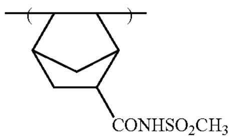
[II-23]
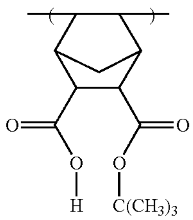
[II-24]
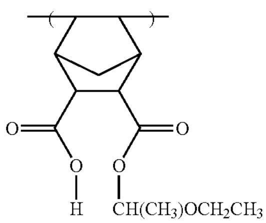
[II-25]
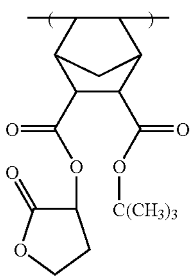
[II-26]
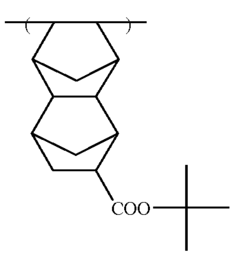
-continued
[II-27]
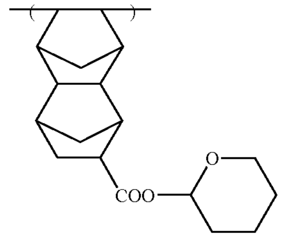
[II-28]
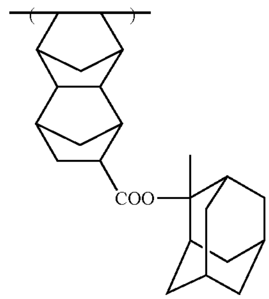
[II-29]
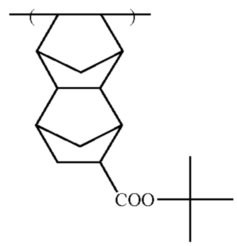
[II-30]
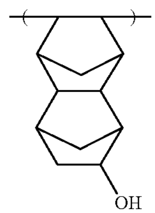
[II-31]
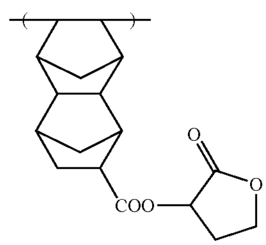
[II-32]
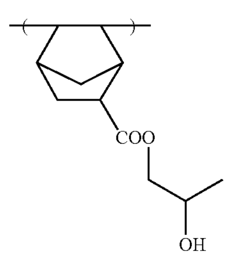
The alicyclic hydrocarbon type acid-decomposable resin preferably contains a lactone group, and more preferably contains a repeating unit including a group having a lactone structure represented by formula (Lc) or any one of formulae (V-1) to (v-5). The group having a lactone structure may be directly connected to the main chain of the resin.

(Lc)

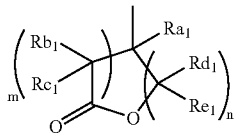

(V-1)

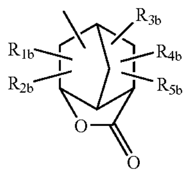

(V-2)

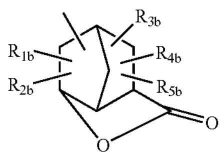

(V-3)

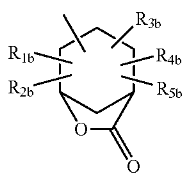

(V-4)

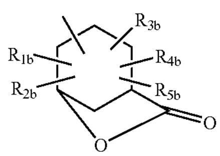

(V-5)

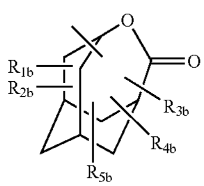

In formula (Lc), $R_{a1}$, $R_{b1}$, $R_{c1}$, $R_{d1}$ and $R_{e1}$ each independently represent a hydrogen atom or an alkyl group, which may have a substituent. m and n each independently represent an integer of from 0 to 3, provided that the sum total of m and n is from 2 to 6.

In formulae (V-1) to (V-5), $R_{1b}$, $R_{2b}$, $R_{3b}$, $R_{4b}$ and $R_{5b}$ each independently represent a hydrogen atom, an alkyl group, which may have a substituent, a cycloalkyl group, which may have a substituent, an alkoxy group, which may have a substituent, an alkoxycarbonyl group, which may have a substituent, an alkylsulfonylimino group, which may have a substituent or an alkenyl group, which may have a substituent, or two of $R_{1b}$, $R_{2b}$, $R_{3b}$, $R_{4b}$ and $R_{5b}$ may be combined with each other to form a ring.

The alkyl group represented by any one of $R_{a1}$, $R_{b1}$, $R_{c1}$, $R_{d1}$ and $R_{e1}$ in formula (Lc) or the alkyl group or the alkyl moiety in the alkoxy group, alkoxycarbonyl group or alkylsulfonylimino group represented by any one of $R_{1b}$, $R_{2b}$, $R_{3b}$, $R_{4b}$ and $R_{5b}$ in formulae (V-1) to (V-5) includes a straight chain or branched alkyl group, which may have a substituent.

Examples of the repeating unit including a group having the lactone structure represented by formula (Lc) or any one of formulae (V-1) to (V-5) include a repeating unit represented by formula (II-A) or (II-B) described above wherein at least one of $R_{13}'$ to $R_{16}'$ has the group represented by formula (Lc) or any one of formulae (V-1) to (V-5) (for example, $R_5$ of —$COOR_5$ is the group represented by formula (Lc) or any one of formulae (V-1) to (V-5)), and a repeating unit represented by formula (AI) described below.

(AI)

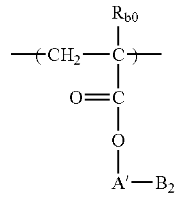

In formula (AI), $R_{b0}$ represents a hydrogen atom, a halogen atom, a substituted or unsubstituted alkyl group having from 1 to 4 carbon atoms. Preferred examples of the substituent for the alkyl group represented by $R_{b0}$ include the preferred examples of substituent for the alkyl group represented by $R_{1b}$ in any one of formulae (V-1) to (V-5) described above.

The halogen atom represented by $R_{b0}$ includes a fluorine atom, a chlorine atom, a bromine atom and an iodine atom. $R_{b0}$ is preferably a hydrogen atom.

A' in formula (AI) represents a single bond, an ether group, an ester group, a carbonyl group, an alkylene group or a divalent group formed by combining these groups.

$B_2$ in formula (AI) represents the group represented by formula (Lc) or any one of formulae (V-1) to (V-5).

Specific examples of the repeating unit including a group having the lactone structure are set forth below, but the invention should not be construed as being limited thereto.

In the formulae below, $R_x$ represents H, $CH_3$ or $CF_3$.

(IV-1)

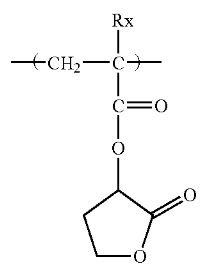

(IV-2)

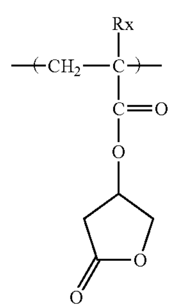

-continued
(IV-3)
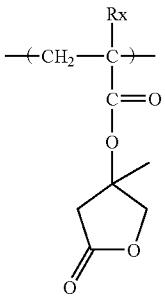
(IV-4)
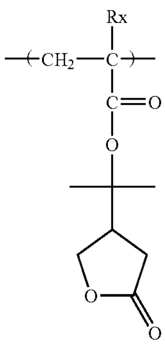
(IV-5)
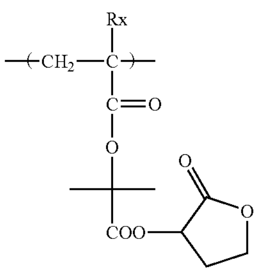
(IV-6)
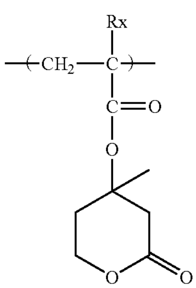
(IV-7)
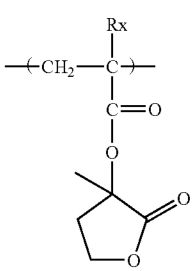
-continued
(IV-8)
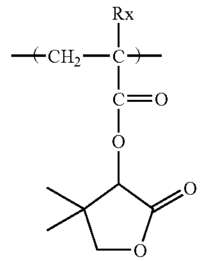
(IV-9)
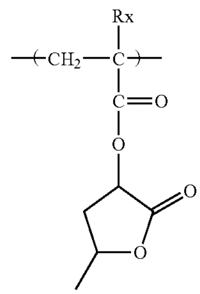
(IV-10)
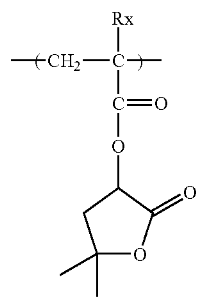
(IV-11)
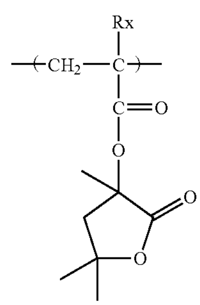
(IV-12)
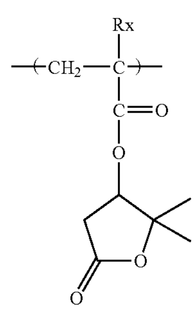

-continued
(IV-13)
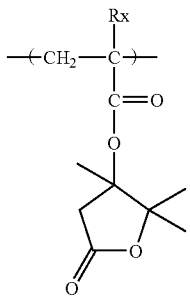
(IV-14)
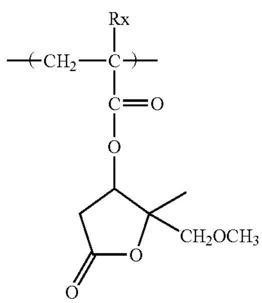
(IV-15)
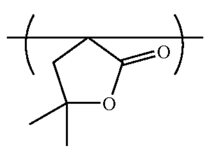
(IV-16)
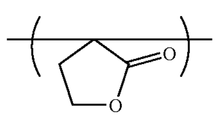
(Ib-1)
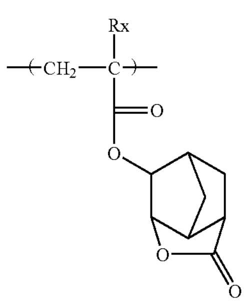
(Ib-2)
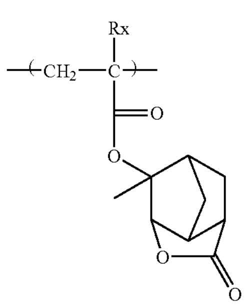
-continued
(Ib-3)
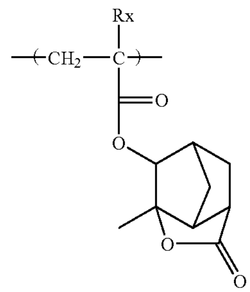
(Ib-4)
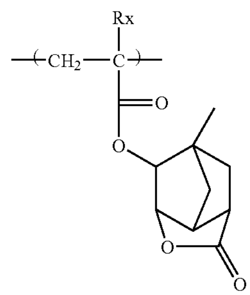
(Ib-5)
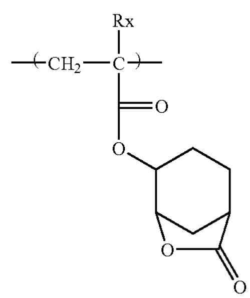
(Ib-6)
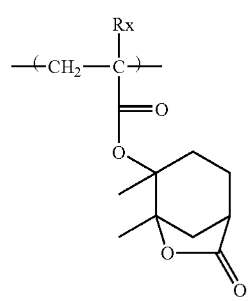
(Ib-7)
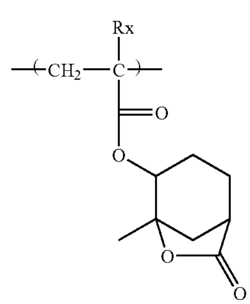

-continued
(Ib-8)
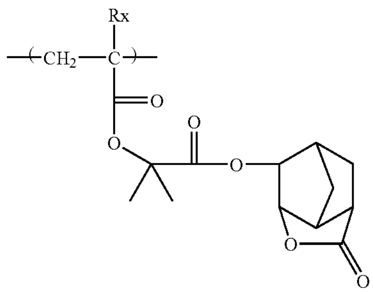
(Ib-9)
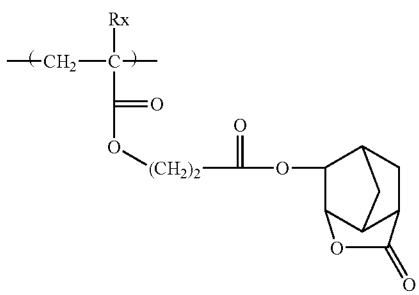
(Ib-10)
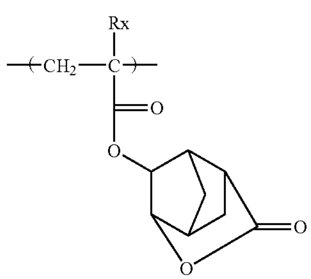
(Ib-11)
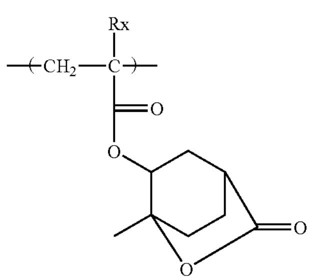
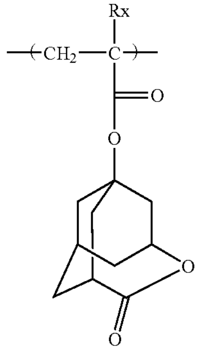
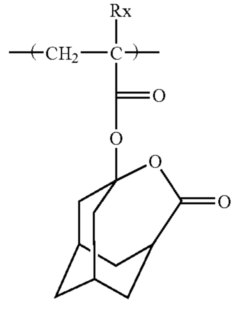
-continued
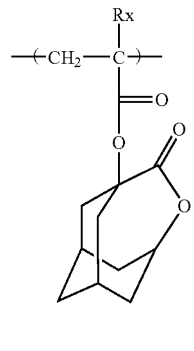
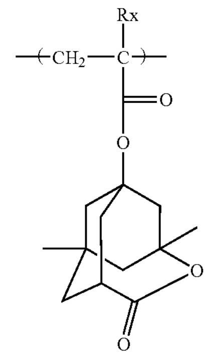
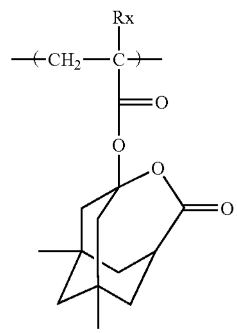
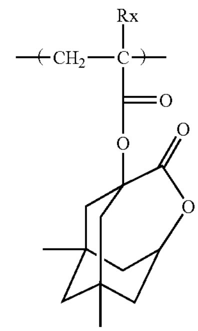
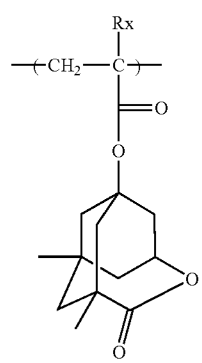
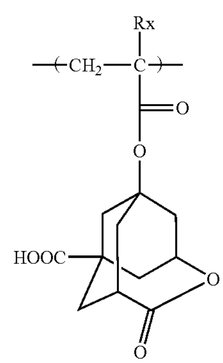
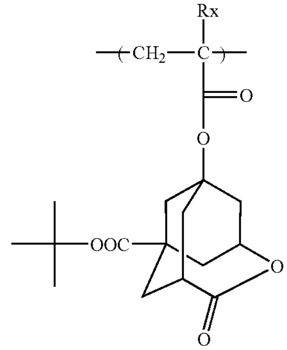
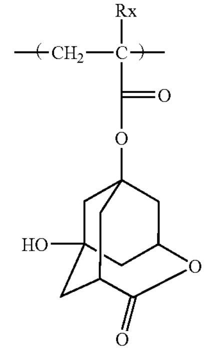

-continued

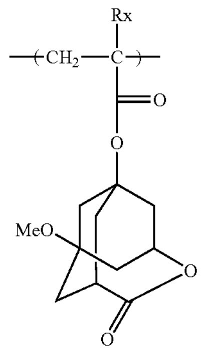

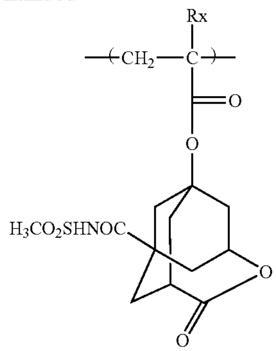

The alicyclic hydrocarbon type acid-decomposable resin according to the invention may contain a repeating unit having a group represented by the following formula (VII):

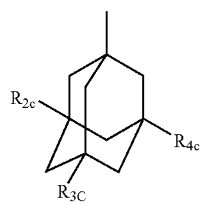

In formula (VII), $R_{2c}$, $R_{3c}$ and $R_{4c}$ each represent a hydrogen atom or a hydroxy group, provided that at least one of $R_{2c}$, $R_{3c}$ and $R_{4c}$ represents a hydroxy group.

The group represented by formula (VII) is preferably a dihydroxy body or a monohydroxy body, and more preferably a dihydroxy body.

Examples of the repeating unit having the group represented by formulae (VII) include a repeating unit represented by formula (II-A) or (II-B) described above wherein at least one of $R_{13}'$ to $R_{16}'$ has the group represented by formula (VII) (for example, $R_5$ of —$COOR_5$ is the group represented by formula (VII)), and a repeating unit represented by the following formula (AII):

(AII)

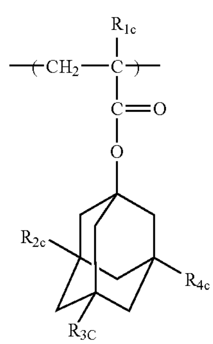

In formula (AII), $R_{1c}$ represents a hydrogen atom or a methyl group.

$R_{2c}$, $R_{3c}$ and $R_{4c}$ each independently represent a hydrogen atom or a hydroxy group, provided that at least one of $R_{2c}$, $R_{3c}$ and $R_{4c}$ represents a hydroxy group. The repeating unit represented by formula (AII) wherein two of $R_{2c}$, $R_{3c}$ and $R_{4c}$ represent hydroxy groups are preferred.

Specific examples of the repeating unit represented by formula (AII) are set forth below, but the invention should not be construed as being limited thereto.

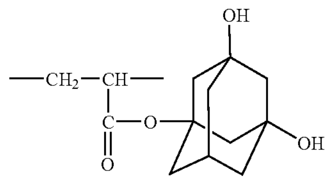

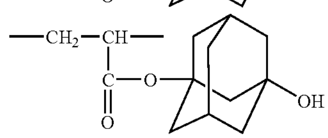

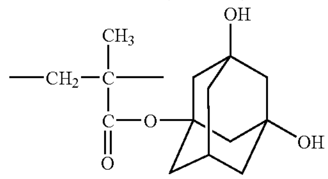

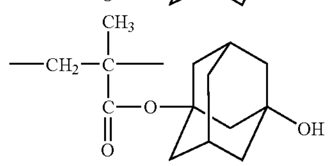

The alicyclic hydrocarbon type acid-decomposable resin according to the invention may contain a repeating unit represented by the following formulae (VIII):

(VIII)

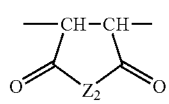

In above formula (VIII), $Z_2$ represents —O— or —$N(R_{41})$—. $R_{41}$ represents a hydrogen atom, a hydroxy group, an alkyl group, a haloalkyl group or —O—$SO_2$—$R_{42}$. $R_{42}$ represents an alkyl group, a haloakyl group, a cycloalkyl group or a camphor residue.

Specific examples of the repeating unit represented by formula (VIII) are set forth below, but the invention should not be construed as being limited thereto.

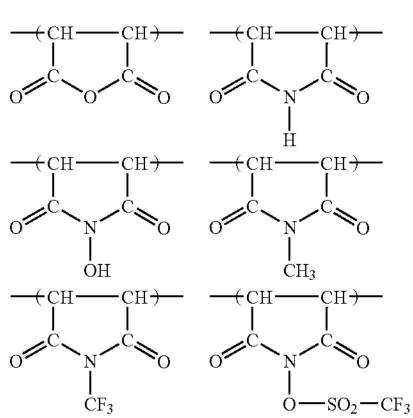

-continued

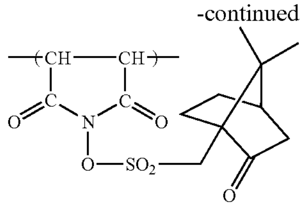

The alicyclic hydrocarbon type acid-decomposable resin may contain various repeating structural units in addition to the repeating structural units described above for the purposes of adjusting dry etching resistance, standard developing solution aptitude, adhesion to substrate, resist profile, and other characteristics ordinarily required for resist, for example, resolution, heat resistance and sensitivity.

Examples of such repeating structural units include repeating structural units corresponding to monomers described below, but the invention should not be construed as being limited thereto.

The introduction of additional repeating structural unit makes possible the minute control of characteristics required for the alicyclic hydrocarbon type acid-decomposable resin, particularly (1) solubility in a coating solvent, (2) film forming property (glass transition temperature), (3) developing property with alkali, (4) reduction in a film thickness (hydrophobicity, selection of alkali-soluble group), (5) adhesion of the unexposed area to a substrate, and (6) dry etching resistance.

Examples of such monomers include compounds having one addition-polymerizable unsaturated bond, for example, those selected from acrylates, methacrylates, acrylamides, methacrylamides, allyl compounds, vinyl ethers and vinyl esters.

In addition, any addition-polymerizable unsaturated compounds copolymerizable with monomers corresponding to the various repeating structural units described above may be employed.

A molar ratio of each repeating structural unit in the alicyclic hydrocarbon type acid-decomposable resin can be appropriately determined taking the adjustment of many factors including dry etching resistance, standard developing solution aptitude and adhesion to substrate of resist, resist profile, and other characteristics ordinarily required for resist, for example, resolution, heat resistance and sensitivity into consideration.

Preferred embodiments of the alicyclic hydrocarbon type acid-decomposable resin according to the invention include the following:

(1) resin (side chain type) containing a repeating unit having a partial structure including an alicyclic hydrocarbon represented by formula (pI), (pII), (pIII), (pIV), (pV) or (pVI).

(2) resin (main chain type) containing a repeating unit represented by formula (II-AB). The resin of (2) includes the following resin of (3).

(3) resin (hybrid type) containing a repeating unit represented by formula (II-AB), a maleic anhydride derivative and a (meth)acrylate structure.

A content of the repeating unit having an acid-decomposable group is preferably from 10 to 60% by mole, more preferably from 20 to 50% by mole, and still more preferably from 25 to 40% by mole based on the total repeating structural units in the alicyclic hydrocarbon type acid-decomposable resin.

A content of the repeating unit having a partial structure including an alicyclic hydrocarbon represented by formula (pI), (pII), (pIII), (pIV), (pV) or (pVI) is preferably from 30 to 70% by mole, more preferably from 35 to 65% by mole, and still more preferably from 40 to 60% by mole based on the total repeating structural units in the alicyclic hydrocarbon type acid-decomposable resin.

A content of the repeating unit represented by formula (II-AB) is preferably from 10 to 60% by mole, more preferably from 15 to 55% by mole, and still more preferably from 20 to 50% by mole based on the total repeating units in the alicyclic hydrocarbon type acid-decomposable resin.

A content of the repeating structural unit corresponding to the additional copolymerization component described above in the resin can be appropriately determined depending on the desired performance of resist. In general, the content is preferably 99% by mole or less, more preferably 90% by mole or less, and still more preferably 80% by mole or less to the sum total of the repeating structural unit having a partial structure including an alicyclic hydrocarbon represented by formula (pI), (pII), (pIII), (pIV), (pV) or (pVI) and the repeating unit represented by formula (II-AB).

In the case wherein the photosensitive composition of the invention is used for exposure by an ArF excimer laser beam, it is preferred that the alicyclic hydrocarbon type acid-decomposable resin does not contain an aromatic group in order to ensure transparency of the ArF laser beam.

The alicyclic hydrocarbon type acid-decomposable resin for use in the invention can be synthesized according to conventional methods, for example, radical polymerization. For instance, in an ordinary synthesis method, monomers are put into a reaction vessel at once or separately during the reaction, dissolved in a reaction solvent, for example, an ether, e.g., tetrahydrofuran, 1,4-dioxane or diisopropyl ether, a ketone, e.g., methyl ethyl ketone or methyl isobutyl ketone, an ester, e.g., ethyl acetate, or a solvent dissolving the photosensitive composition of the invention as described hereinafter, e.g., propylene glycol monomethyl ether acetate, if desired, to form a uniform solution, and under inert gas atmosphere, for example, nitrogen or argon, polymerization is initiated using a commercially available radical initiator (e.g., an azo initiator or a peroxide) while heating, if desired. The initiator is further added or separately added, if desired. After the completion of the reaction, the reaction-mixture is poured into a solvent to correct the resulting powder or solid, thereby obtaining the desired polymer. The concentration of reaction is ordinarily not less than 20% by weight, preferably not less than 30% by weight, and more preferably not less than 40% by weight. The reaction temperature is ordinarily from 10 to 150° C., preferably from 30 to 120° C., and more preferably from 50 to 100° C.

In the case wherein the photosensitive composition of the invention is used for exposure by an $F_2$ excimer laser beam, the resin of Component (B) is preferably a resin (hereinafter also referred to as a fluorine group-containing resin) that is decomposed by the action of an acid to increase solubility in an alkali developing solution and has a structure substituted with a fluorine atom in the main chain and/or side chain of polymer skeleton. The resin of Component (B) is more preferably a resin containing a hydroxy group-containing moiety, which is substituted with a fluorine atom or a fluoroalkyl group at the 1-position, or a moiety wherein a hydroxy group in the hydroxy group-containing moiety, which is substituted with a fluorine atom or a fluoroalkyl group at the 1-position, is protected by an acid-decomposable group, and most preferably a resin containing a hexafluoro-2-propanol structure or a structure wherein the hydroxy group of hexafluoro-2-propanol is protected by an acid-decomposable group. By introducing a fluorine atom into the resin, transparency to a far ultraviolet ray, particularly, an $F_2$ (157 nm) beam can be improved.

As such a fluorine group-containing resin, resins having at least one of repeating units represented by formulae (FA) to (FG) described below are preferably exemplified.

(FA)

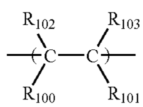

(FB)

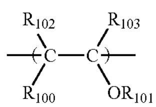

(FC)

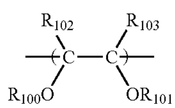

(FD)

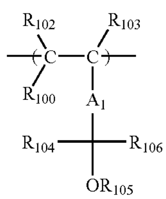

(FE)

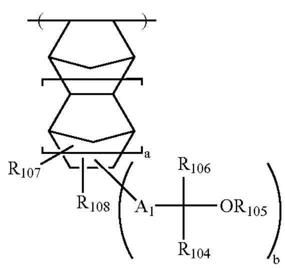

(FF)

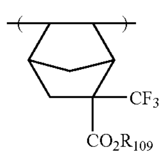

(FG)

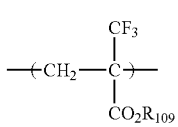

In the above formulae, $R_{100}$ to $R_{103}$ each represent a hydrogen atom, a fluorine atom, an alkyl group, a fluoroalkyl group or an aryl group.

$R_{104}$ and $R_{106}$ each represent a hydrogen atom, a fluorine atom or a fluoroalkyl group, provided that at least one of $R_{104}$ and $R_{106}$ is a fluorine atom or a fluoroalkyl group. Preferably, both $R_{104}$ and $R_{106}$ are trifluoromethyl groups, respectively.

$R_{105}$ represents a hydrogen atom, an alkyl group, a fluoroalkyl group, an acyl group, an alkoxycarbonyl group or a group capable of being decomposed upon the action of an acid.

$A_1$ represents a single bond, a divalent connecting group, for example, a straight-chain, branched or cyclic alkylene group, an alkenylene group, an arylene group, —OCO—, —COO— or —CON($R_{24}$)—, or a connecting group formed from two of more of the divalent groups. $R_{24}$ represents a hydrogen atom or an alkyl group.

$R_{107}$ and $R_{108}$ each represent a hydrogen atom, a halogen atom, an alkyl group, a fluoroalkyl group, an alkoxy group, an alkoxycarbonyl group or a group capable of being decomposed upon the action of an acid.

$R_{109}$ represents a hydrogen atom, an alkyl group, a fluoroalkyl group or a group capable of being decomposed upon the action of an acid.

b represents 0, 1 or 2.

The repeating unit represented by any one of formulae (FA) to (FG) includes at least one fluorine atom, preferably three or more fluorine atoms, per repeating unit.

In formulae (FA) to (FG), the alkyl group preferably includes an alkyl group having from 1 to 8 carbon atoms, specifically, for example, a methyl group, an ethyl group, a propyl group, a n-butyl group, a sec-butyl group, a hexyl group, a 2-ethylhexyl group or an octyl group.

The cycloalkyl group may be a monocyclic type or a polycyclic type. The monocyclic type preferably includes that having from 3 to 8 carbon atoms, for example, a cyclopropyl group, a cyclopentyl group, a cyclohexyl group, a cycloheptyl group or a cyclooctyl group. The polycyclic type preferably includes that having from 6 to 20 carbon atoms, for example, an adamantyl group, a norbornyl group, an isobornyl group, a camphanyl group, a dicyclopentyl group, an α-pinenyl group, a tricyclodecanyl group, a tetracyclododecyl group or an androstanyl group. The carbon atom in the monocyclic or polycyclic cycloalkyl group may be replaced by a hetero atom, for example, an oxygen atom.

The fluoroalkyl group preferably includes a perfluoroalkyl group having from 4 to 12 carbon atoms, specifically, for example, a perfluorobutyl group, a perfluorohexyl group, a perfluorooctyl group, a perfluorooctylethyl group or a perfluorododecyl group.

The haloalkyl group preferably includes a haloalkyl group having from 1 to 4 carbon atoms, which is substituted with a halogen atom other than a fluorine atom, specifically, for example, a chloromethyl group, a chloroethyl group, a chloropropyl group, a chlorobutyl group, a bromomethyl group or a bromoethyl group.

The aryl group preferably includes an aryl group having from 6 to 15 carbon atoms, specifically, for example, a phenyl group, a tolyl group, a dimethylphenyl group, a 2,4,6-trimethylphenyl group, a naphthyl group, an anthryl group or a 9,10-dimethoxyanthryl group.

The aralkyl group preferably includes an aralkyl group having from 7 to 12 carbon atoms, specifically, for example, a benzyl group, a phenethyl group or a naphthylmethyl group.

The alkenyl group preferably includes an alkenyl group having from 2 to 8 carbon atoms, specifically, for example, a vinyl group, an allyl group, a butenyl group or a cyclohexenyl group.

The alkoxy group preferably includes an alkoxy group having from 1 to 8 carbon atoms, specifically, for example, a methoxy group, an ethoxy group, a n-propoxy group, an isopropoxy group, a butoxy group, a pentoxy group, an allyloxy group or an octoxy group.

The acyl group preferably includes an acyl group having from 1 to 10 carbon atoms, specifically, for example, a formyl group, an acetyl group, a propanoyl group, a butanoyl group, a pivaloyl group, an octanoyl group or a benzoyl group.

The acyloxy group preferably includes an acyloxy group having from 2 to 12 carbon atoms, specifically, for example, an acetoxy group, a propionyloxy group or a benzoyloxy group.

The alkynyl group preferably includes an alkynyl group having from 2 to 5 carbon atoms, specifically, for example, an ethynyl group, a propynyl group or a butynyl group.

The alkoxycarbonyl group includes, for example, an isopropoxycarbonyl group, a tert-butoxycarbonyl group, a tert-amyloxycarbonyl group and a 1-methyl-1-cyclohecyloxycarbonyl group. The alkoxycarbonyl group is preferably a secondary alkoxycarbonyl group and more preferably a tertiary alkoxycarbonyl group.

The halogen atom includes, for example, a fluorine atom, a chlorine atom, a bromine atom and an iodine atom.

The alkylene group preferably includes an alkylene group having from 1 to 8 carbon atoms, which may have a substituent, specifically, for example, a methylene group, an ethylene group, a propylene group, a butylene group, a hexylene group or an octylene group.

The alkenylene group preferably includes an alkenylene group having from 2 to 6 carbon atoms, which may have a substituent, specifically, for example, an ethenylene group, a propenylene group or a butenylene group.

The cycloalkylene group preferably includes a cycloalkylene group having from 5 to 8 carbon atoms, which may have a substituent, specifically, for example, a cyclopentylene group or a cyclohexylene group.

The arylene group preferably includes an arylene group having from 6 to 15 carbon atoms, which may have a substituent, specifically, for example, a phenylene group, a tolylene group or a naphthylene group.

The groups described above may have a substituent. Examples of the substituent for the groups described above include an alkyl group, a cycloalkyl group, an aryl group, an amino group, an amido group, a ureido group, a urethane group, a group having an active hydrogen atom, e.g., a hydroxy group or a carboxy group, a halogen atom (e.g., a fluorine atom, a chlorine atom, a bromine atom or an iodine atom), an alkoxy group (e.g., a methoxy group, an ethoxy group, a propoxy group or a butoxy group), a thioether group, an acyl group (e.g., an acetyl group, a propanoyl group or a benzoyl group), an acyloxy group (e.g., an acetoxy group, a propanoyloxy group or a benzoyloxy group), an alkoxycarbonyl group (e.g., a methoxycarbonyl group, an ethoxycarbonyl group or a propoxycarbonyl group), a cyano group and a nitro group.

The alkyl group, cycloalkyl group and aryl group as the substituents are same as those described above, respectively. The alkyl group may further be substituted with a fluorine atom or a cycloalkyl group.

The group capable of being decomposed upon the action of an acid to exhibit alkali-solubility included in the fluorine-group containing resin according to the invention includes, for example, $—O—C(R_{36})(R_{37})(R_{38})$, $—O—C(R_{36})(R_{37})(OR_{39})$, $—O—COO—C(R_{36})(R_{37})(R_{38})$, $—O—C(R_{01})(R_{02})COO—C(R_{36})(R_{37})(R_{38})$, $—COO—C(R_{36})(R_{37})(R_{38})$ or $—COO—C(R_{36})(R_{37})(OR_{39})$.

In the above formulae, $R_{36}$ to $R_{39}$ each represent an alkyl group, a cycloalkyl group, an aryl group, an aralkyl group or an alkenyl group, each of which may have a substituent. $R_{01}$ and $R_{02}$ each represent a hydrogen atom or an alkyl group, a cycloalkyl group, an alkenyl group, an aralkyl group or an aryl group, each of which may have a substituent.

Preferred specific examples thereof include an ether group or an ester group of a tertiary alkyl group, for example, a tert-butyl group, a tert-amyl group, a 1-alkyl-1-cyclohexyl group, a 2-alkyl-2-adamantyl group, a 2-adamantyl-2-propyl group or a 2-(4-methylcyclohexyl)-2-propyl group; an acetal group or an acetal ester group, for example, a 1-alkoxy-1-ethoxy group or a tetrahydropyranyl group; a tertiary alkylcarbonato group and a tertiary alkylcarbonylmethoxy group.

Specific examples of the repeating structural units represented by formulas (FA) to (FG) are set forth below, but the invention should not be construed as being limited thereto.

(F-1)

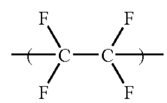

(F-2)

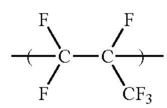

(F-3)

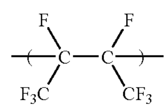

(F-4)

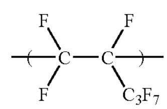

(F-5)

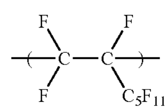

(F-6)

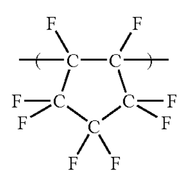

(F-7)

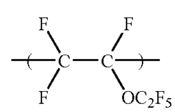

(F-8)

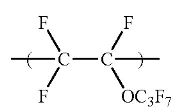

(F-9)

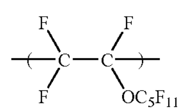

(F-10)

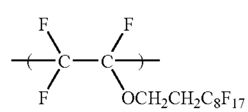

-continued
(F-11)
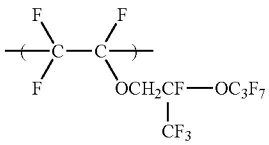
(F-12)
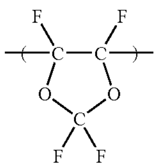
(F-13)
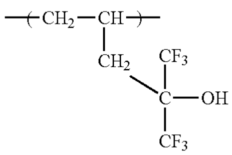
(F-14)
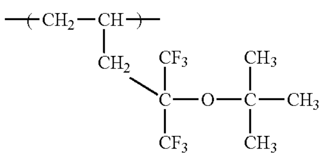
(F-15)
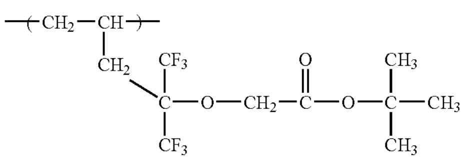
(F-16)
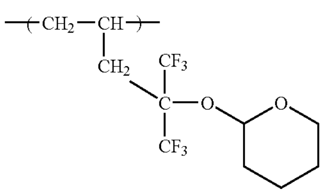
(F-17)
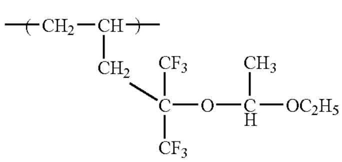
(F-18)
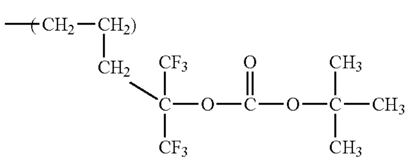
(F-19)
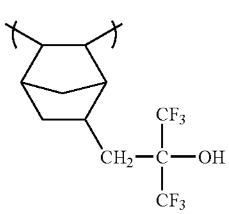
-continued
(F-20)
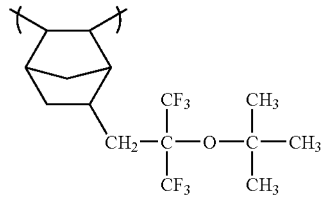
(F-21)
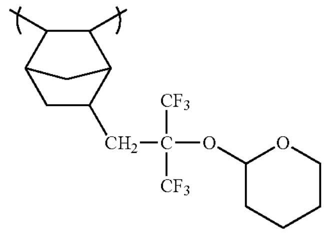
(F-22)
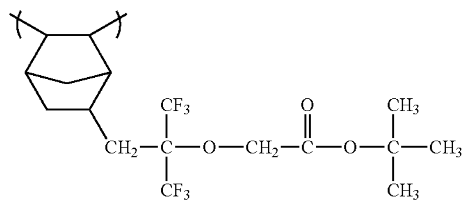
(F-23)
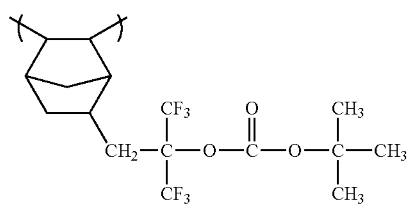
(F-24)
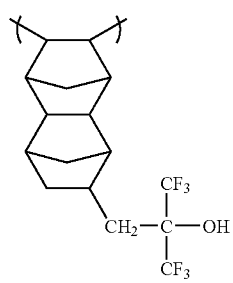
(F-25)
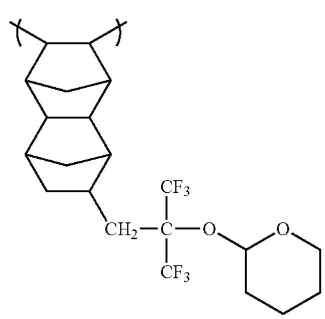

-continued
(F-26)
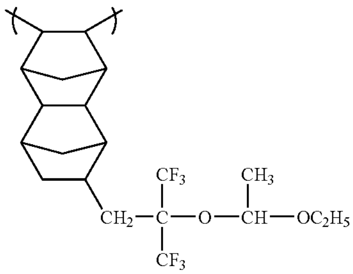
(F-27)
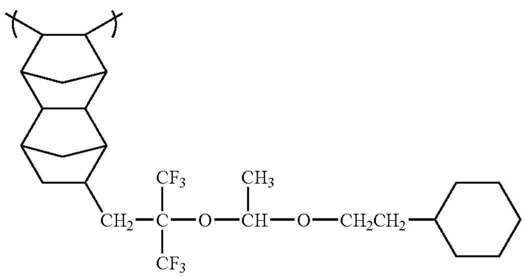
(F-28)
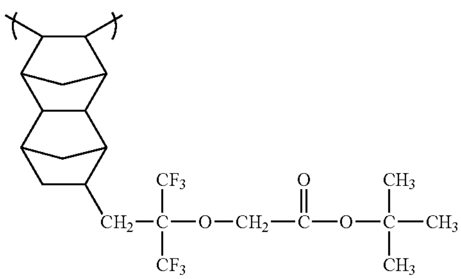
(F-29)
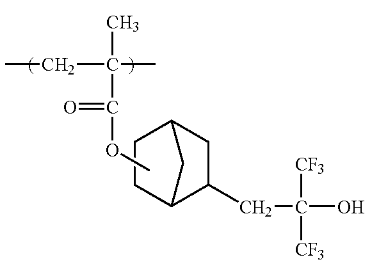
(F-30)
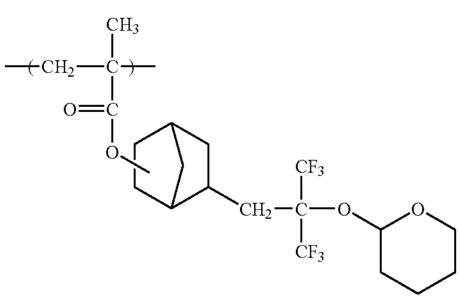
-continued
(F-31)
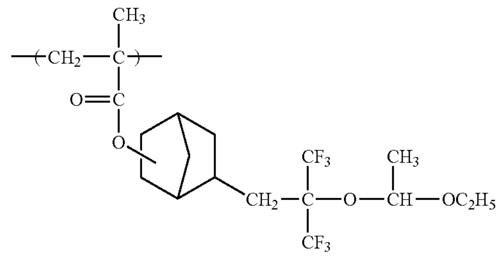
(F-32)
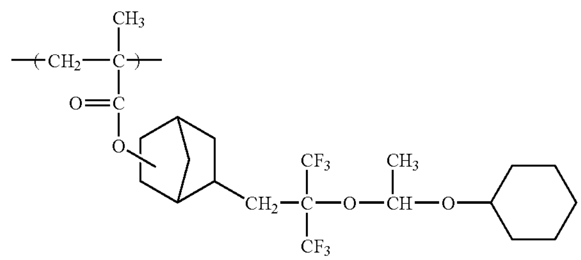
(F-33)
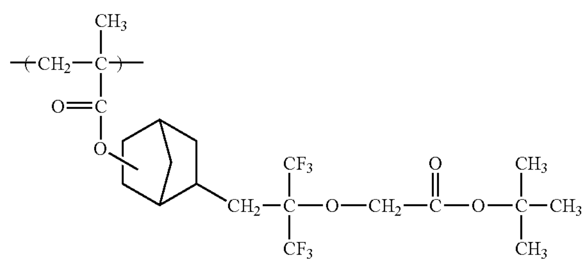
(F-34)
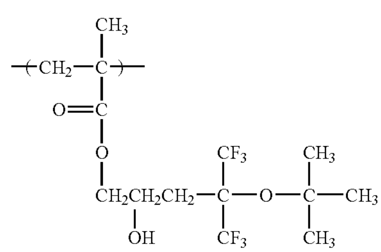
(F-35)
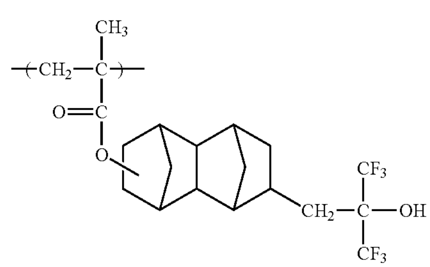

-continued
(F-36)
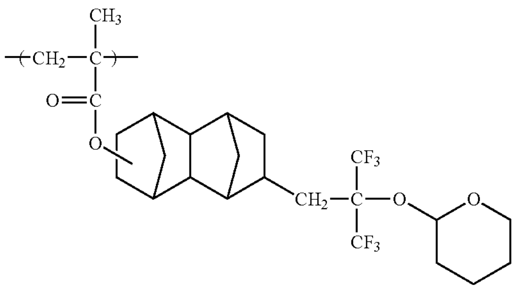
(F-37)
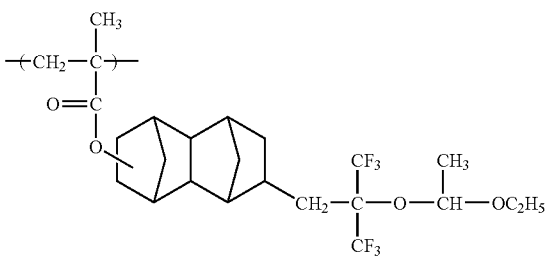
(F-38)
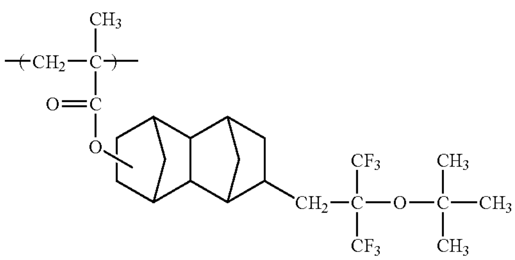
(F-39)
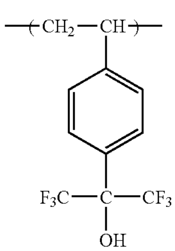
(F-40)
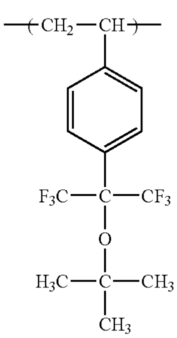
-continued
(F-41)
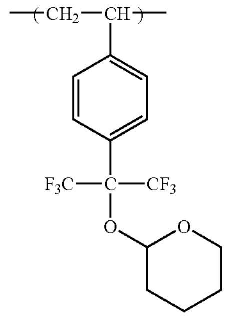
(F-42)
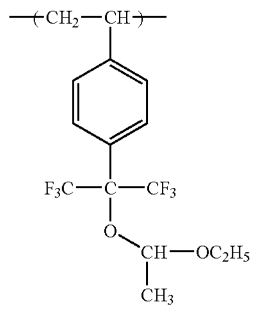
(F-43)
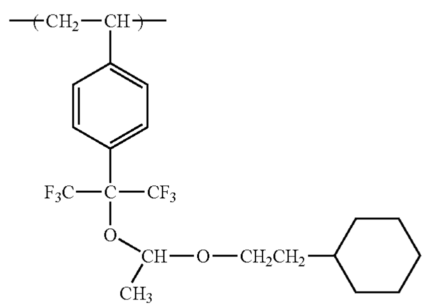
(F-44)
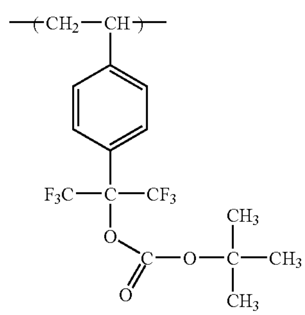
(F-45)
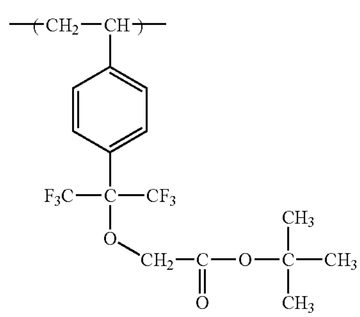

-continued
(F-46)
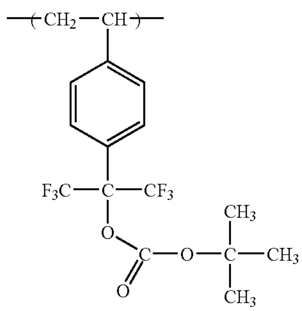
(F-47)
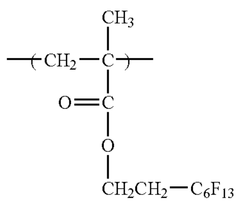
(F-48)
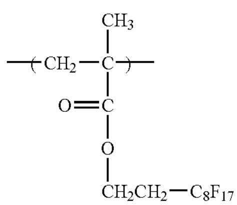
(F-49)
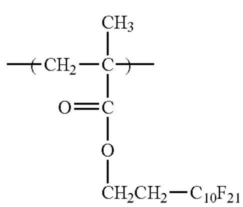
(F-50)
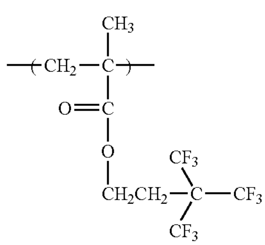
(F-51)
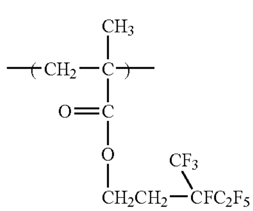
(F-52)
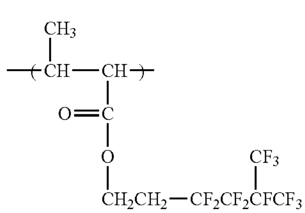
-continued
(F-53)
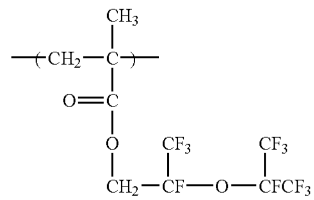
(F-54)
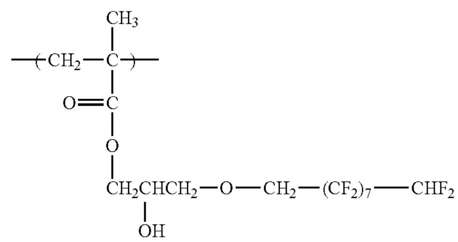
(F-55)
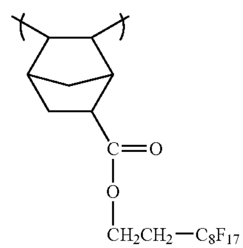
(F-56)
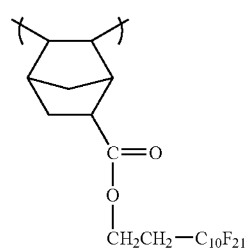
(F-57)
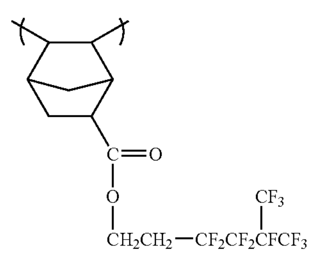
(F-58)
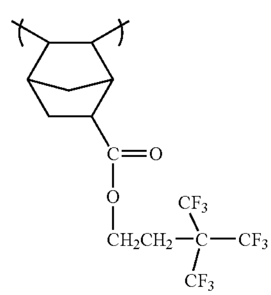

-continued (F-59)

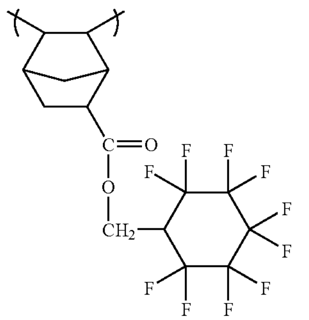

(F-60)

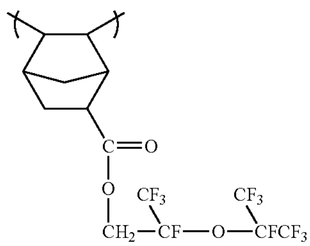

(F-61)

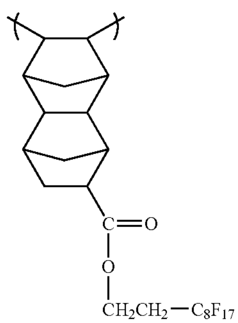

(F-62)

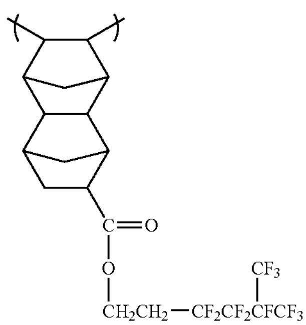

(F-63)

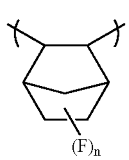

n = 8

(F-64)

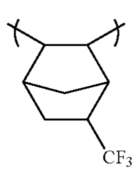

-continued (F-65)

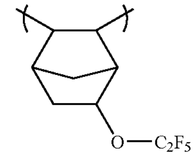

The total content of the repeating units represented by formulae (FA) to (FG) used is ordinarily from 10 to 80% by mole, preferably from 30 to 70% by mole, and more preferably from 35 to 65% by mole based on the total repeating units constituting the resin.

The fluorine group-containing resin preferably contains other repeating unit as a copolymer component in addition to the above-described repeating unit containing a fluorine atom in view of improvement in dry etching resistance, control of alkali-solubility, improvement in adhesion to a substrate or the like. The copolymerizable monomer, which can be used, includes a compound having one addition polymerizable unsaturated bond selected, for example, from an acrylate, an acrylamide, a methacrylate, a methacrylamide, an allyl compound, a vinyl ether, a vinyl ester, a styrene and a crotonate, other than those described above. Preferred examples of other repeating unit include followings:

1) Repeating unit including the above-described alicyclic hydrocarbon structure represented by any one of formulae (pI) to (pVI) and (II-AB), specifically, Repeating Units 1 to 23 and Repeating Units [II-1] to [II-32] described above, and preferably, Repeating Units 1 to 23 described above wherein $R_x$ represents $CF_3$.

2) Repeating unit including the above-described lactone structure represented by any one of formulae (Lc) and (V-1) to (V-5), and specifically, Repeating Units (IV-1) to (IV-16) and Repeating Units (Ib-1) to (Ib-11).

3) Repeating unit represented by any one of formulae (XV), (XVI) and (XVII) described below derived from maleic anhydride, vinyl ether and a vinyl compound having a cyano group, respectively, and specifically, Repeating Units (C-1) to (C-15) described below.

Such other repeating unit may or may not contain a fluorine atom.

(XV)

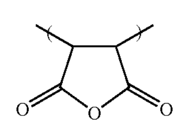

(XVI)

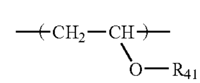

(XVII)

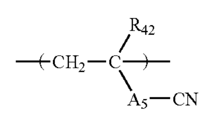

In the above formulae, $R_{41}$ represents an alkyl group, a cycloalkyl group, an aralkyl group or an aryl group.

$R_{42}$ represents a hydrogen atom, a halogen atom, a cyano group, an alkyl group or a haloalkyl group.

$A_5$ represents a single bond, a divalent group selected from an alkylene group, an alkenylene group, a cycloalkylene group, an arylene group, —O—CO—$R_{22}$—, —CO—O—$R_{23}$— or —CO—N($R_{24}$)—$R_{25}$—.

$R_{22}$, $R_{23}$ and $R_{25}$, which may be the same or different, each represent a single bond or a divalent group selected from an alkylene group, an alkenylene group, a cycloalkylene group and an arylene group, each of which may have an ether group, an ester group, an amido group, a urethane group or a ureido group.

$R_{24}$ represents a hydrogen atom, an alkyl group, a cycloalkyl group, an aralkyl group or an aryl group.

n represents 0 or 1. x, y and z each represent an integer of from 0 to 4.

The groups described above may each have a substituent. Examples of the substituents are same as those described for each group in formulae (FA) to (FG) above, respectively.

Specific examples of the repeating structural units represented by formulas (XVI) to (XVII) are set forth below, but the invention should not be construed as being limited thereto.

(C-1)

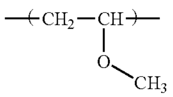

(C-2)

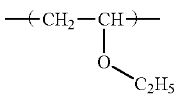

(C-3)

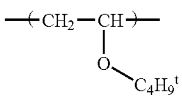

(C-4)

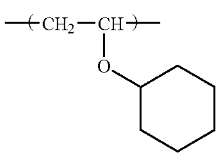

(C-5)

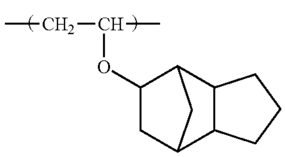

(C-6)

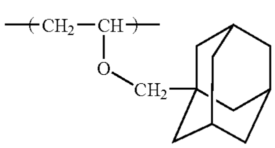

(C-7)

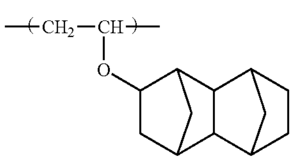

(C-8)

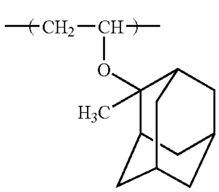

-continued (C-9)

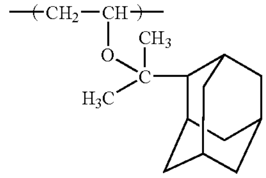

(C-10)

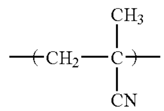

(C-11)

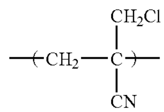

(C-12)

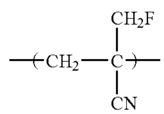

(C-13)

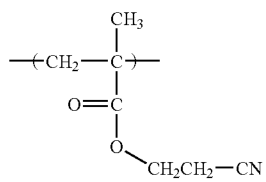

(C-14)

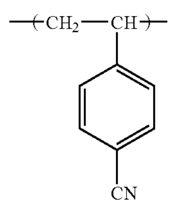

(C-15)

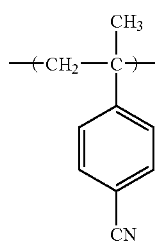

The content of other repeating units, for example, the repeating units represented by formulae (XV) to (XVII) used is ordinarily from 0 to 70% by mole, preferably from 10 to 60% by mole, and more preferably from 20 to 50% by mole based on the total repeating units constituting the resin.

The fluorine group-containing resin of Component (B) may contain an acid-decomposable group in any repeating unit thereof.

The content of the repeating unit containing the acid-decomposable group is preferably from 10 to 70% by mole, more preferably from 20 to 60% by mole, and still more preferably from 30 to 60% by mole based on the total repeating units constituting the resin.

The fluorine group-containing resin can be synthesized according to radical polymerization in much the same manner as the alicyclic hydrocarbon type acid-decomposable resin.

The resin of Component (B) according to the invention may have a repeating unit derived from other copolymerizable monomer in addition to the above-described repeating structural units for the purpose of improving the performances of the resist composition of the invention.

A weight average molecular weight of the resin of Component (B) is preferably form 1,000 to 200,000, when measured by a GPC method and calculated in terms of polystyrene. It is not preferred that the weight average molecular weight of the resin is less than 1,000, since the degradation of heat resistance and dry etching resistance may occur. On the other hand, when the weight average molecular weight of the resin is more than 200,000, undesirable results, for example, degradation of the developing property and film-forming property due to severe increase in viscosity may occur.

A content of the resin of Component (B) in the photosensitive composition of the invention is preferably from 40 to 97% by weight, and more preferably from 60 to 96% by weight based on the total solid content of the photosensitive composition.

[4] Solvent (Component D)

Examples of the organic solvent for use in the photosensitive composition of the invention include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethylsulfoxide, N-methylpyrrolidone and tetrahydrofuran.

In the invention, a solvent having an ester group, a hydroxy group or a carbonyl group is preferably used. A mixed solvent of a solvent having an ester group and a solvent having a hydroxy group and/or a carbonyl group (preferably in a mixing ratio of from 95:5 to 40:60 by weight) is more preferred. The total amount of such a solvent is not less than 80% by weight based on the total amount of the solvent.

Examples of the solvent having an ester group include ethylene glycol monomethyl ether acetate, ethylene glycol monoethyl ether acetate, propylene glycol monomethyl ether acetate, methyl methoxypropionate, ethyl ethoxypropionate and γ-butyrolactone, and preferably propylene glycol monomethyl ether acetate, ethyl ethoxypropionate and γ-butyrolactone.

Examples of the solvent having a hydroxy group include ethylene glycol, ethylene glycol monomethyl ether, ethylene glycol monoethyl ether, propylene glycol, propylene glycol monomethyl ether, propylene glycol monoethyl ether and ethyl lactate. Of these solvents, propylene glycol monomethyl ether and ethyl lactate are particularly preferred.

Examples of the solvent having a carbonyl group include cyclohexanone, cyclopentanone, 2-heptanone and methyl isobutyl ketone, and preferably cyclohexanone and 2-heptanone.

[5] Performance Adjusting Agent (Component C)

In the invention, the term "performance adjusting agent" means all other components constituting the photosensitive composition than Photo-acid generator (Component A), Resin (Component B) and Solvent (Component D).

For instance, a basic compound, a surfactant, an acid-decomposable dissolution inhibiting compound and a dissolution accelerator are exemplified.

(C1) Basic Compound

The photosensitive composition of the invention preferably contains a basic compound in view of restraint of fluctuations in performances occurred with the passage of time from exposure to heating, control of diffusion of an acid formed upon exposure and adjustment of sensitivity.

The basic compound used preferably has a structure represented by any one of formulae (A) to (E) shown below.

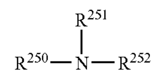

(A)

In the above formula, $R^{250}$, $R^{251}$ and $R^{252}$ each independently represent a hydrogen atom, an alkyl group having from 1 to 20 carbon atoms, an aminoalkyl group having from 1 to 20 carbon atoms, a hydroxyalkyl group having from 1 to 20 carbon atoms or a substituted or unsubstituted aryl group having from 6 to 20 carbon atoms, or $R^{250}$ and $R^{251}$ may be combined with each other to form a ring.

The alkyl chain described above may contain an oxygen atom, a sulfur atom or a nitrogen atom.

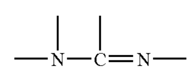

(B)

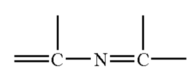

(C)

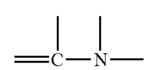

(D)

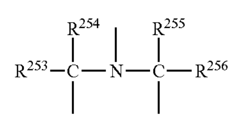

(E)

In the above formulae, $R^{253}$, $R^{254}$, $R^{255}$ and $R^{256}$ each independently represent an alkyl group having from 1 to 6 carbon atoms.

Preferred examples of the basic compound include substituted or unsubstituted guanidines, substituted or unsubstituted amino aminopyrrolidines, substituted or unsubstituted pyrazoles, substituted or unsubstituted pyrazolines, substituted or unsubstituted piperazines, substituted or unsubstituted aminomorpholines, substituted or unsubstituted aminoalkylmorpholines and substituted or unsubstituted piperidines. More preferred examples of the basic compound include compounds having an imidazole structure, a diazabicyclo structure, an onium hydroxide structure, an onium carboxylate structure, a trialkylamine structure, an aniline structure or a pyridine structure, alkylamine derivatives having a hydroxy group and/or an ether bond, and aniline derivatives having a hydroxy group and/or an ether bond.

The compound having an imidazole structure includes, for example, imidazole, 2,4,5-triphenylimidazole and benzimidazole. The compound having a diazabicyclo structure includes, for example, 1,4-diazabicyclo[2.2.2]octane, 1,5-diazabicyclo[4.3.0]non-5-ene and 1,8-diazabicyclo[5.4.0]undec-7-ene. The compound having an onium hydroxide structure includes, for example, a triarylsulfonium hydroxide, phenacyl sulfonium hydroxide and a 2-oxoalkyl group-containing sulfonium hydroxide, e.g., triphenylsulfonium hydroxide, tris(tert-butylphenyl)sulfonium hydroxide, bis(tert-butylphenyl)iodonium hydroxide, phenacyl thiophenium hydroxide or 2-oxopropyl thiophenium hydroxide. The compound having an onium carboxylate structure includes, for example, a compound wherein an anion portion of the compound having an onium hydroxide structure is replaced by a carboxylate, e.g., acetate, adamantane-1-carboxylate or a perfluoroalkyl carboxylate. The compound having a trialkylamine structure includes, for example, tri(n-butyl)amine and tri(n-octyl)amine. The compound having an aniline structure includes, for example, 2,6-diisopropylaniline and N,N-dimethylaniline. The alkylamine derivative having a hydroxy group and/or an ether bond includes, for example, ethanolamine, diethanolamine, triethanolamine and tris(methoxyethoxyethyl)amine. The aniline derivatives having a hydroxy group and/or an ether bond includes, for example, N,N-bis(hydroxyethyl)aniline.

The basic compounds may be used individually or in combination of two or more thereof. The amount of the basic compound added is ordinarily from 0.001 to 10% by weight, and preferably from 0.01 to 5% by weight based on the total solid content of the photosensitive composition. When the amount is less than 0.001% by weight, the effect of addition of basic compound may not be obtained in some cases. When the amount exceeds 10% by weight, decrease in sensitivity and degradation of developing property in the unexposed area may tend to occur.

The amount of the basic compound added is preferably from 2 to 50% by weight, more preferably from 3 to 30% by weight, and most preferably from 5 to 20% by weight based on the amount of the acid-generator (Component A) added.

(C2) Surfactant

It is preferred that the photosensitive composition of the invention contains one or more of fluorine-base and/or silicon-base surfactants (a fluorine atom-containing surfactant, a silicon atom-containing surfactant and a surfactant containing both a fluorine atom and a silicon atom).

By the incorporation of the fluorine-base and/or silicon-base surfactant, the photosensitive composition of the invention can provide, with favorable sensitivity and resolution, resist patterns having good adhesion and less development defect, when an exposure light source of 250 nm or shorter, especially 220 nm or shorter is used.

Examples of the fluorine-base and/or silicon-base surfactant include those described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862 and U.S. Pat. Nos. 5,405,720, 5,360,692, 5,529,881, 5,296,330, 5,436,098, 5,576,143, 5,294,511 and 5,824,451. Commercially available surfactants as described below can also be used as they are.

Examples of the commercially available surfactant used include fluorine-base or silicon-base surfactants, for example, Eftop EF301 and EF303 (manufactured by Shin-Akita Kasei Co., Ltd.), Florad FC430 and FC431 (manufactured by Sumitomo 3M Ltd.), Megafac F171, F173, F176, F189 and R08 (manufactured by Dainippon Ink and Chemicals, Inc.), Surflon S-382, SC101, SC102, SC103, SC104, SC105 and SC106 (manufactured by Asahi Glass Co., Ltd.) and Troysol S-366 (manufactured by Troy Chemical Corp.). A polysiloxane polymer KP-341 (manufactured by Shin-Etsu Chemical Co., Ltd.) is also used as a silicon-base surfactant.

Besides the above described known surfactants, a surfactant comprising a polymer including a fluoroaliphatic group derived from a fluoroaliphatic compound produced by a telomerization method (also referred to as a telomer method) or an oligomerization method (also referred to as an oligomer method) can be used as the surfactant. The fluoroaliphatic compound can be synthesized according to methods described in JP-A-2002-90991.

As the polymer including a fluoroaliphatic group, a copolymer of a monomer having a fluoroaliphatic group with (poly(oxyalkylene)) acrylate and/or (poly(oxyalkylene)) methacrylate is preferred. The copolymer may be a random copolymer or a block copolymer. The poly(oxyalkylene) group includes, for example, a poly(oxyethylene) group, a poly(oxypropylene) group and a poly(oxybutylene) group. Also, a unit containing alkylenes having different chain lengths in the chain thereof, for example, poly(oxyethylene-oxypropylene-oxyethylene block connecting) group or poly(oxyethylene-oxypropylene block connecting) group may be used. Further, the copolymer of a monomer having a fluoroaliphatic group with a (poly(oxyalkylene)) acrylate (or methacrylate) may be not only a binary copolymer but also a ternary or more component copolymer obtained by copolymerizing simultaneously two or more different monomers having a fluoroaliphatic group with two or more different (poly(oxyalkylene)) acrylates (or methacrylates).

Examples of the polymer including a fluoroaliphatic group include commercially available surfactants, for example, Megafac F178, F-470, F-473, F-475, F-476 and F-472 (manufactured by Dainippon Ink and Chemicals, Inc.). Also, copolymers of acrylate (or methacrylate) having a $C_6F_{13}$ group and (poly(oxyalkylene)) acrylate (or methacrylate), copolymers of acrylate (or methacrylate) having a $C_6F_{13}$ group, (poly(oxyethylene)) acrylate (or methacrylate) and (poly(oxypropylene)) acrylate (or methacrylate), copolymers of acrylate (or methacrylate) having a $C_8F_{17}$ group and (poly(oxyalkylene)) acrylate (or methacrylate), copolymers of acrylate (or methacrylate) having a $C_8F_{17}$ group, (poly(oxyethylene)) acrylate (or methacrylate) and (poly(oxypropylene)) acrylate (or methacrylate are exemplified.

The amount of the fluorine-base and/or silicon-base surfactant used is preferably from 0.0001 to 2% by weight, and more preferably from 0.001 to 1% by weight based on the total amount of the photosensitive composition (excluding the solvent).

A surfactant other than the fluorine-base and/or silicon-base surfactant described above may be added to the photosensitive composition. Specific examples thereof include nonionic surfactants, for example, polyoxyethylene alkyl ethers, polyoxyethylene alkyl aryl ethers, polyoxyethylene/polyoxypropylene block copolymers, sorbitan aliphatic esters or polyoxyethylene sorbitan aliphatic esters.

The surfactants may be added individually or in combination of two or more thereof.

(C3) Dissolution Inhibiting Compound

Dissolution inhibiting compound having a molecular weight of not more than 3,000 (hereinafter also referred to as an "dissolution inhibiting compound"), which is decomposed by the action of an acid to increase solubility in an alkali developing solution.

As the dissolution inhibiting compound, which is decomposed by the action of an acid to increase solubility in an alkali developing solution and has a molecular weight of not more than 3,000, an alicyclic or aliphatic compound containing an acid-decomposable group, for example, a cholic acid derivative containing an acid-decomposable group as described in *Proceeding of SPIE,* 2724, 355 (1966) is preferred, for the purpose of preventing deterioration in transmittance in a wavelength range of 220 nm or shorter. Examples of the acid-decomposable group and alicyclic structure are same as those described hereinbefore with respect to the alicyclic hydrocarbon type acid-decomposable resin.

In the case wherein the photosensitive composition of the invention is exposed by a KrF excimer laser or irradiated with an electron beam, it is preferred to use a phenol compound in which a phenolic hydroxy group included is substituted with an acid-decomposable group. The phenol compound is preferably that having from 1 to 9 phenol skeletons, and more preferably that having from 2 to 6 phenol skeletons.

The molecular weight of the dissolution inhibiting compound for use in the invention is not more than 3,000, preferably from 300 to 3,000, and more preferably from 500 to 2,500.

The amount of the dissolution inhibiting compound added is preferably from 3 to 50% by weight, and more preferably from 5 to 40% by weight based on the total solid content of the photosensitive composition.

Specific examples of the dissolution inhibiting compound are set forth below, but the present invention should not be construed as being limited thereto.

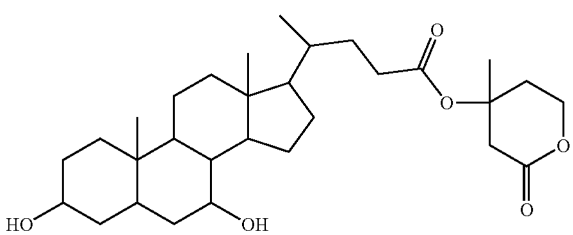

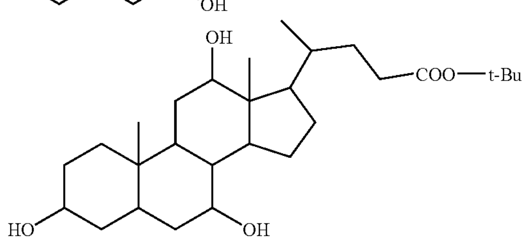

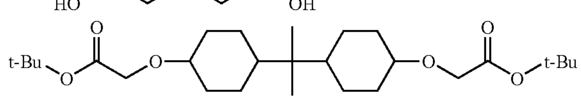

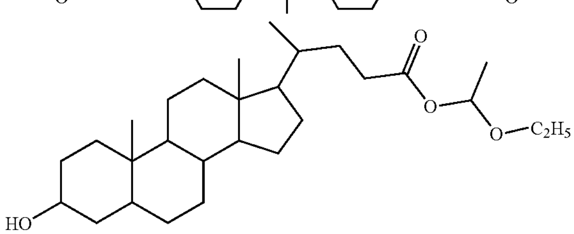

-continued

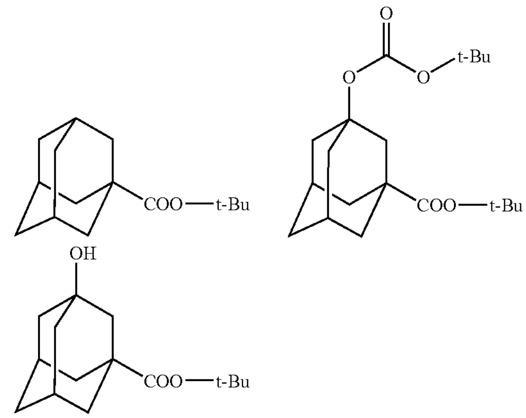

(C4) Dissolution Accelerator

The dissolution accelerator to a developing solution for use in the invention is a low molecular weight compound having a molecular weight of not more than 1,000 and containing at least two phenolic hydroxy groups or at least one carboxy group. In case of containing a carboxy group, the dissolution accelerator is preferably an alicyclic or aliphatic compound.

The amount of the dissolution accelerator added is preferably from 2 to 50% by weight, and more preferably from 5 to 30% by weight based on the resin. The amount exceeding 50% by weight is not preferred, because another problem of increase in development residue or deformation of pattern at the development may occur.

Such a phenol compound having a molecular weight of not more than 1,000 can be easily synthesized by one skilled in the art with reference to methods as described, for example, in JP-A-4-122938, JP-A-2-28531, U.S. Pat. No. 4,916,210 and European Patent 219,294.

Specific examples of the carboxy group-containing alicyclic or aliphatic compound include a carboxylic acid derivative having a steroid structure, for example, cholic acid, deoxycholic acid or lithocholic acid, an adamantanecarboxylic acid derivative, adamantanedicarboxylic acid, cyclohexanecarboxylic acid and cyclohexanedicarboxylic acid, but the invention should not be construed as being limited thereto.

[6] Pattern Formation Method

The photosensitive composition of the invention is used by coating it on an appropriate substrate in the following manner.

Specifically, the photosensitive composition is coated on a substrate (e.g., silicon/silicon dioxide coating) as used for the production of a precision integrated circuit device or a support prepared by providing an anti-reflective coating on such a substrate, by appropriate coating means, for example, a spinner or a coater, and then subjected to drying or baking to form a photosensitive film.

It is preferred in the invention to use a substrate provided with an anti-reflective coating. The thickness of the anti-reflective coating is preferably from 10 to 200 nm, and more preferably from 20 to 150 nm.

The photosensitive film is exposed to an actinic ray or radiation through a desired mask, preferably baked and then developed. Thus, good resist patterns are obtained. As the actinic ray or radiation for the exposure, an infrared ray, visible light, an ultraviolet ray, a far ultraviolet ray, an X-ray and an electron beam are exemplified. A far ultraviolet ray having preferably a wavelength of 250 nm or shorter, more preferably 220 nm or shorter is used. Specific examples thereof include a KrF excimer laser beam (248 nm), an ArF excimer laser beam (193 nm), an $F_2$ excimer laser beam (157 nm), an X-ray and an electron beam. The ArF excimer laser beam and $F_2$ excimer laser beam are most preferred.

In the development step, an alkali developing solution as described below is used. The alkali developing solution for the photosensitive composition of the invention includes an aqueous alkaline solution containing, for example, an inorganic alkali, e.g., sodium hydroxide, potassium hydroxide, sodium carbonate, sodium silicate, sodium metasilicate or aqueous ammonia, a primary amine, e.g., ethylamine or n-propylamine, a secondary amine, e.g., diethylamine or di-n-butylamine, a tertiary amine, e.g., triethylamine or methyldiethylamine, an alcohol amine, e.g., dimethylethanolamine or triethanolamine, a quaternary ammonium salt, e.g., tetramethylammonium hydroxide or tetraethylammonium hydroxide, and a cyclic amine, e.g., pyrrole or piperidine.

A developing solution prepared by adding an appropriate amount of an alcohol or a surfactant to the aqueous alkaline solution is also used.

The alkali concentration in the aqueous alkaline solution is ordinarily from 0.1 to 20% by weight.

The pH of the aqueous alkaline solution is ordinarily from 10.0 to 14.0.

The invention will be described in more detail with reference to the following examples, but the invention should not be construed as being limited thereto.

<Resin>

Structures and molecular weights of Resins (1) to (22) for use in the examples are set forth below.

| | | Molecular Weight |
|---|---|---|
| (1) | 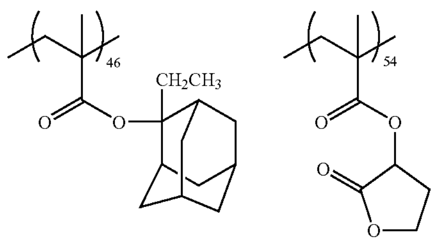 | 10700 |
| (2) | 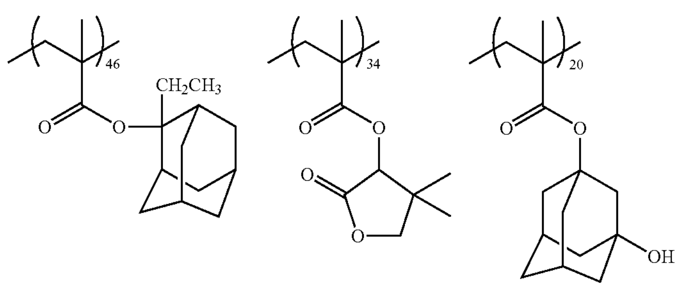 | 9400 |
| (3) | 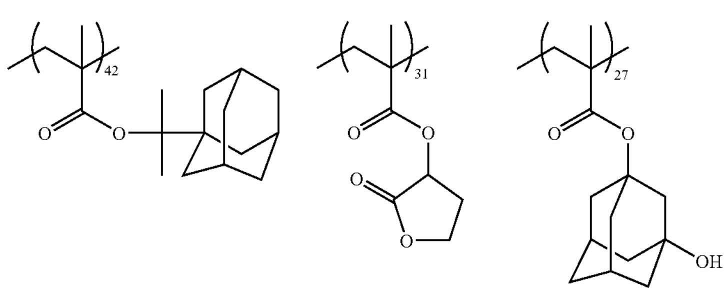 | 8300 |

-continued
| | | Molecular Weight |
|---|---|---|
| (4) | 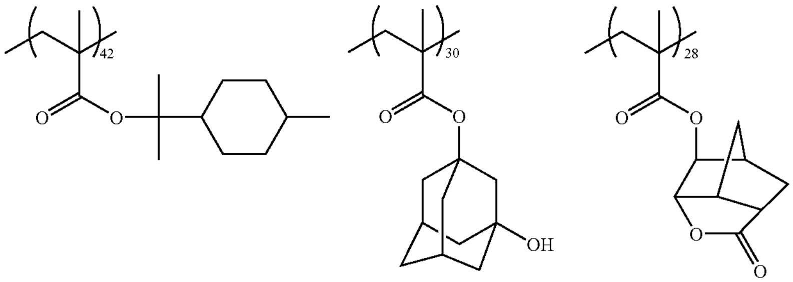 | 10300 |
| (5) | 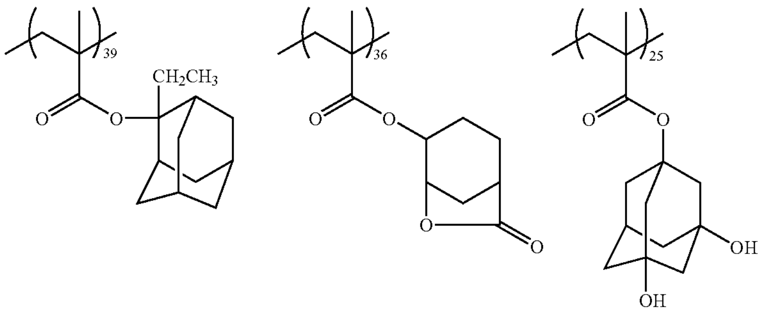 | 8900 |
| (6) | 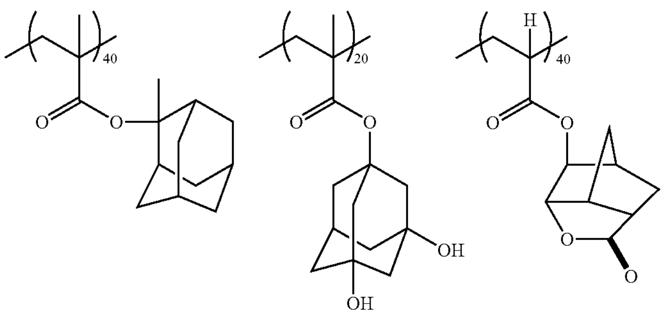 | 11300 |
| (7) | 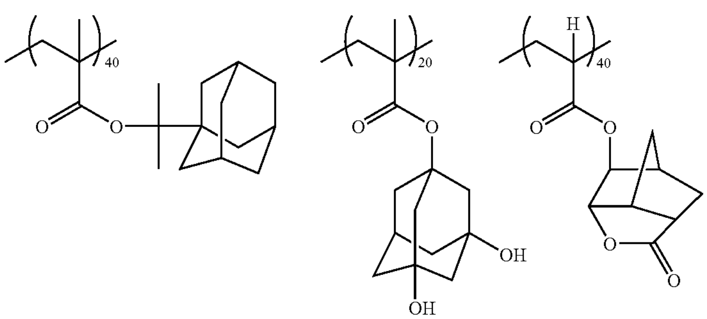 | 19000 |
| (8) | 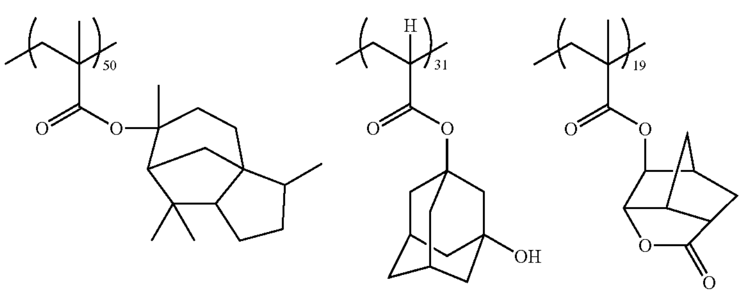 | 11700 |

-continued
| | | Molecular Weight |
|---|---|---|
| (9) | 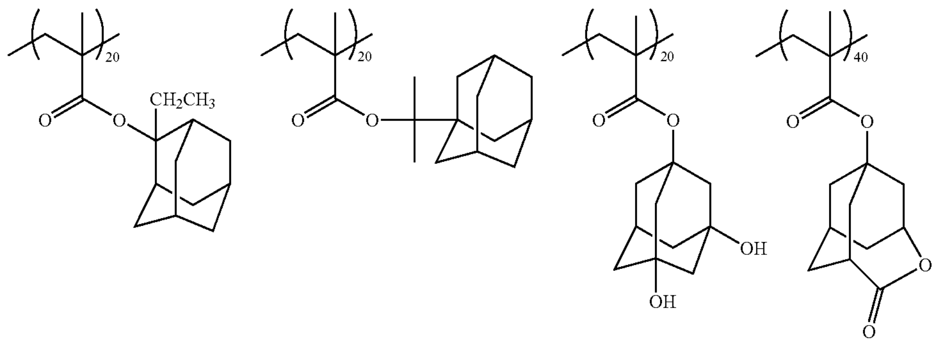 | 9800 |
| (10) | 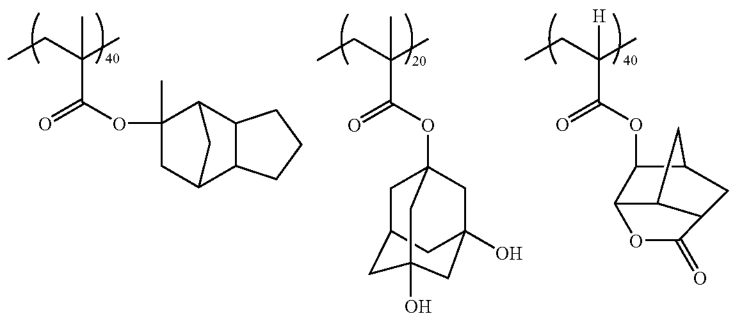 | 13400 |
| (11) | 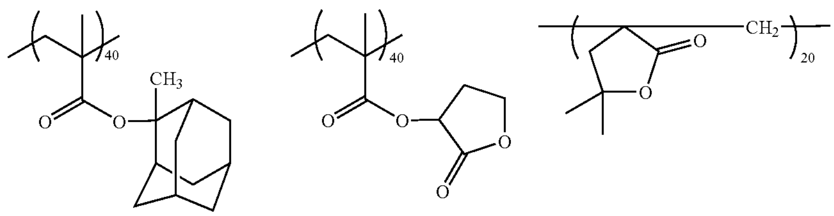 | 9300 |
| (12) | 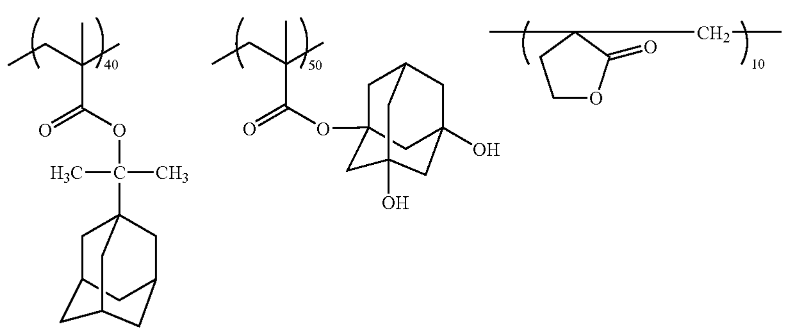 | 7600 |
| (13) | 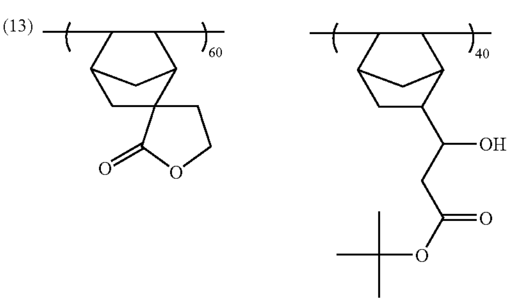 | 9600 |

-continued
| | Molecular Weight |
|---|---|
| (14) 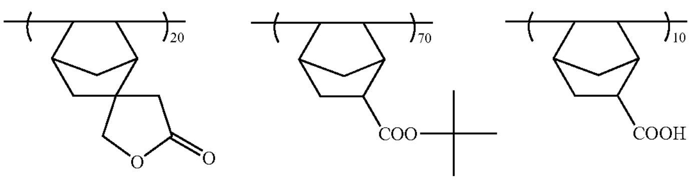 | 5800 |
| (15) 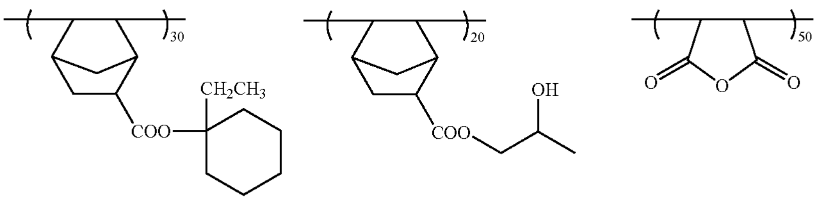 | 4700 |
| (16) 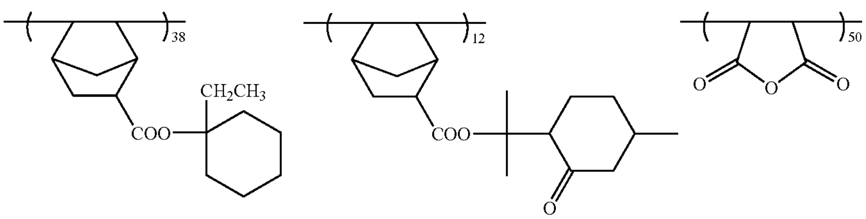 | 8900 |
| (17) 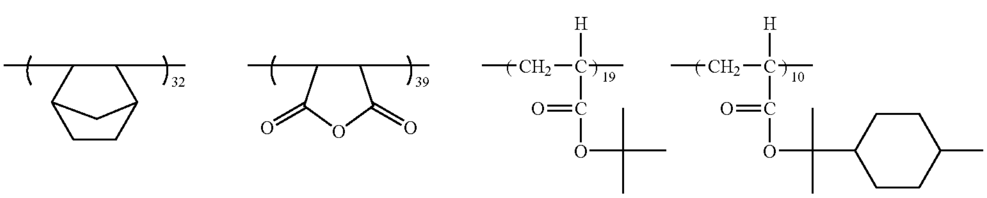 | 12100 |
| (18) 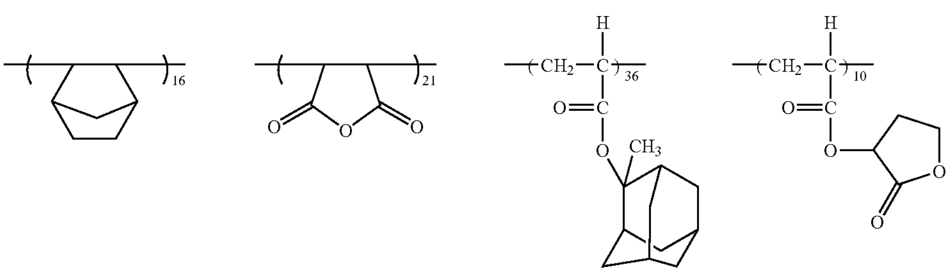 | 13900 |
| (19) 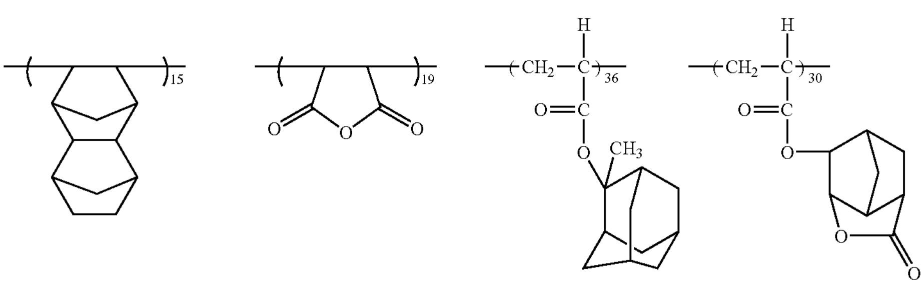 | 12700 |

-continued
| | | Molecular Weight |
|---|---|---|
| (20) | 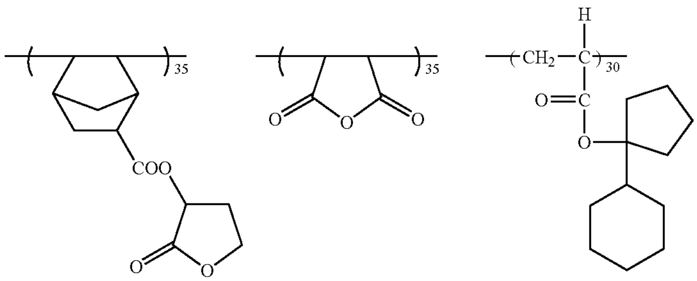 | 10800 |
| (21) | 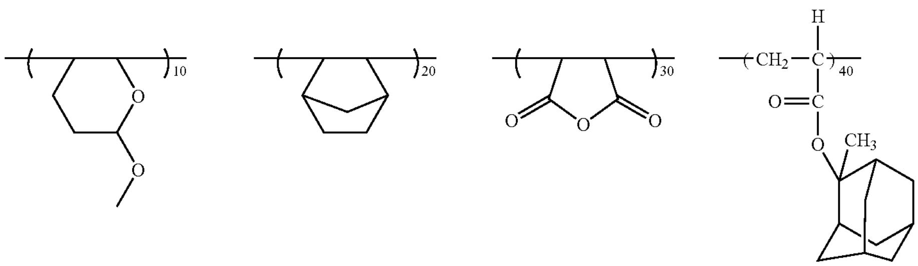 | 9300 |
| (22) | 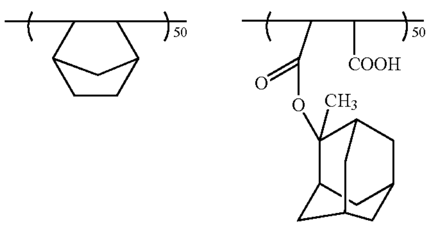 | 7600 |
<Fluorine Group-Containing Resin>
Structures of Fluorine Group-Containing Resins (FII-1) to (FII-40) for use in the examples are set forth below.
Also, weight average molecular weights and other characteristics of Fluorine Group-Containing Resins (FII-1) to (FII-40) are set forth in Tables 1 and 2 below.
(FII-1)
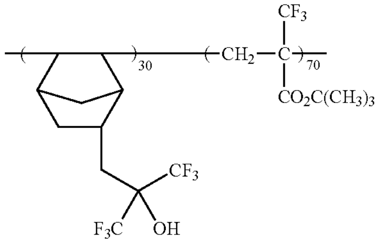
-continued
(FII-2)
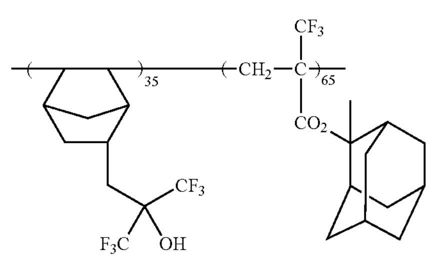
(FII-3)
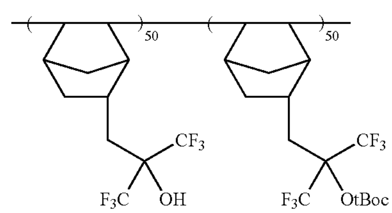

-continued
(FII-4)
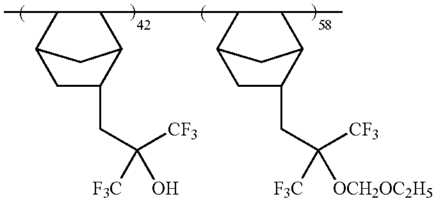
(FII-5)
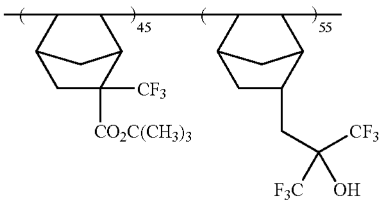
(FII-6)
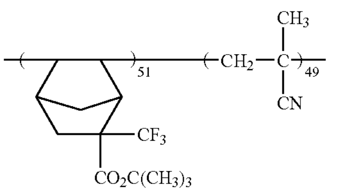
(FII-7)
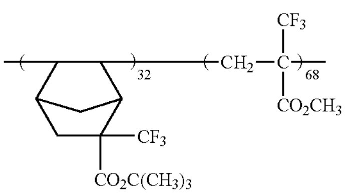
(FII-8)
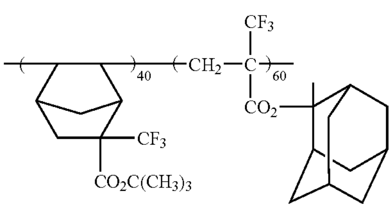
(FII-9)
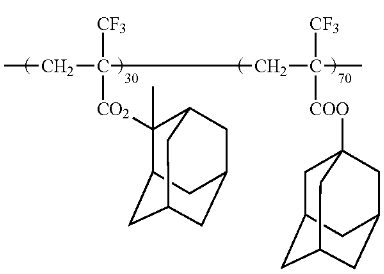
(FII-10)
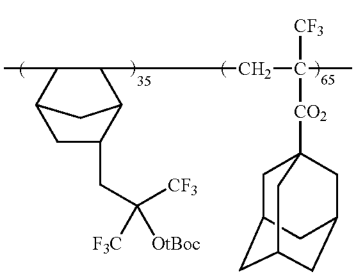
-continued
(FII-11)
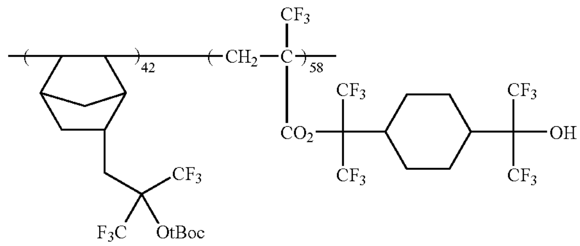
(FII-12)
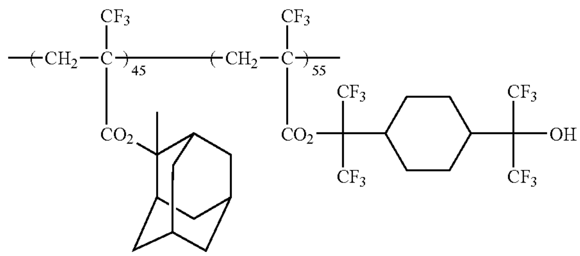
(FII-13)
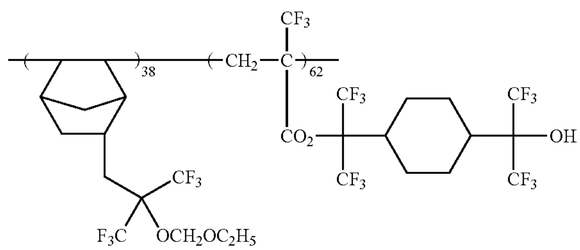
(FII-14)
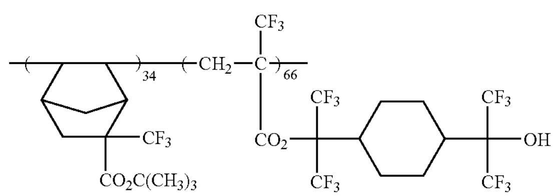
(FII-15)
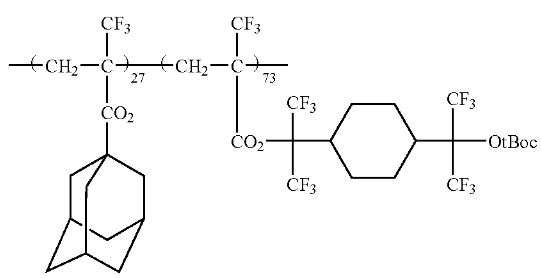
(FII-16)
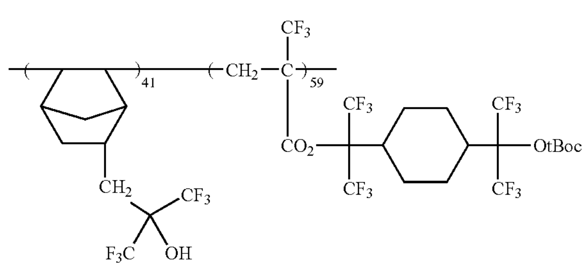

-continued
(FII-17)
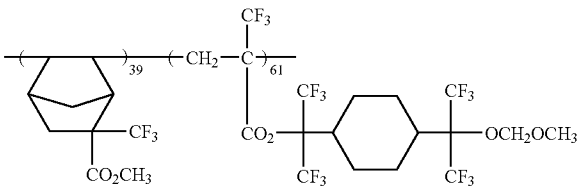
(FII-18)
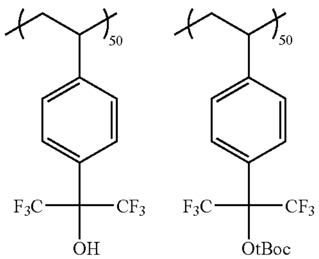
(FII-19)
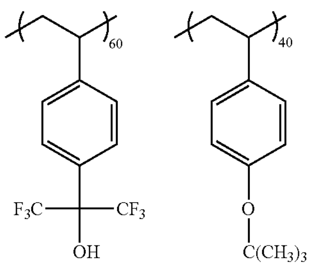
(FII-20)
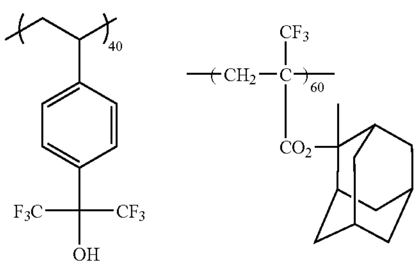
(FII-21)
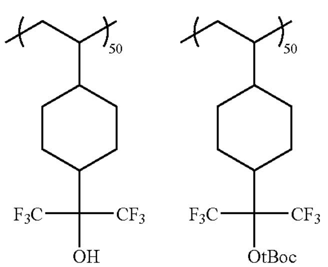
(FII-22)
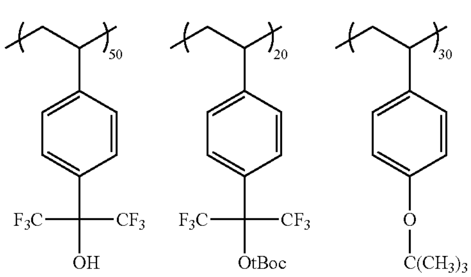
-continued
(FII-23)
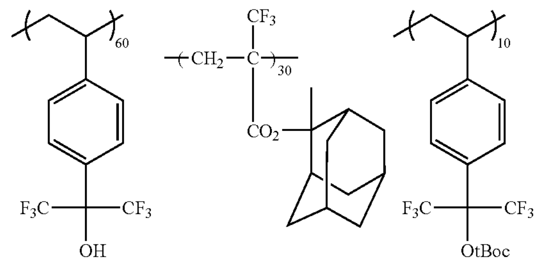
(FII-24)
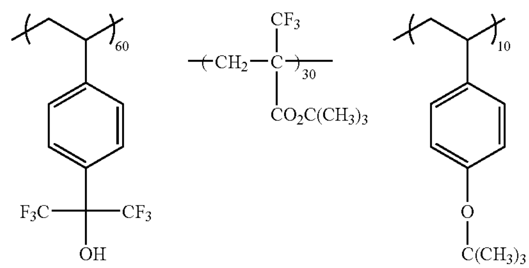
(FII-25)
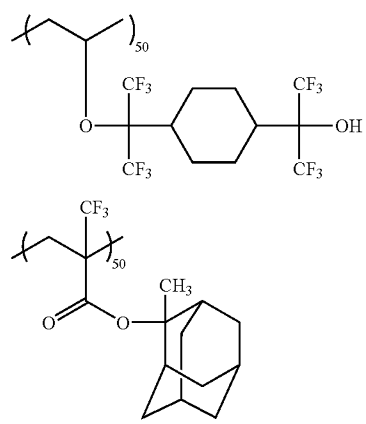
(FII-26)
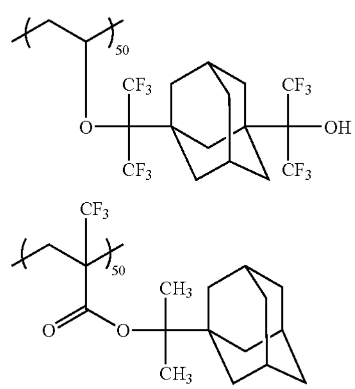
(FII-27)
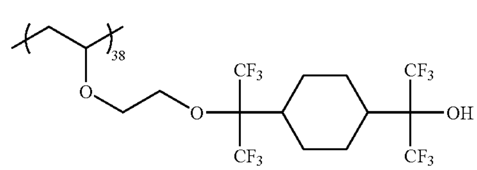

-continued
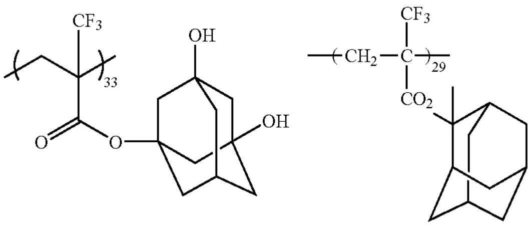
(FII-28)
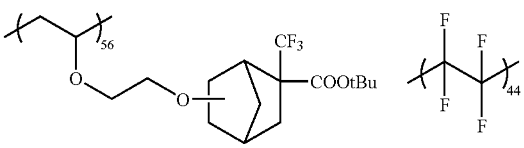
(FII-29)
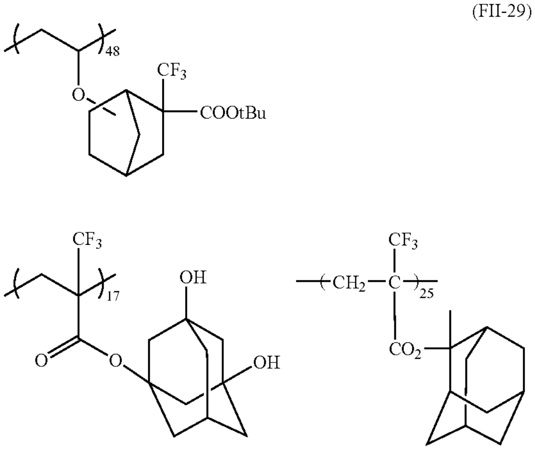
(FII-30)
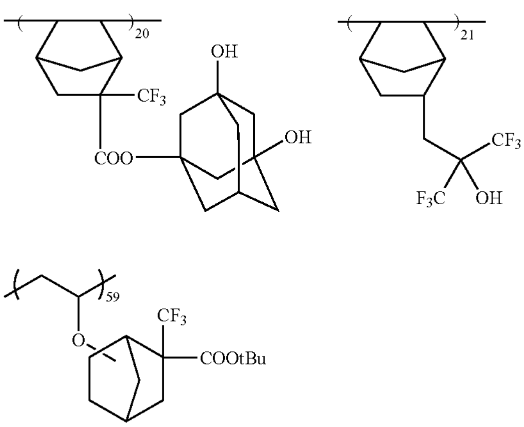
(FII-31)
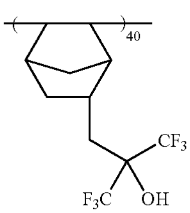
-continued
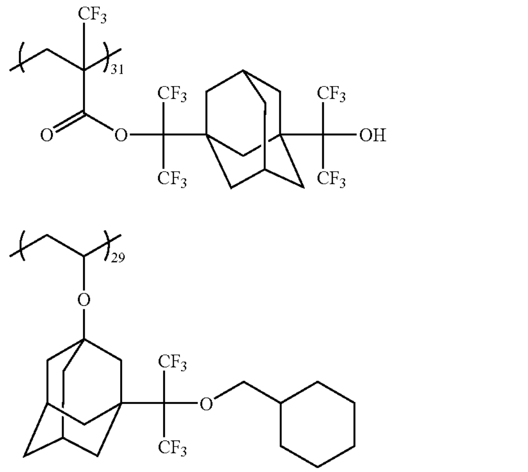
(FII-32)
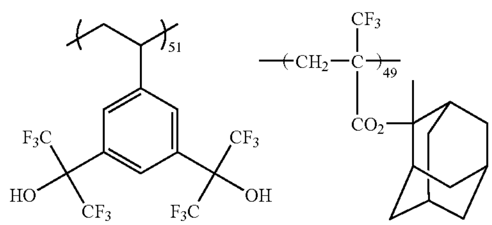
(FII-33)
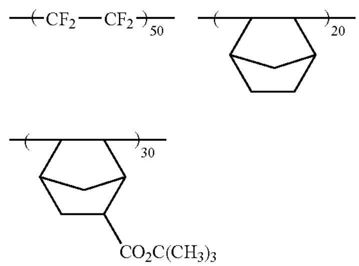
(FII-34)
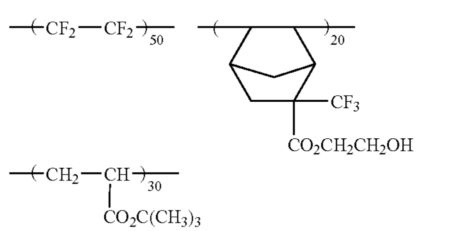
(FII-35)
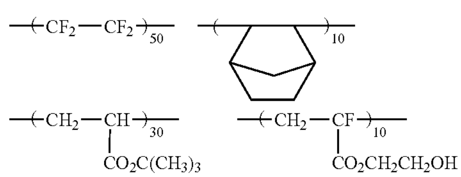
(FII-36)
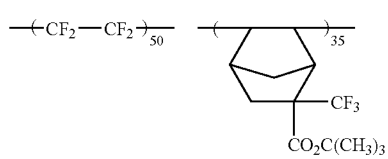

-continued

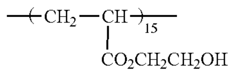

(FII-37)

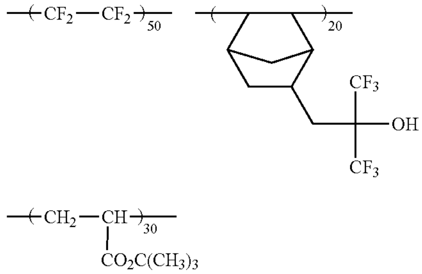

(FII-38)

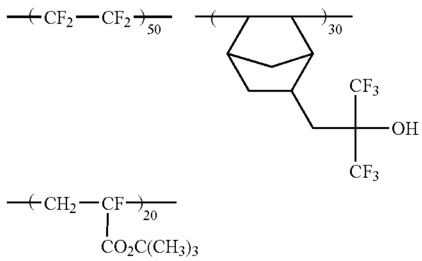

(FII-39)

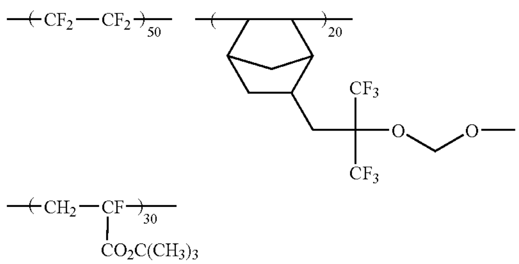

(FII-40)

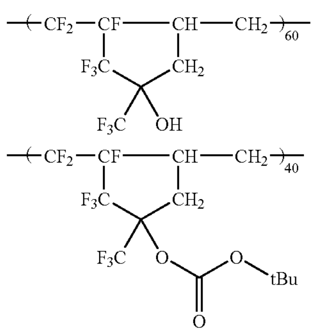

TABLE 1

| Resin | Weight Average Molecular Weight (Mw) | Degree of Dispersion | Content of Oligomer Having Molecular Weight Less Than 1,000 |
|---|---|---|---|
| (FII-1) | 15,200 | 1.45 | 5 |
| (FII-2) | 24,000 | 1.75 | 8 |
| (FII-3) | 18,200 | 1.85 | 7 |
| (FII-4) | 16,500 | 1.46 | 6 |
| (FII-5) | 9,500 | 1.58 | 8 |
| (FII-6) | 19,500 | 2.02 | 8 |
| (FII-7) | 6,500 | 1.85 | 7 |

TABLE 1-continued

| Resin | Weight Average Molecular Weight (Mw) | Degree of Dispersion | Content of Oligomer Having Molecular Weight Less Than 1,000 |
|---|---|---|---|
| (FII-8) | 28,400 | 1.68 | 9 |
| (FII-9) | 28,600 | 1.44 | 5 |
| (FII-10) | 12,800 | 1.65 | 8 |
| (FII-11) | 16,800 | 1.68 | 9 |
| (FII-12) | 28,400 | 1.58 | 6 |
| (FII-13) | 19,800 | 1.69 | 8 |
| (FII-14) | 8,700 | 1.95 | 8 |
| (FII-15) | 15,200 | 1.46 | 7 |
| (FII-16) | 19,500 | 1.65 | 4 |
| (FII-17) | 16,900 | 1.42 | 8 |
| (FII-18) | 15,900 | 1.85 | 9 |
| (FII-19) | 15,000 | 1.55 | 4 |
| (FII-20) | 12,500 | 1.88 | 8 |
| (FII-21) | 25,000 | 1.68 | 9 |
| (FII-22) | 16,000 | 1.54 | 7 |
| (FII-23) | 14,600 | 1.95 | 5 |
| (FII-24) | 17,500 | 1.48 | 5 |
| (FII-25) | 16,500 | 1.52 | 6 |
| (FII-26) | 14,600 | 1.63 | 5 |

TABLE 2

| Resin | Weight Average Molecular Weight (Mw) | Degree of Dispersion |
|---|---|---|
| (FII-27) | 8,300 | 1.55 |
| (FII-28) | 8,300 | 1.62 |
| (FII-29) | 8,000 | 1.52 |
| (FII-30) | 9,200 | 1.71 |
| (FII-31) | 10,200 | 1.47 |
| (FII-32) | 7,900 | 1.35 |
| (FII-33) | 6,800 | 1.60 |
| (FII-34) | 7,400 | 1.59 |
| (FII-35) | 8,300 | 1.70 |
| (FII-36) | 4,800 | 1.55 |
| (FII-37) | 4,700 | 1.51 |
| (FII-38) | 6,400 | 1.69 |
| (FII-39) | 9,600 | 1.70 |
| (FII-40) | 4,600 | 1.68 |

EXAMPLES 1 TO 14 AND COMPARATIVE EXAMPLES 1 AND 2

<Preparation of Resist>

The components described in Table 3 shown below were dissolved in the solvents described in Table 3 shown below to prepare solutions and the solutions were filtered through a polytetrafluoroethylene filter or a polyethylene filter having a pore size of 0.1 μm to prepare positive resist solutions, respectively. The positive resist solutions were evaluated in the manner described below. The results obtained are shown in Table 4 below.

TABLE 3

| Example | Component A (g) | Component B | Component C (g) Basic Compound (g) | Surfactant (0.03 g) | Dissolution Inhibiting Agent (g) | Component D (g) |
|---|---|---|---|---|---|---|
| 1 | z38 (0.45) | (1) 10 g | DIA (0.05) | W-1 | — | A1 (130) |
| 2 | z6 (0.3) z21 (0.6) | (2) 7 g (11) 3 g | TPI (0.04) | W-1 | — | A1 (80) B2 (40) |
| 3 | z15 (0.3) z40 (0.5) | (3) 10 g | TOA (0.04) | W-2 | — | A1 (125) A3 (5) |
| 4 | z38 (0.2) z52 (0.4) | (4) 5 g (12) 5 g | HEP (0.06) | W-2 | — | A1 (100) B3 (40) |
| 5 | z54 (1) | (5) 5 g (17) 5 g | DBN (0.03) | W-3 | — | A1 (110) B2 (40) |
| 6 | z44 (0.8) | (6) 10 g | DIA (0.04) PEA (0.04) | W-1 | — | A1 (80) B1 (70) |
| 7 | z14 (0.2) z51 (0.4) | (7) 7 g (16) 3 g | TPA (0.04) | W-2 | — | A1 (90) B2 (60) |
| 8 | z46 (0.5) z34 (0.2) | (13) 2 g (10) 8 g | TPSA (0.1) | W-4 | — | A1 (70) B2 (40) |
| 9 | z13 (0.3) z27 (0.3) | (14) 8 g (9) 2 g | TBAH (0.03) | W-1 | — | A1 (80) B2 (30) |
| 10 | z1 (0.3) z37 (0.5) | (15) 6 g (19) 4 g | TMEA (0.05) | W-4 | — | A1 (80) B1 (70) |
| 11 | z49 (0.7) | (18) 10 g | HAP (0.05) | W-1 | — | A1 (150) |
| 12 | z18 (0.4) z31 (0.5) | (20) 5 g (8) 5 g | DBN (0.04) | W-2 | LCD (1) | A2 (70) B4 (80) |
| 13 | z38 (0.15) z41 (0.5) | (21) 10 g | DIA (0.01) PEA (0.01) | W-1 | — | A1 (100) B2 (60) |
| 14 | z5 (0.2) z38 (0.25) | (22) 10 g (6) 3 g | PEA (0.05) | W-1 | — | A1 (100) B1 (70) |
| Comparative Example 1 | z38 (0.1) | (1) 10 g | DIA (0.05) | W-1 | — | A1 (130) |
| Comparative Example 2 | z38 (0.2) | (1) 10 g | DIA (0.05) | W-1 | — | A1 (130) |

The abbreviations used in Tables 3 and 5 are explained below.

DBN: 1,5-Diazabicyclo[4.3.0]non-5-ene
TPI: 2,4,5-Triphenylimidazole
TPSA: Triphenylsulfonium acetate
HEP: N-Hydroxyethylpiperidine
DIA: 2,6-Diisopropylaniline
DCMA: Dicyclohexylmethylamine
TPA: Tripentylamine
TOA: Tri-n-octylamine
HAP: Hydroxyantipyrine
TBAH: Tetrabutylammoniumhydroxide
TMEA: Tris(methoxyethoxyethyl)amine
PEA: N-Phenyldiethanolamine
W-1: Megafac F176 (manufactured by Dainippon Ink and Chemicals, Inc.) (fluorine-base)
W-2: Megafac R08 (manufactured by Dainippon Ink and Chemicals, Inc.) (fluorine- and silicon-base)
W-3: Polysiloxane Polymer KP-341 (manufactured by Shin-Etsu Chemical Co., Ltd.) (silicon-base)
W-4: Troysol S-366 (manufactured by Troy Chemical Co., Ltd.)
A1: Propylene glycol monomethyl ether acetate
A2: Ethyl ethoxypropionate
A3: γ-Butyrolactone
B1: Propylene glycol monomethyl ether
B2: Cyclohexanone
B3: 2-Heptanone
B4: Ethyl lactate
LCB: tert-Butyl lithocholate When the plural resins and/or solvents are used in each example, ratios thereof are indicated by weight in Tables 3 and 5.

<Evaluation of Resist>

On a silicon substrate which had been subjected to a hexamethyldisilazane treatment was uniformly coated an anti-reflective coating (DUV-42 manufactured by Brewer Science, Inc.) at a thickness of 600 angstroms by a spin coater, dried at 100° C. for 90 seconds on a hot plate, and further dried by heating at 190° C. for 240 seconds. Then, each of the positive resist solutions described above was coated thereon by a spin coater and dried at 120° C. for 90 seconds to form a resist film having a thickness of 0.2 μm.

The resist film was subjected to exposure using an ArF excimer laser stepper (manufacture by ISI Co., Ltd.; NA=0.6) through a mask and immediately after the exposure, it was heated at 120° C. for 90 seconds on a hot plate. Then, the resist film was developed with a 2.38% by weight aqueous solution of tetramethylammonium hydroxide at 23° C. for 60 seconds, rinsed with pure water for 30 seconds, and dried to form a line pattern.

[Profile]

Profile of line in a 1/1 line and space of 0.15 μm was observed by a scanning electron microscope. A case wherein a rectangular profile was observed was indicated as ○, a case wherein a slightly tapered profile or a profile having a small footing was observed was indicated as Δ and a case wherein an utterly tapered profile or a profile having an utter footing was observed was indicated as ×.

[PEB Temperature Dependency]

On a silicon wafer was first coated an anti-reflective coating (ARC-29A-8 manufactured by Brewer Science, Inc.) at a thickness of 78 nm using a spin coater, followed by drying. Each of the positive resist solutions described above was coated on the anti-reflective coating and dried at 120° C. for 90 seconds to prepare a positive resist film having a thickness of 200 nm. The positive resist film was exposed with an ArF excimer laser (ArF stepper manufacture by ISI Co., Ltd.; wavelength of 193 nm; NA=0.6). Specifically, the resist film was exposed using a pattern of an isolated contact hole having a mask size of 180 nm in an exposure amount of necessary for reproducing the isolated contact hole having a mask size of 180 nm as an isolated contact hole having a size of 130 nm. Immediately after the exposure, the exposed film was heated at 120° C. for 90 seconds, developed with a 2.38% by weight aqueous solution of tetramethylammonium hydroxide, rinsed with distilled water to form a resist pattern profile.

The exposure amount of necessary for reproducing the isolated contact hole having a mask size of 180 nm as an isolated contact hole having a size of 130 nm at the post-exposure baking temperature of 120° C. was determined as an optimal exposure amount. Then, the resist films were exposed using the pattern of an isolated contact hole having a mask size of 180 nm in the optimal exposure amount and subjected to the post-exposure baking at a temperature of the above post-exposure baking temperature +2° C. (122° C.)

and at a temperature of the above post-exposure baking temperature −2° C. (118° C.).

The resist patterns on silicon wafer thus-obtained were observed by a SEM to evaluate the resist in the following manner.

Specifically, the resulting contact hole patterns were subjected to length measurement to determine their diameters $L_1$ and $L_2$ respectively. The PEB temperature dependency was defined as fluctuation of the diameter per temperature difference of 1° C. and calculated according to the following formula:

PEB Temperature Dependency (nm/° C.)=$(L_1-L_2)/4$

TABLE 4

| Example | Value of Formula (1) | Value of Formula (2) | Value of Formula (3) | Profile | PEB Temperature Dependency (nm/° C.) |
|---|---|---|---|---|---|
| 1 | 0.0753 | 0.1890 | 0.0473 | ○ | 2.2 |
| 2 | 0.0838 | 0.1641 | 0.0820 | ○ | 5.0 |
| 3 | 0.0772 | 0.2024 | 0.0736 | ○ | 3.8 |
| 4 | 0.0712 | 0.1676 | 0.0605 | ○ | 4.6 |
| 5 | 0.0687 | 0.0904 | 0.0904 | ○ | 3.1 |
| 6 | 0.0681 | 0.1551 | 0.0776 | ○ | 2.9 |
| 7 | 0.0759 | 0.1500 | 0.0562 | ○ | 4.3 |
| 8 | 0.0896 | 0.1477 | 0.0646 | ○ | 3.5 |
| 9 | 0.0883 | 0.1407 | 0.0563 | ○ | 2.7 |
| 10 | 0.0676 | 0.2022 | 0.0735 | ○ | 4.2 |
| 11 | 0.0670 | 0.1299 | 0.0649 | ○ | 3.4 |
| 12 | 0.0843 | 0.1420 | 0.0752 | ○ | 2.1 |
| 13 | 0.0630 | 0.1209 | 0.0651 | ○ | 4.5 |
| 14 | 0.0583 | 0.1899 | 0.0427 | ○ | 3.7 |
| Comparative Example 1 | 0.0726 | 0.0393 | 0.0098 | X | 12.3 |
| Comparative Example 2 | 0.0739 | 0.1156 | 0.0289 | Δ | 9.0 |

From the results shown in Table 4, it is apparent that the positive photosensitive compositions of Examples 1 to 14 are excellent in the pattern profile and exhibit the small PEB temperature dependency.

EXAMPLES 15 TO 34 AND COMPARATIVE EXAMPLES 3 AND 4

$F_2$ Excimer Laser Exposure

<Preparation of Resist>

The components described in Table 5 shown below were dissolved in the solvents described in Table 5 shown below to prepare solutions and the solutions were filtered through a polytetrafluoroethylene filter having a pore size of 0.1 μm to prepare positive resist solutions, respectively.

<Evaluation of Resist>

On a silicon wafer which had been subjected to a hexamethyldisilazane treatment was coated each of the positive resist solutions described above by a spin coater and dried by heating at 120° C. for 90 seconds on a vacuum type hot plate to form a resist film having a thickness of 100 nm.

The resist film was subjected to exposure using a 157 nm laser exposure and dissolution behavior analyzing device (VUVES-4500 manufacture by Lithoteck Japan Co., Ltd.) and immediately after the exposure, it was heated at 120° C. for 90 seconds on a hot plate. Then, the resist film was developed with a 2.38% by weight aqueous solution of tetramethylammonium hydroxide for 60 seconds, rinsed with pure water, to prepare a sample wafer. With the sample wafers, an exposure amount (sensitivity) D1 for resolving a pattern of 1.5 cm×1.5 cm was determined. In the same manner as above except that the heat treatment immediately after the exposure was conducted at 125° C. for 90 seconds, an exposure amount (sensitivity) D1 for resolving a large-size pattern was determined. A fluctuation ratio of sensitivity depending on change of the post-exposure baking temperature (PEB temperature) was determined according to the formula described below. The smaller the absolute value, smaller fluctuation of performance depending on the change of the post-exposure baking temperature.

Fluctuation Ratio of Sensitivity=(D1−D2)/D1×100

TABLE 5

| | | | Component C (g) | | |
|---|---|---|---|---|---|
| Example | Component A (g) | Component B (g) | Basic Compound (g) | Surfactant (0.03 g) | Component D (g) |
| 15 | z38 (0.5) | FII-1 (10) | DIA (0.05) | W-1 | A1 (130) |
| 16 | z6 (0.3) z21 (0.6) | FII-2 (10) | TPI (0.04) | W-1 | A1 (80) B2 (40) |
| 17 | z15 (0.4) z40 (0.5) | FII-8 (8) FII-33 (2) | TOA (0.04) | W-2 | A1 (125) A3 (5) |
| 18 | z38 (0.4) z52 (0.4) | FII-11 (4) FII-34 (6) | HEP (0.06) | W-2 | A1 (100) B3 (40) |
| 19 | z54 (1.3) | FII-12 (3) FII-35 (7) | DBN (0.05) | W-3 | A1 (110) B2 (40) |
| 20 | z44 (0.8) | FII-13 (10) | DIA (0.04) PEA (0.04) | W-1 | A1 (80) B1 (70) |
| 21 | z14 (0.4) z51 (0.4) | FII-14 (9) FII-39 (1) | TPA (0.04) | W-2 | A1 (90) B2 (60) |
| 22 | z46 (0.5) z34 (0.3) | FII-16 (10) | TPSA (0.1) | W-4 | A1 (70) B2 (40) |
| 23 | z13 (0.4) z27 (0.5) | FII-18 (5) FII-1 (5) | TBAH (0.03) | W-1 | A1 (80) B2 (30) |
| 24 | z1 (0.4) z37 (0.5) | FII-20 (5) FII-5 (5) | TMEA (0.05) | W-4 | A1 (80) B1 (70) |
| 25 | z49 (0.7) | FII-27 (5) FII-32 (5) | HAP (0.05) | W-1 | A1 (150) |
| 26 | z18 (0.4) z31 (0.5) | FII-28 (5) FII-27 (5) | DBN (0.04) | W-2 | A2 (70) B4 (80) |
| 27 | z38 (0.4) z41 (0.5) | FII-29 (8) FII-3 (2) | DIA (0.01) PEA (0.01) | W-1 | A1 (100) B2 (60) |
| 28 | z5 (0.4) z38 (0.4) | FII-30 (5) FII-31 (5) | PEA (0.05) | W-1 | A1 (100) B1 (70) |
| 29 | z6 (0.3) z21 (0.6) | FII-38 (10) | TPI (0.04) | W-1 | A1 (80) B2 (40) |
| 30 | z15 (0.3) z40 (0.5) | FII-40 (5) FII-1 (5) | TOA (0.04) | W-2 | A1 (125) A3 (5) |
| 31 | z38 (0.4) z52 (0.4) | FII-19 (3) FII-28 (7) | HEP (0.06) | W-2 | A1 (100) B3 (40) |
| 32 | z54 (1) | FII-11 (5) FII-3 (5) | DBN (0.03) | W-3 | A1 (110) B2 (40) |
| 33 | z44 (0.9) | FII-32 (4) FII-30 (6) | DIA (0.04) PEA (0.04) | W-1 | A1 (80) B1 (70) |
| 34 | z14 (0.5) z51 (0.4) | FII-5 (7) FII-28 (3) | TPA (0.04) | W-2 | A1 (90) B2 (60) |
| Comparative Example 3 | z38 (0.1) | FII-1 (10) | DIA (0.05) | W-1 | A1 (130) |
| Comparative Example 4 | z38 (0.2) | FII-2 (10) | DIA (0.05) | W-1 | A1 (130) |

TABLE 6

| Example | Value of Formula (1) | Value of Formula (2) | Value of Formula (3) | Fluctuation Ratio of Sensitivity |
|---|---|---|---|---|
| 15 | 0.0753 | 0.1890 | 0.0473 | 2.8 |
| 16 | 0.0838 | 0.1641 | 0.0820 | 2.2 |
| 17 | 0.0778 | 0.2370 | 0.0820 | 3.9 |
| 18 | 0.0722 | 0.2204 | 0.0735 | 4.8 |
| 19 | 0.0705 | 0.1142 | 0.1142 | 2.6 |
| 20 | 0.0681 | 0.1551 | 0.0776 | 3.4 |
| 21 | 0.0772 | 0.2208 | 0.0736 | 4.5 |
| 22 | 0.0904 | 0.1738 | 0.0732 | 4.6 |
| 23 | 0.0906 | 0.1916 | 0.0821 | 3.2 |
| 24 | 0.0682 | 0.2368 | 0.0820 | 2.5 |
| 25 | 0.0670 | 0.1299 | 0.0649 | 4.7 |
| 26 | 0.0778 | 0.1550 | 0.0820 | 3.5 |
| 27 | 0.0641 | 0.1918 | 0.0822 | 2.1 |
| 28 | 0.0602 | 0.3309 | 0.0735 | 4.4 |
| 29 | 0.0838 | 0.1641 | 0.0820 | 3.8 |
| 30 | 0.0772 | 0.2024 | 0.0736 | 2.9 |
| 31 | 0.0722 | 0.2204 | 0.0753 | 3.3 |
| 32 | 0.0687 | 0.0904 | 0.0904 | 4.1 |
| 33 | 0.0684 | 0.1635 | 0.0817 | 2.4 |
| 34 | 0.0778 | 0.2552 | 0.0820 | 3.1 |
| Comparative Example 1 | 0.0726 | 0.0393 | 0.0098 | 13.2 |
| Comparative Example 2 | 0.0739 | 0.1156 | 0.0289 | 10.3 |

From the results shown in Table 6, it is apparent that the positive photosensitive compositions of Examples 15 to 34 exhibit the small fluctuation ratio of sensitivity depending on the change in the PEB temperature.

Although the ArF excimer laser beam or $F_2$ excimer laser beam was used as an actinic ray in the above-described examples, the similar results to the above were obtained in the case wherein the exposure was conducted using a KrF excimer laser beam or an electron beam.

Also, it is believed that the photosensitive composition of the invention provides similar effects with respect to an EUV ray exposure.

According to the invention, a photosensitive composition, which is excellent in a profile and exhibits small PEB temperature dependency, can be provided.

The entire disclosure of each and every foreign patent application from which the benefit of foreign priority has been claimed in the present application is incorporated herein by reference, as if fully set forth herein.

While the invention has been described in detail and with reference to specific examples thereof, it will be apparent to one skilled in the art that various changes and modifications can be made therein without departing from the spirit and scope thereof.

What is claimed is:

1. A photosensitive composition comprising a compound that generates an acid upon irradiation of an actinic ray or radiation (Component A), a resin that is decomposed by the action of an acid to increase solubility in an alkali developing solution (Component B), a performance adjusting agent (Component C) and a solvent (Component D), wherein a, b, c and d, which represents contents of Component A, Component B, Component C and Component D in terms of part by weight respectively, satisfy formulae (1) and (3) shown below, provided that c may be 0:

$$(a+b+c)/(a+b+c+d)=0.03 \text{ to } 0.10 \qquad (1)$$

$$a/(a+b+c)=0.05 \text{ to } 0.15 \qquad (3).$$

2. The photosensitive composition as claimed in claim 1, wherein Component B is a resin containing a fluorine atom.

3. The photosensitive composition as claimed in claim 1, wherein Component B is a resin containing a phenolic hydroxy group.

4. The photosensitive composition as claimed in claim 1, wherein Component C is a basic compound.

5. The photosensitive composition as claimed in claim 1, wherein Component A is a sulfonium salt.

6. The photosensitive composition as claimed in claim 1, wherein Component D is a solvent having an ester group.

7. The photosensitive composition as claimed in claim 1, wherein Component D is a solvent having a hydroxy group and/or a carbonyl group.

8. The photosensitive composition as claimed in claim 1, wherein Component D is a mixture of a solvent having an ester group and a solvent having a hydroxy group and/or a carbonyl group.

9. The photosensitive composition as claimed in claim 1, wherein Component B is a resin containing a monocyclic or polycyclic alicyclic hydrocarbon group.

10. The photosensitive composition as claimed in claim 1, wherein Component B is a resin containing a lactone group.

11. The photosensitive composition as claimed in claim 1, wherein Component B is a resin containing an adamantane structure having one or two hydroxy groups.

12. The photosensitive composition as claimed in claim 1, wherein a, b, c and d satisfy formula (2) shown below:

$$[(\text{Number of aromatic ring included in molecule of Component } A+1)\times a]/(a+b+c)=0.10 \text{ to } 0.40 \qquad (2).$$

13. The photosensitive composition as claimed in claim 12, wherein the range on the right hand side of the formula (2) equality is from 0.15 to 0.30.

14. A pattern forming method comprising:

forming a photosensitive film having a thickness of from 50 to 300 nm from a photosensitive composition as claimed in claim 1;

exposing the photosensitive film, so as to form an exposed photosensitive film; and developing the exposed photosensitive film.

* * * * *